US008169017B2

(12) United States Patent
Ema et al.

(10) Patent No.: US 8,169,017 B2
(45) Date of Patent: May 1, 2012

(54) SEMICONDUCTOR DEVICE AND METHOD OF MANUFACTURING THE SAME

(75) Inventors: Taija Ema, Kawasaki (JP); Toru Anezaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 111 days.

(21) Appl. No.: 12/285,275

(22) Filed: Oct. 1, 2008

(65) Prior Publication Data

US 2009/0045451 A1    Feb. 19, 2009

Related U.S. Application Data

(62) Division of application No. 11/044,458, filed on Jan. 28, 2005, now Pat. No. 7,445,989.

(30) Foreign Application Priority Data

Oct. 29, 2004  (JP) .................................. 2004-316974

(51) Int. Cl.
*H01L 29/788*  (2006.01)
(52) U.S. Cl. ................................ 257/315; 257/E29.129
(58) Field of Classification Search .................. 257/315, 257/316, E29.129
See application file for complete search history.

(56) References Cited

U.S. PATENT DOCUMENTS

| 5,852,311 A | 12/1998 | Kwon et al. |
| 5,879,983 A | 3/1999 | Segawa et al. |
| 6,124,160 A | 9/2000 | Segawa et al. |
| 6,335,244 B1 * | 1/2002 | Ikeda .............................. 438/257 |
| 6,373,093 B2 * | 4/2002 | Fujii et al. ...................... 257/314 |
| 6,489,650 B2 * | 12/2002 | Kumazaki ....................... 257/318 |
| 6,492,672 B1 | 12/2002 | Segawa et al. |
| 6,680,510 B2 | 1/2004 | Ikeda |
| 6,933,569 B2 | 8/2005 | Koh et al. |
| 6,964,896 B2 * | 11/2005 | Gonzalez ....................... 438/241 |
| 7,235,476 B2 * | 6/2007 | Nakagawa ...................... 438/622 |
| 7,259,419 B2 * | 8/2007 | Koo et al. ....................... 257/314 |
| 2001/0004120 A1 * | 6/2001 | Colclaser et al. ............. 257/326 |
| 2002/0011616 A1 | 1/2002 | Inoue et al. |
| 2003/0022445 A1 | 1/2003 | Taniguchi et al. |
| 2003/0030096 A1 * | 2/2003 | Hsu ................................ 257/314 |
| 2003/0127681 A1 * | 7/2003 | Nishioka et al. .............. 257/315 |

(Continued)

FOREIGN PATENT DOCUMENTS

JP    6-97457 A    4/1994

(Continued)

OTHER PUBLICATIONS

Japanese Office Action mailed Mar. 16, 2010, issued in corresponding Japanese Patent Application No. 2004-316974.

*Primary Examiner* — Allan R Wilson
(74) *Attorney, Agent, or Firm* — Westerman, Hattori, Daniels & Adrian, LLP

(57) ABSTRACT

A method of manufacturing a semiconductor device that comprises the steps of: removing a second insulating film on a contact region of a first conductor; forming a second conductive film on the second insulating film; removing the second conductive film on the contact region of the first conductor to make the second conductive film into a second conductor; forming an interlayer insulating film (a third insulating film) covering the second conductor; forming a first hole in the interlayer insulating film on the contact region; and forming a conductive plug, which is electrically connected with the contact region, in the first hole.

11 Claims, 69 Drawing Sheets

U.S. PATENT DOCUMENTS

| | | | |
|---|---|---|---|
| 2004/0033664 A1* | 2/2004 | Park | 438/264 |
| 2004/0124477 A1 | 7/2004 | Mimami et al. | |
| 2004/0219755 A1* | 11/2004 | Rabkin et al. | 438/299 |
| 2005/0269663 A1 | 12/2005 | Minami et al. | |
| 2009/0122609 A1* | 5/2009 | Okazaki et al. | 365/185.05 |

FOREIGN PATENT DOCUMENTS

| | | |
|---|---|---|
| JP | 09-082896 A | 3/1997 |
| JP | 10-56161 A | 2/1998 |
| JP | 10-189954 A | 7/1998 |
| JP | 11-31799 A | 2/1999 |
| JP | 11-219595 A | 8/1999 |
| JP | 2000-269465 A | 9/2000 |
| JP | 2003-37169 A | 2/2003 |
| JP | 2003-100887 A | 4/2003 |
| JP | 2003-124356 A | 4/2003 |
| JP | 2003-158242 A | 5/2003 |
| JP | 2004-55763 A | 2/2004 |

* cited by examiner

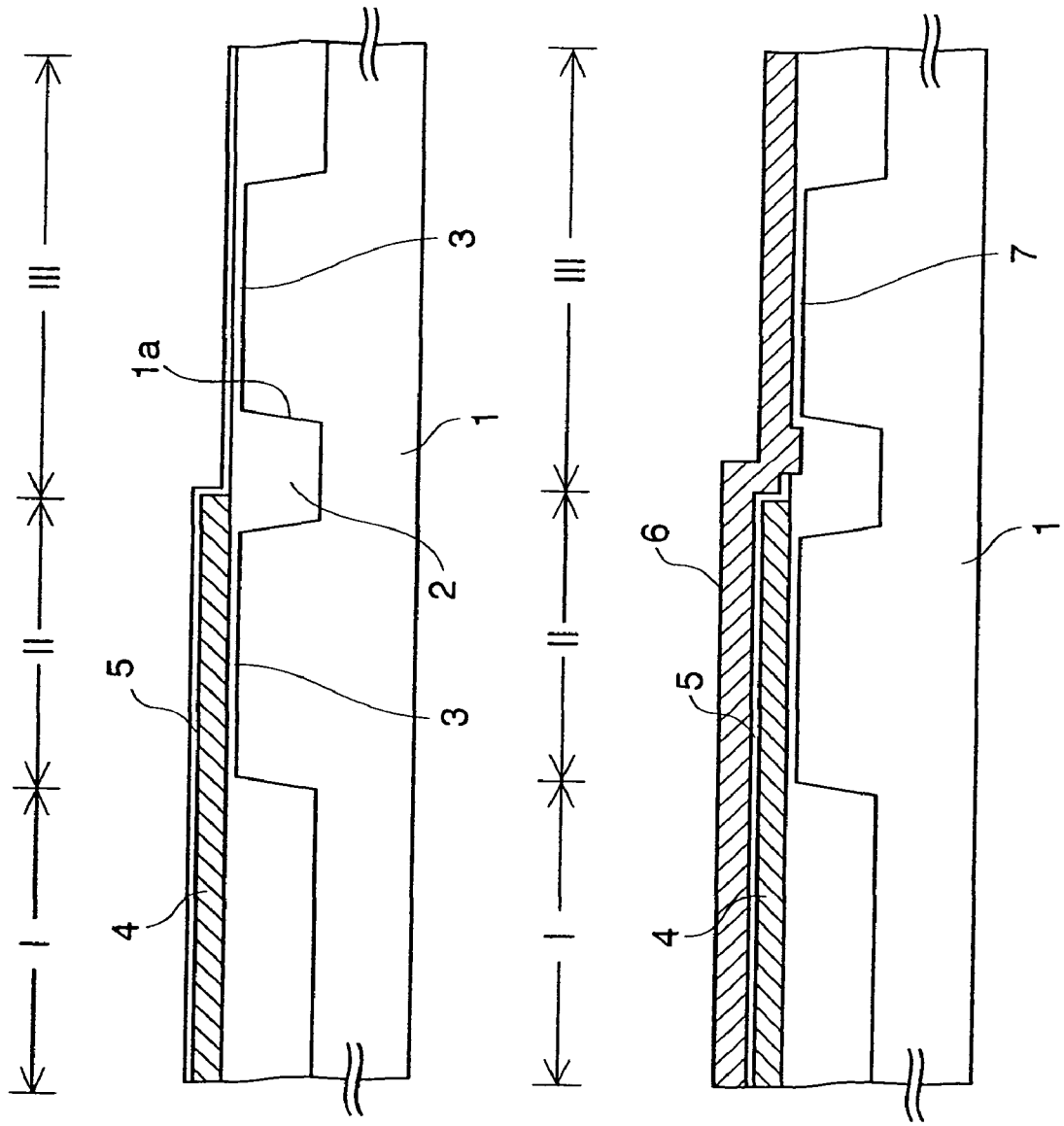

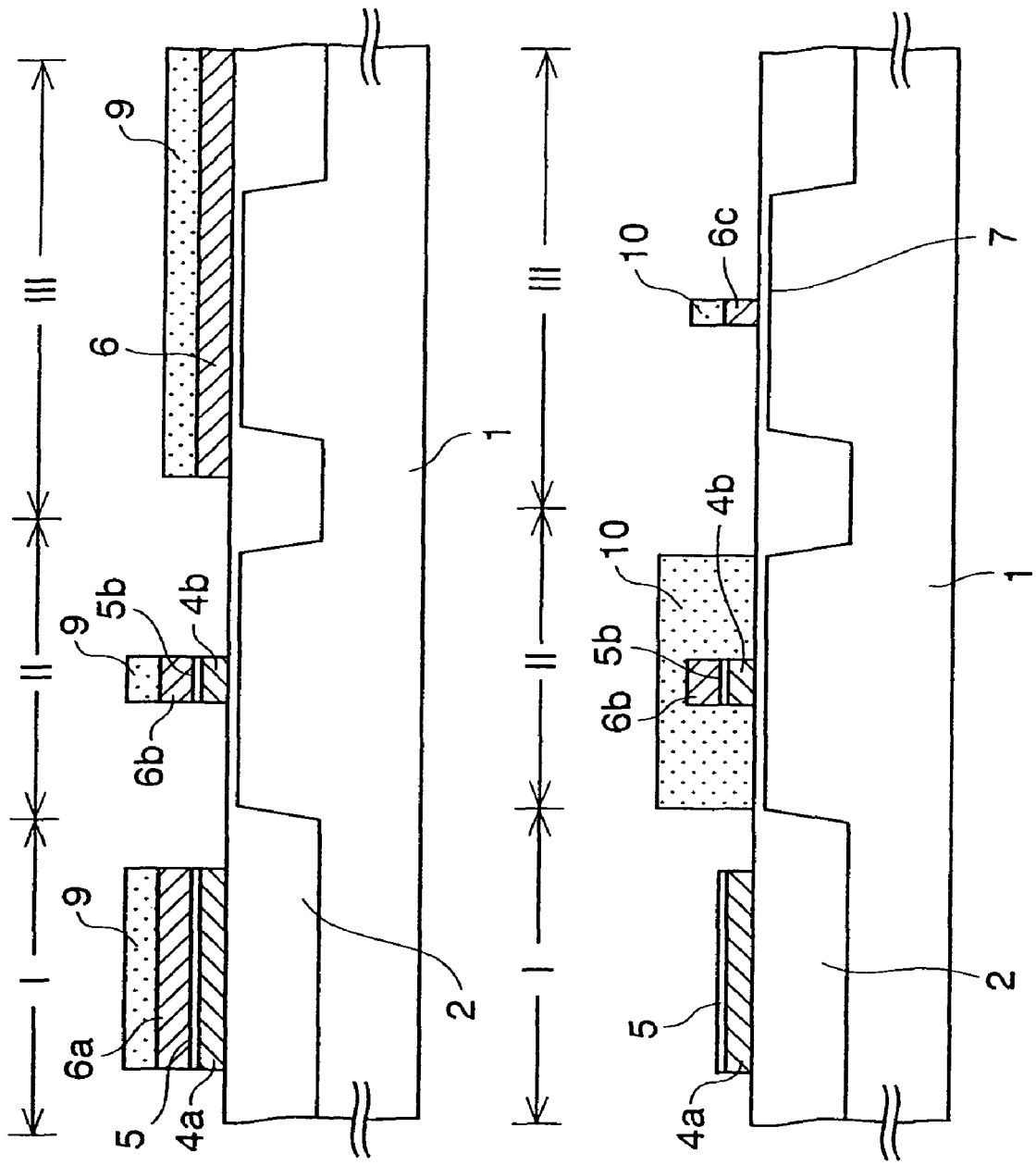

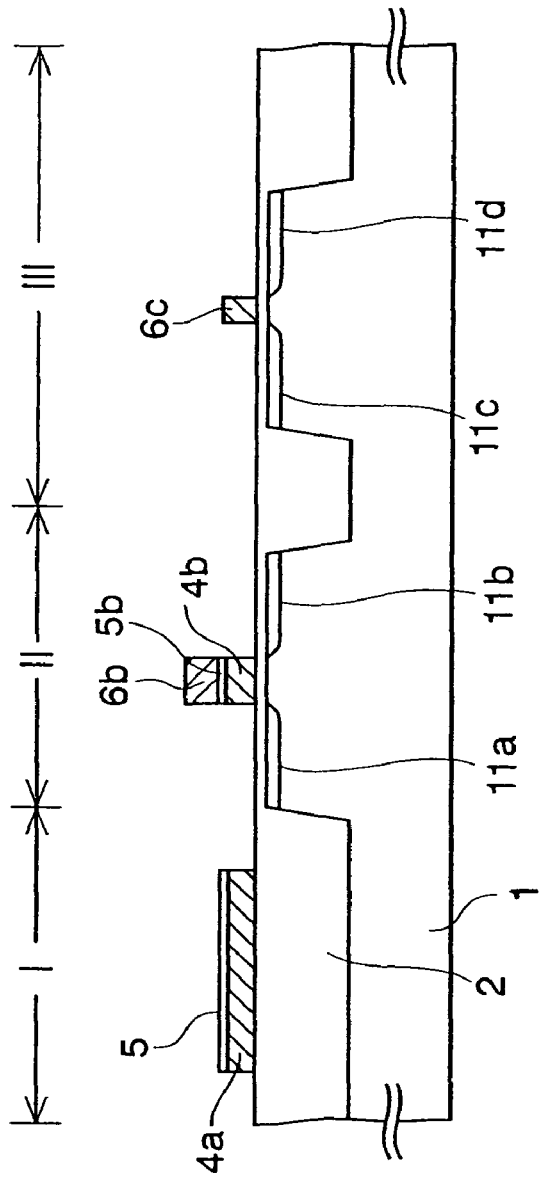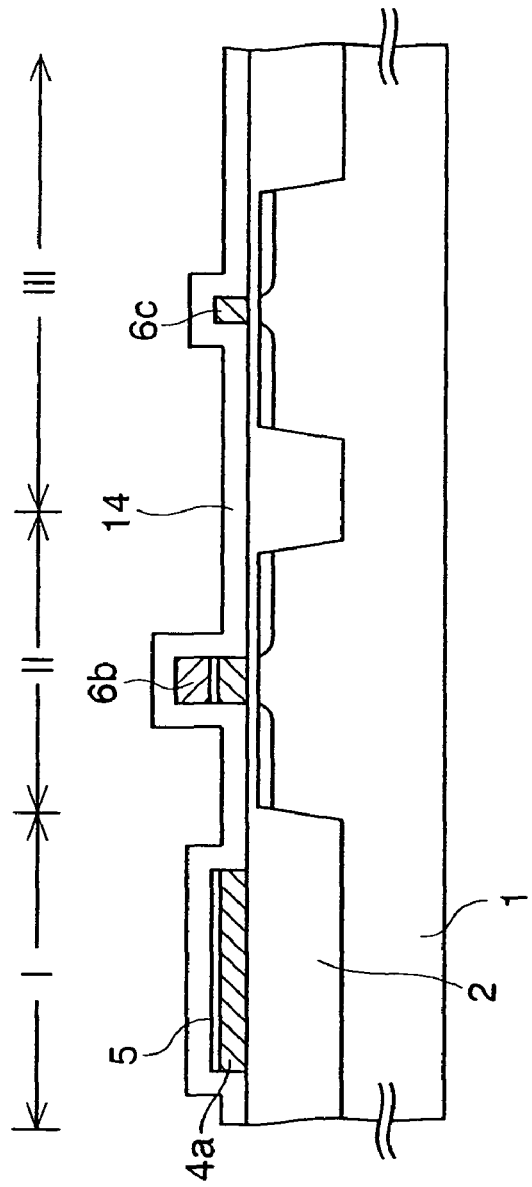

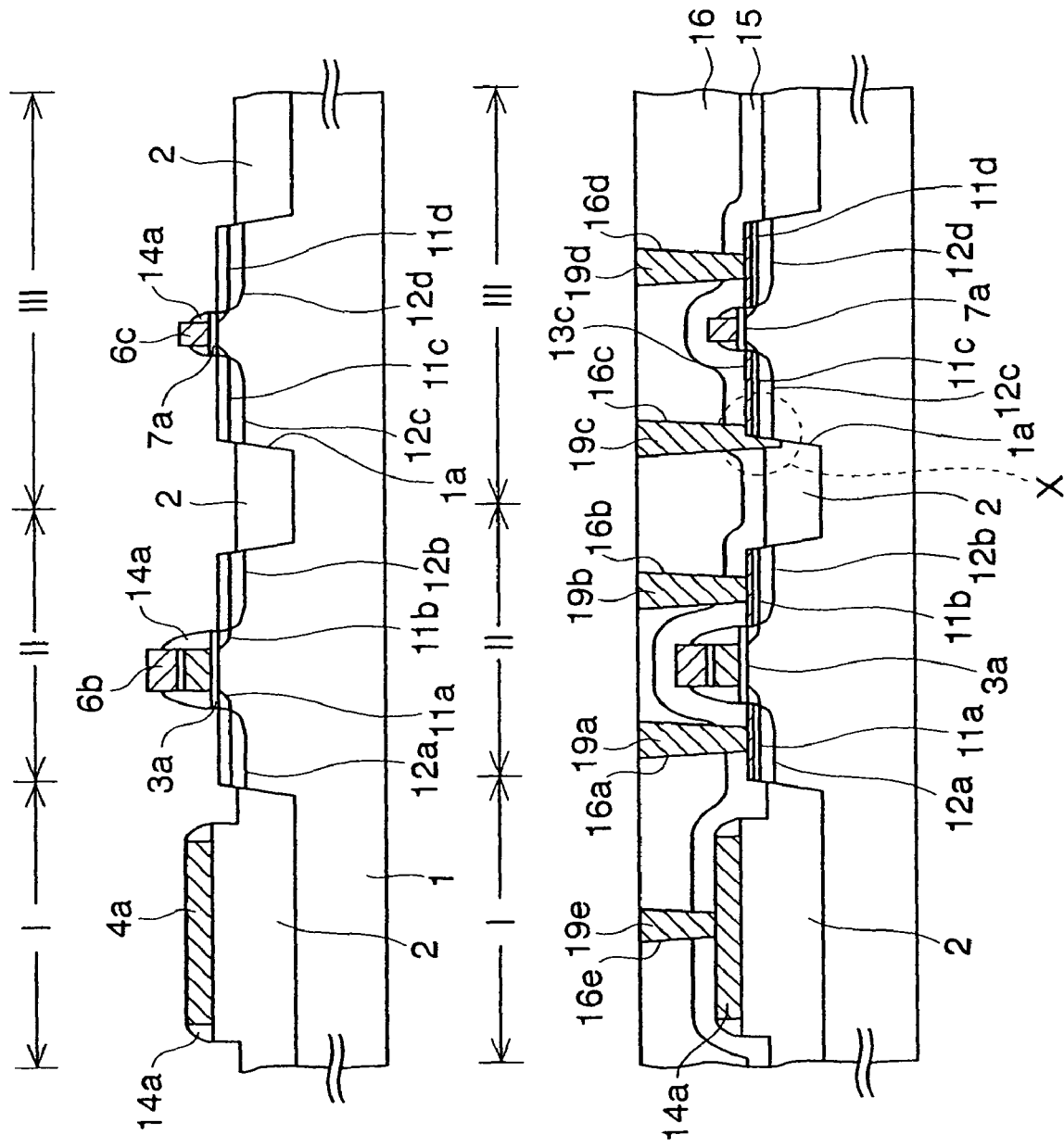

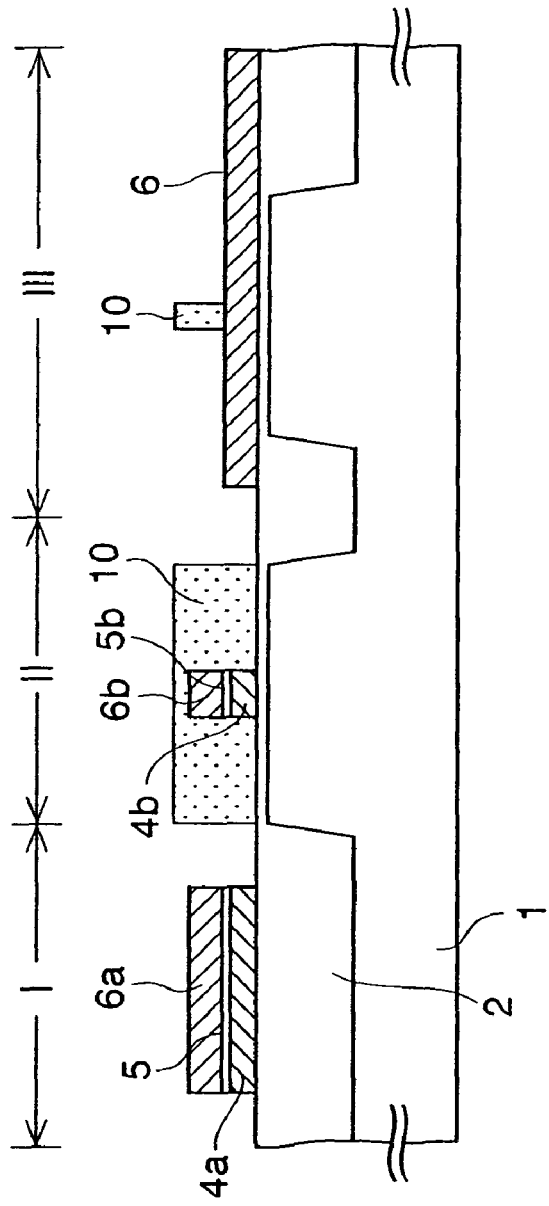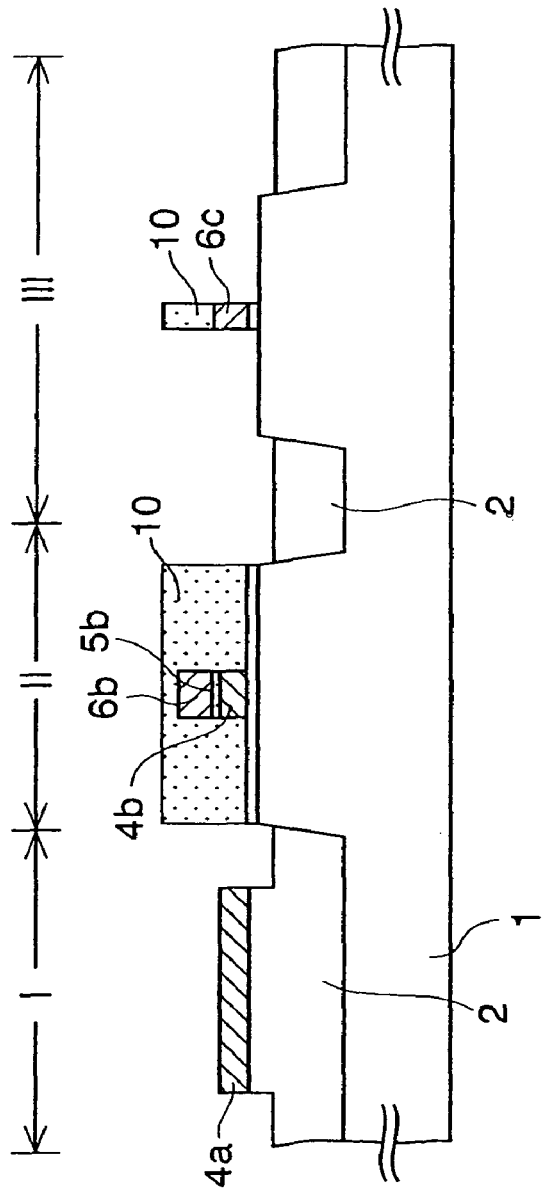
FIG. 3A
FIG. 3B

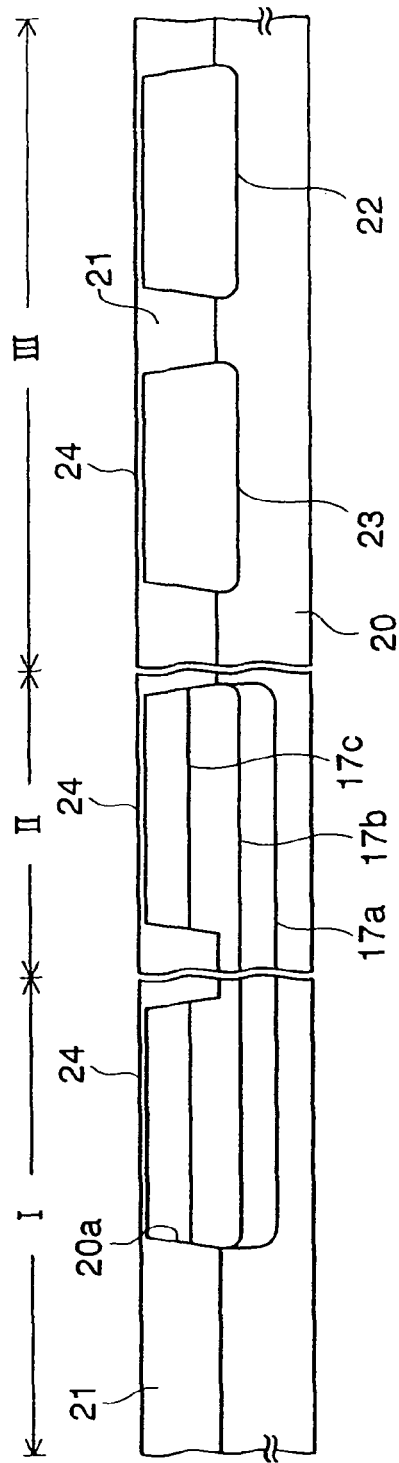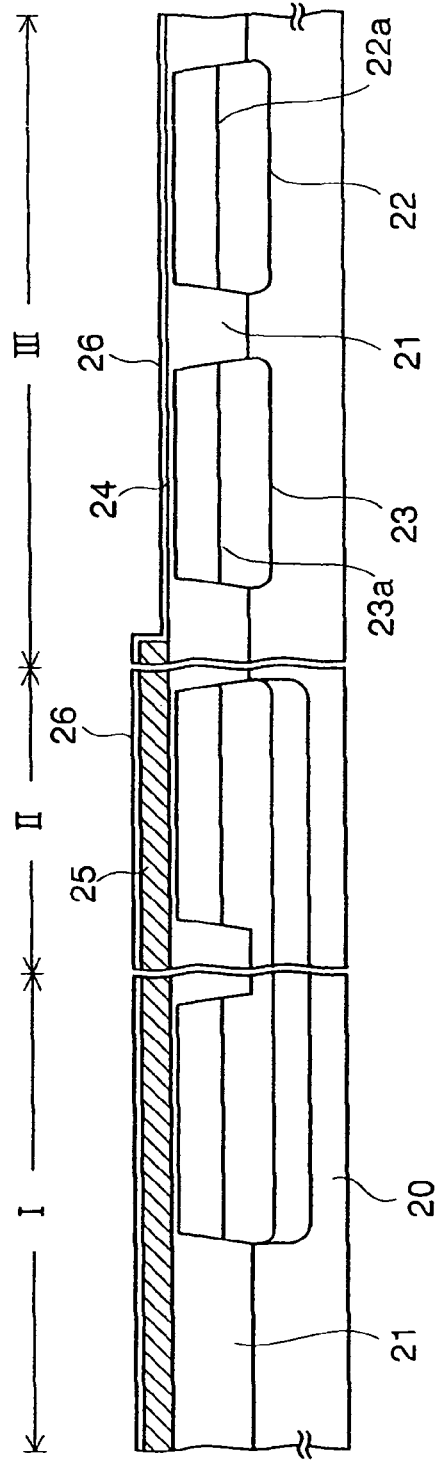
FIG. 4A
FIG. 4B

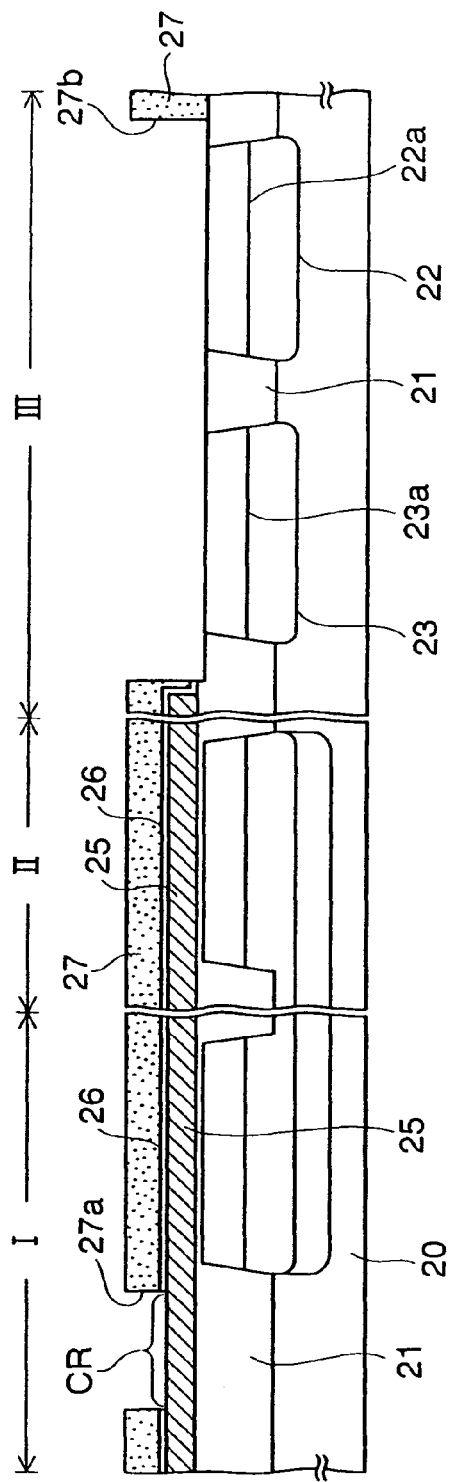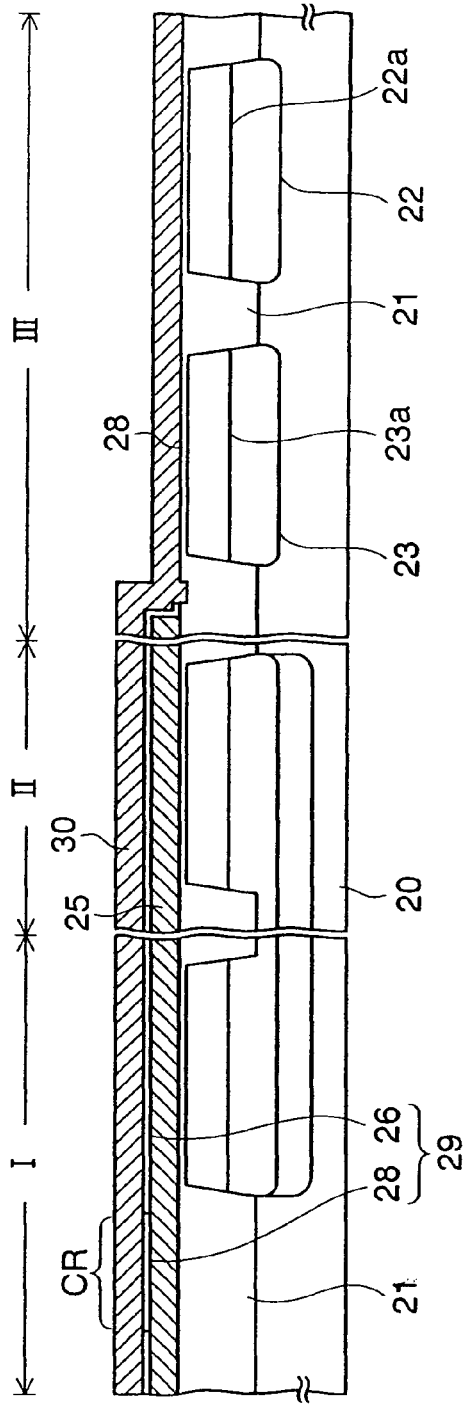
FIG. 4C
FIG. 4D

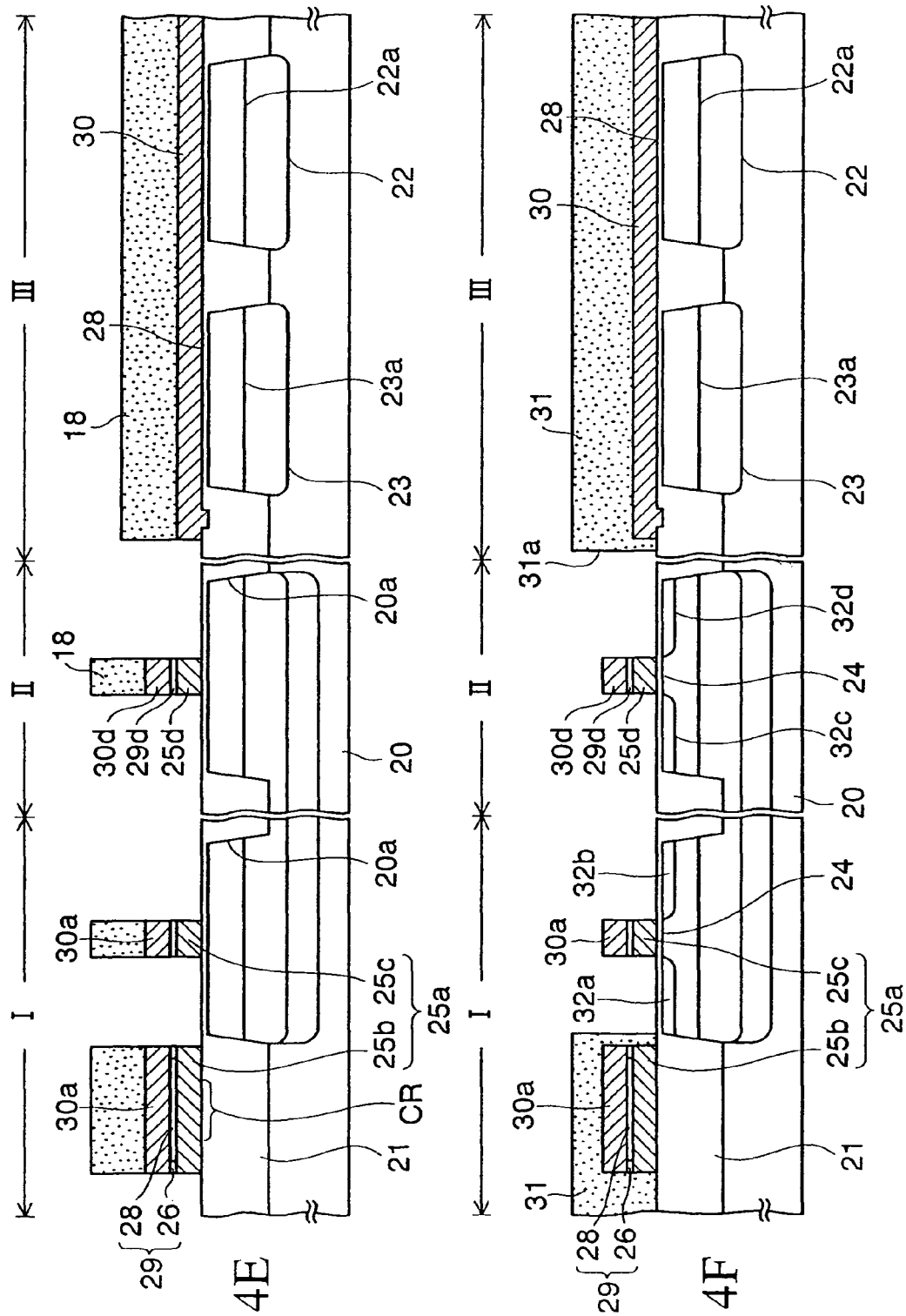

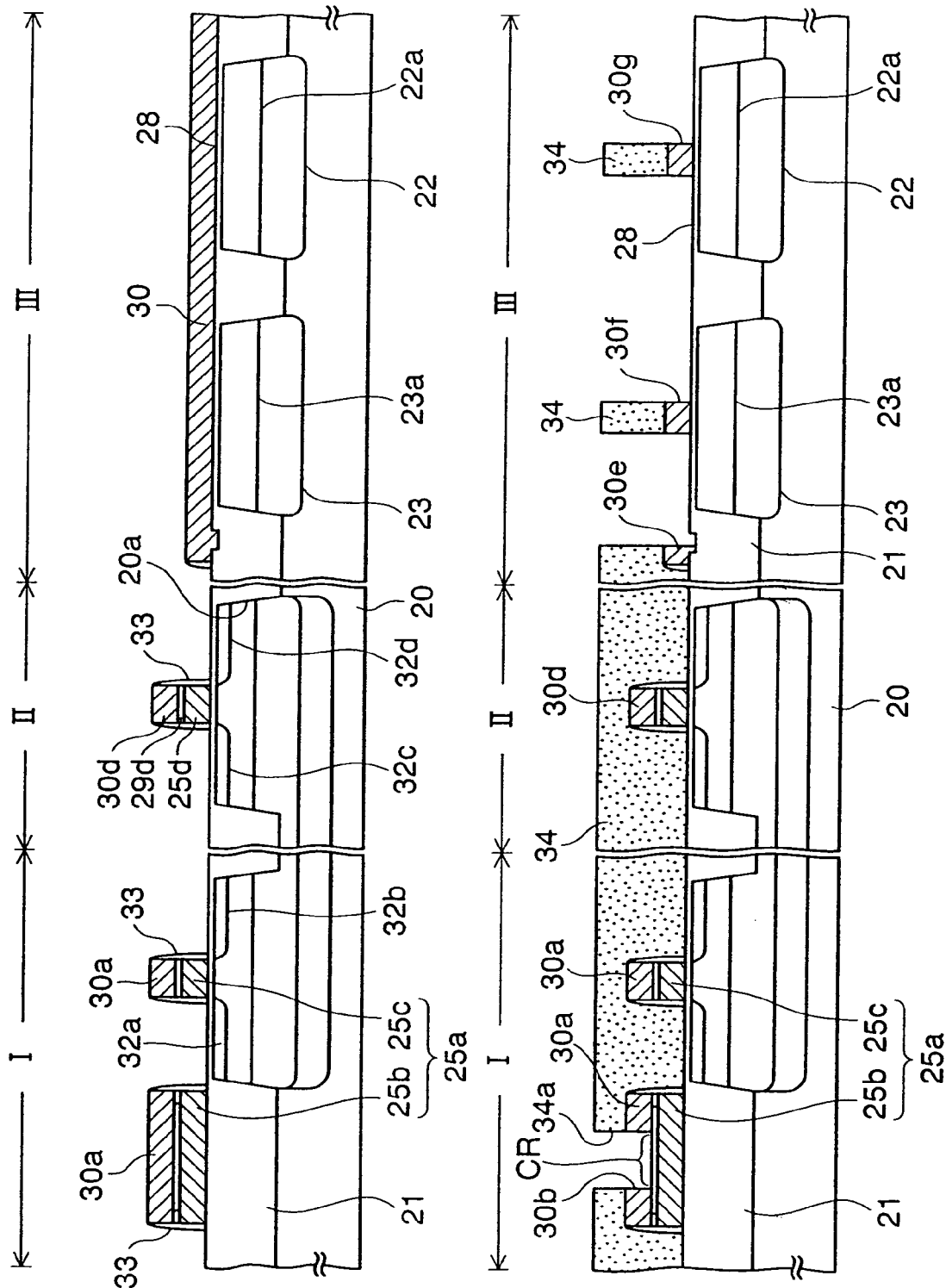

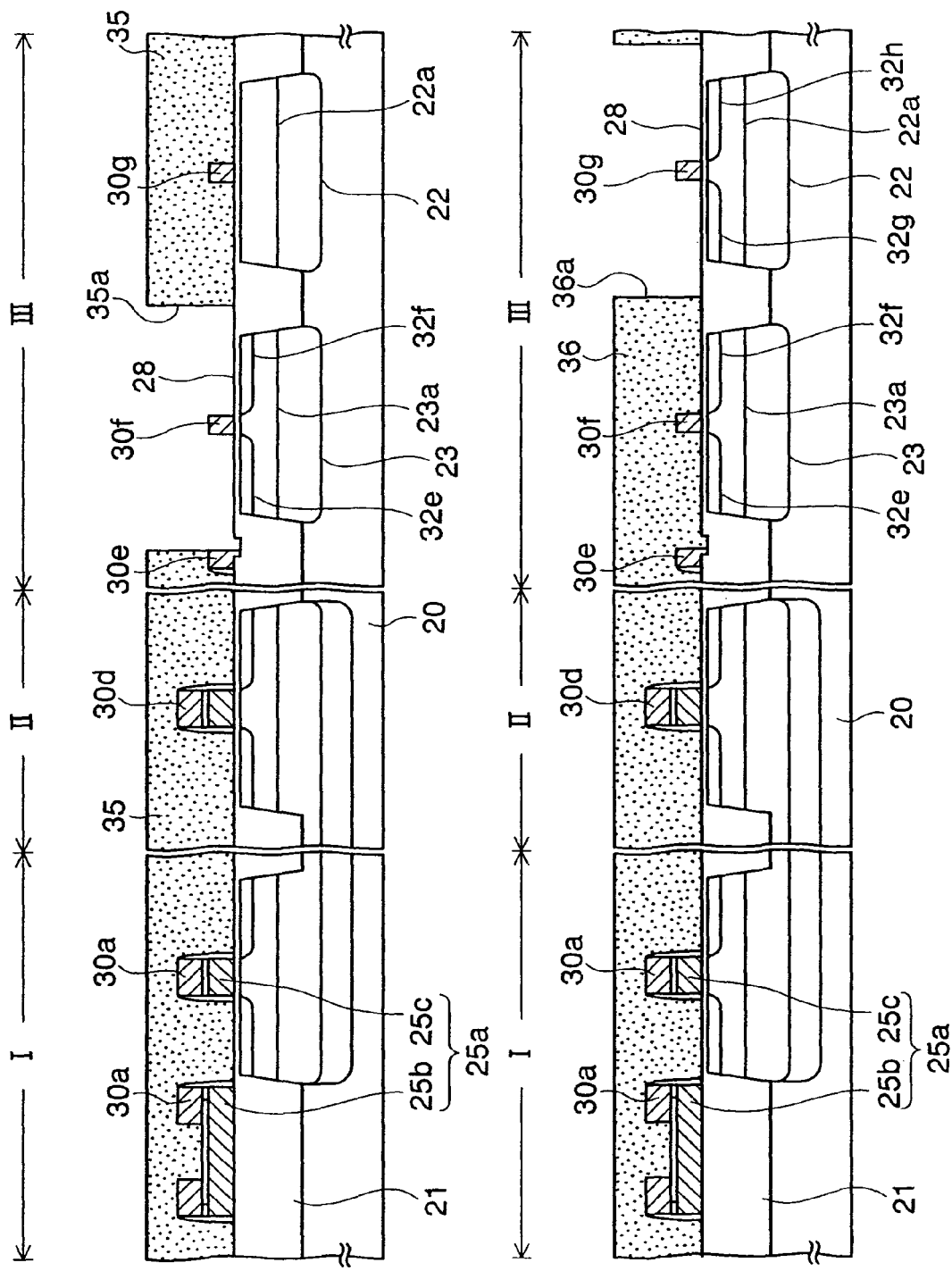

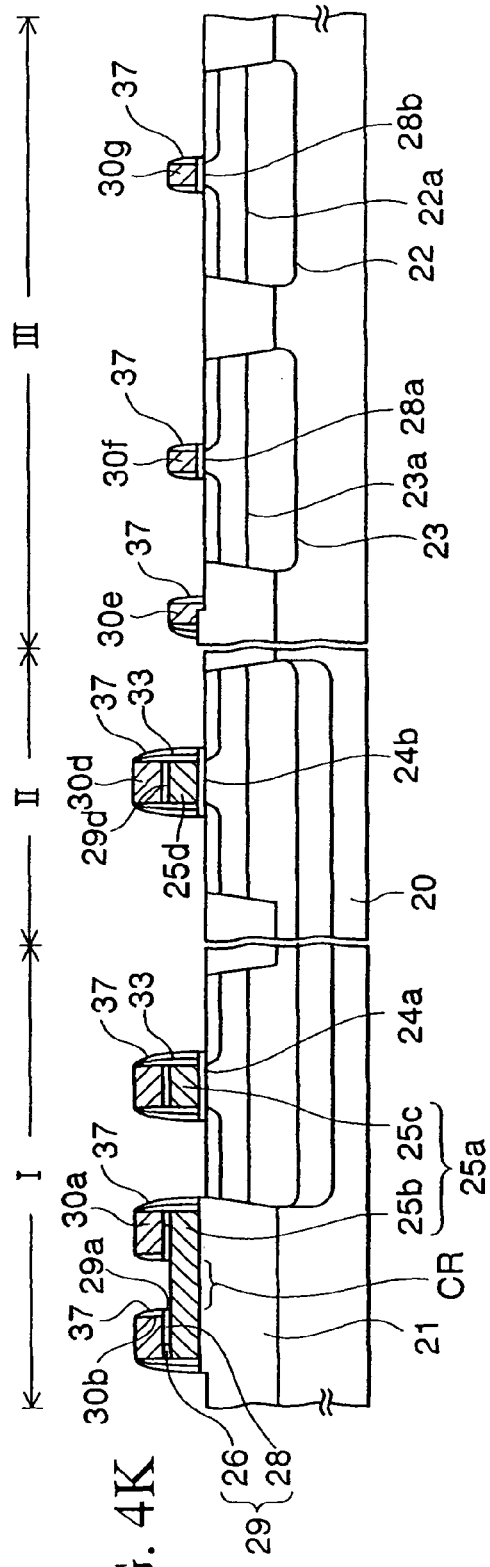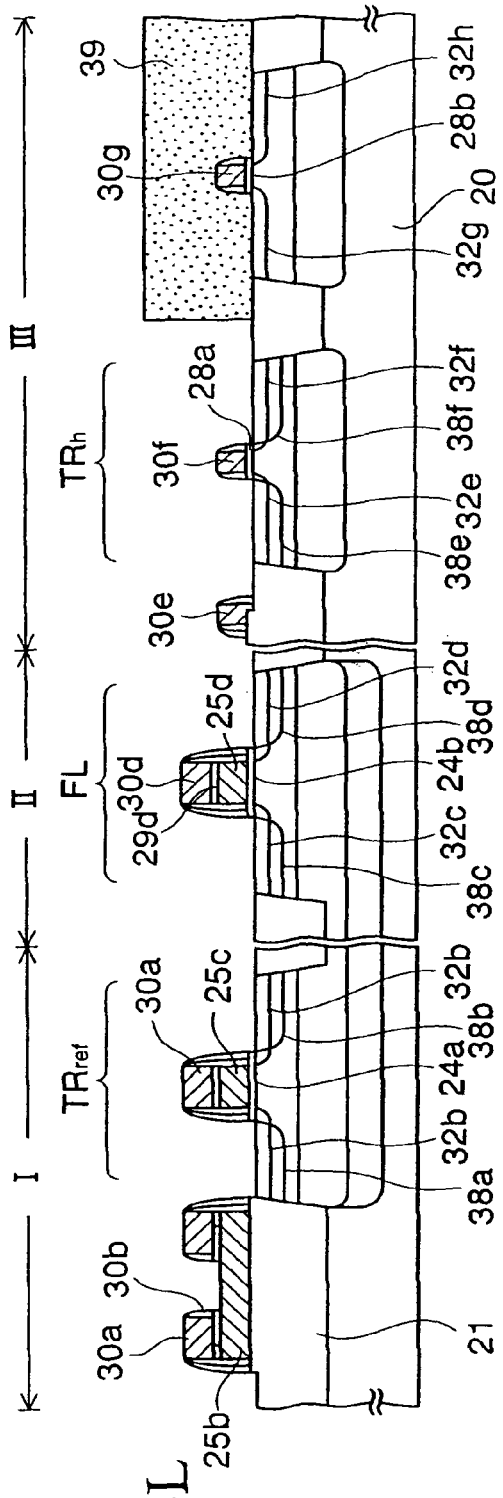

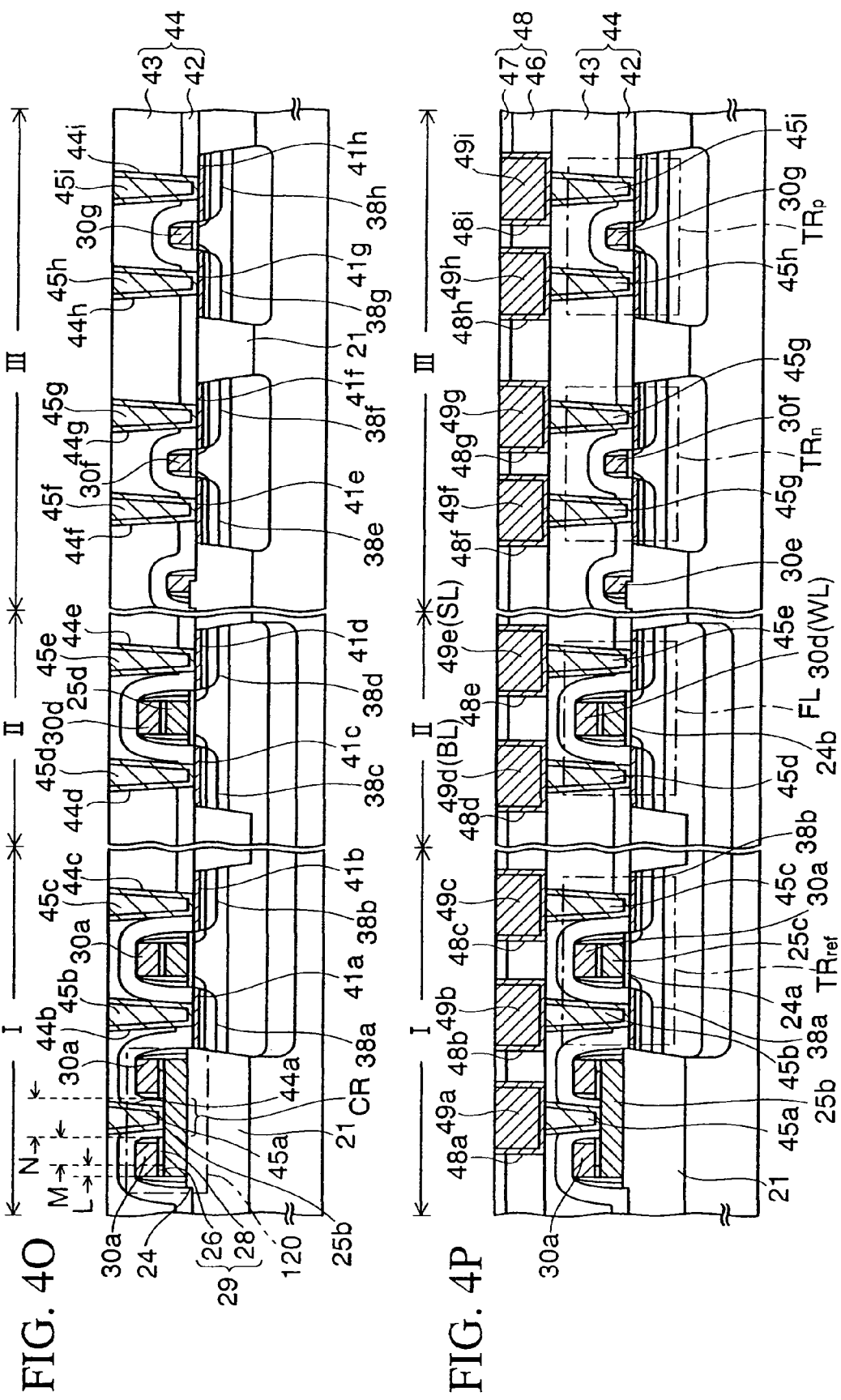

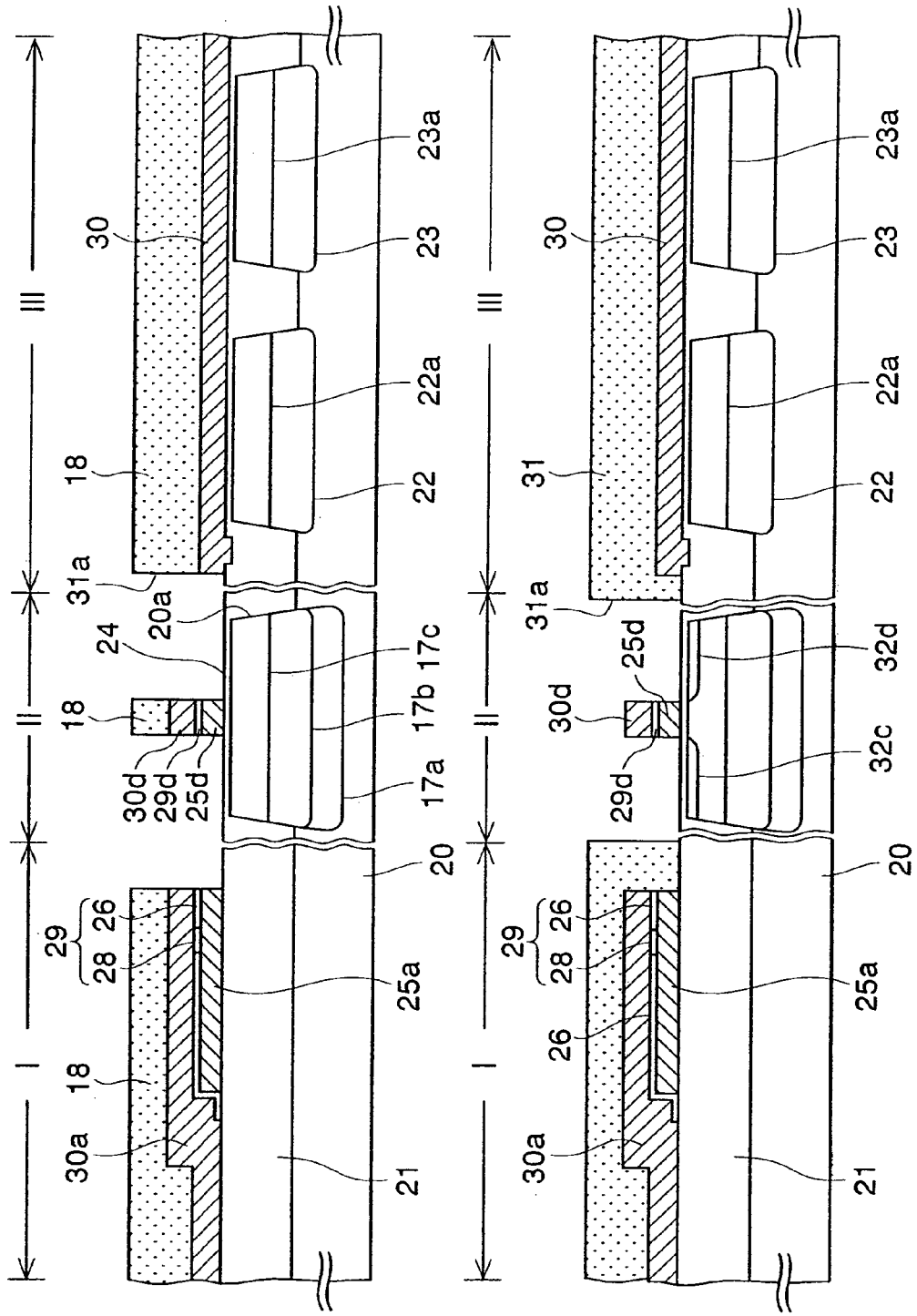

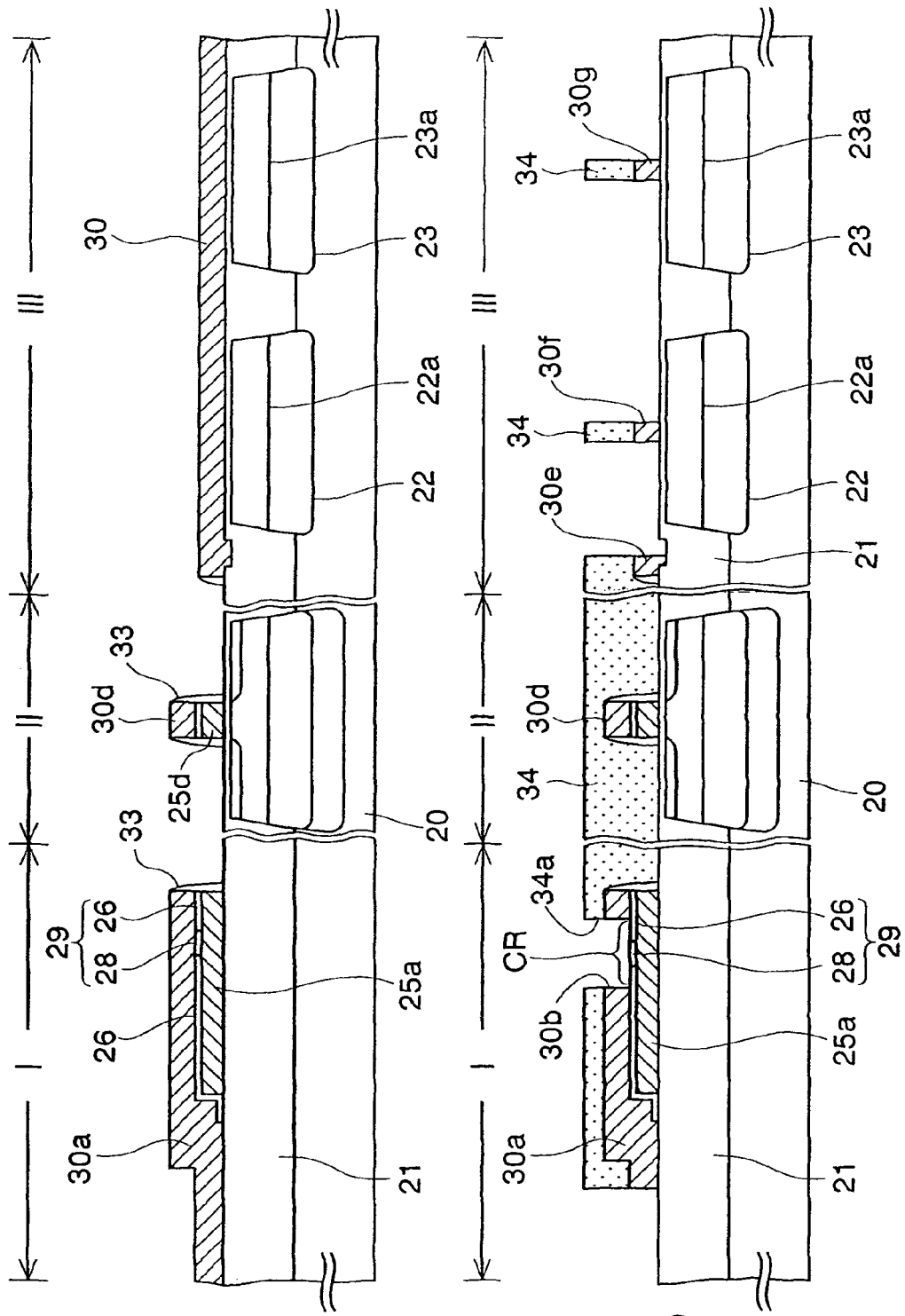

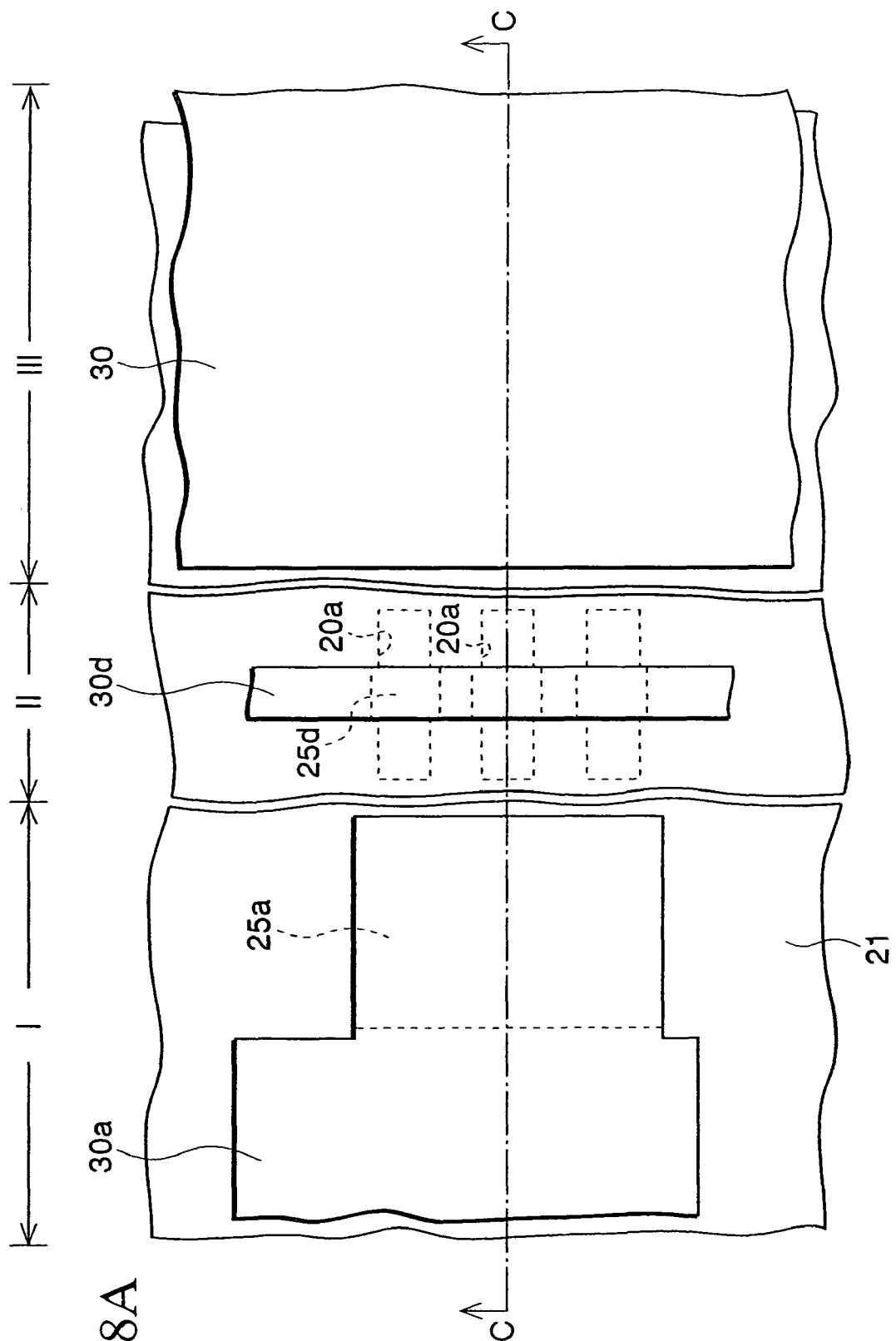

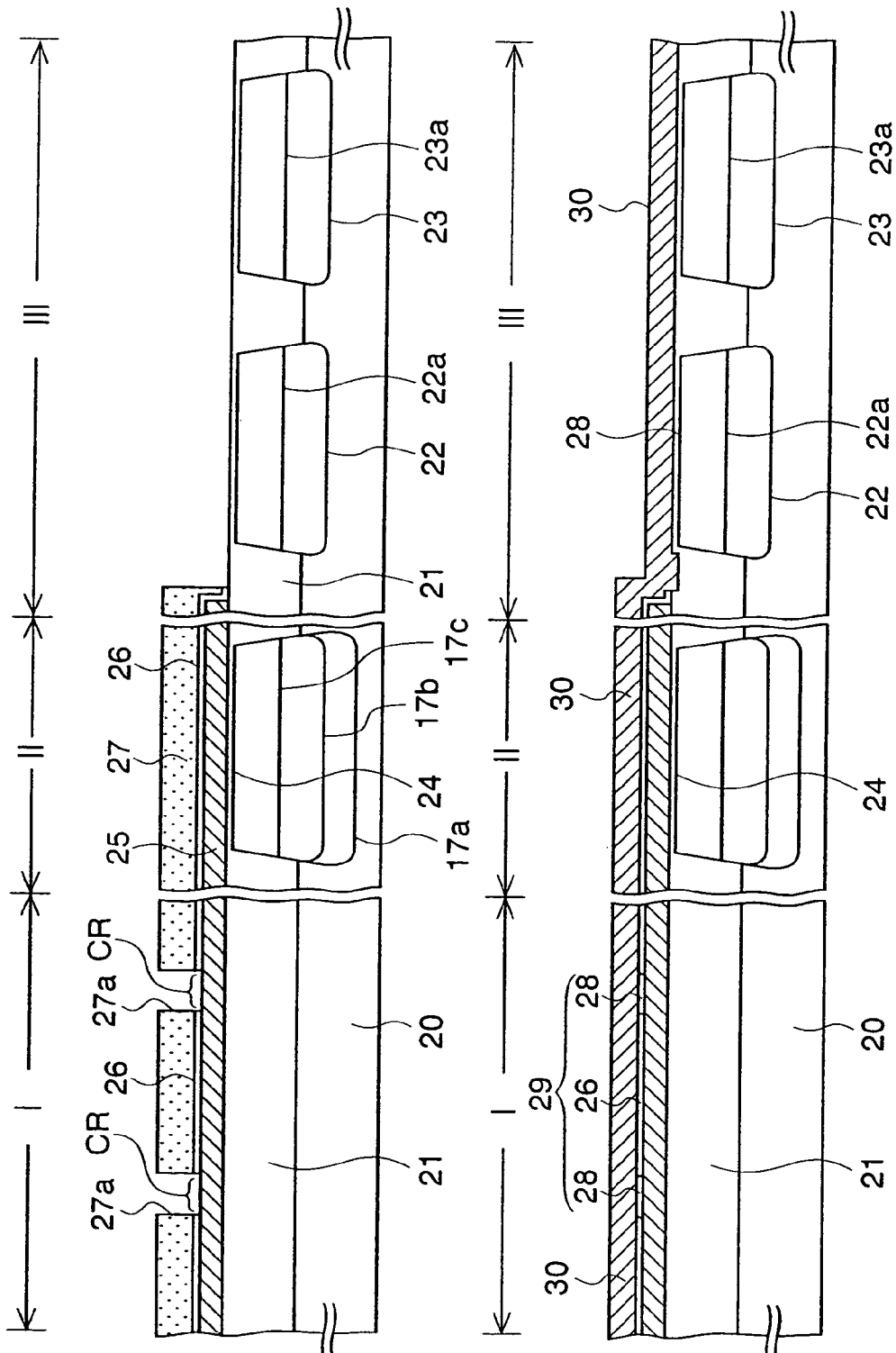

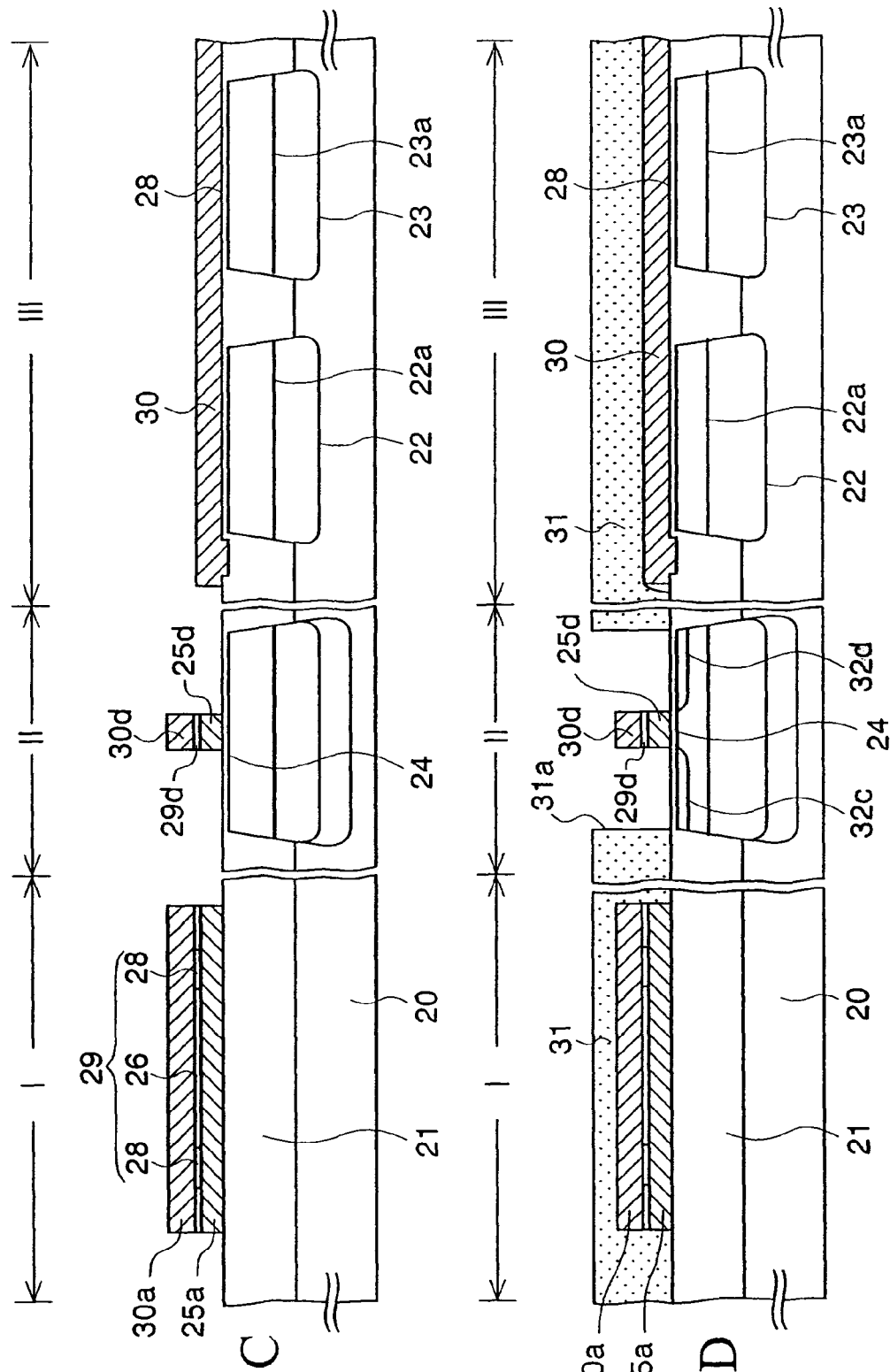

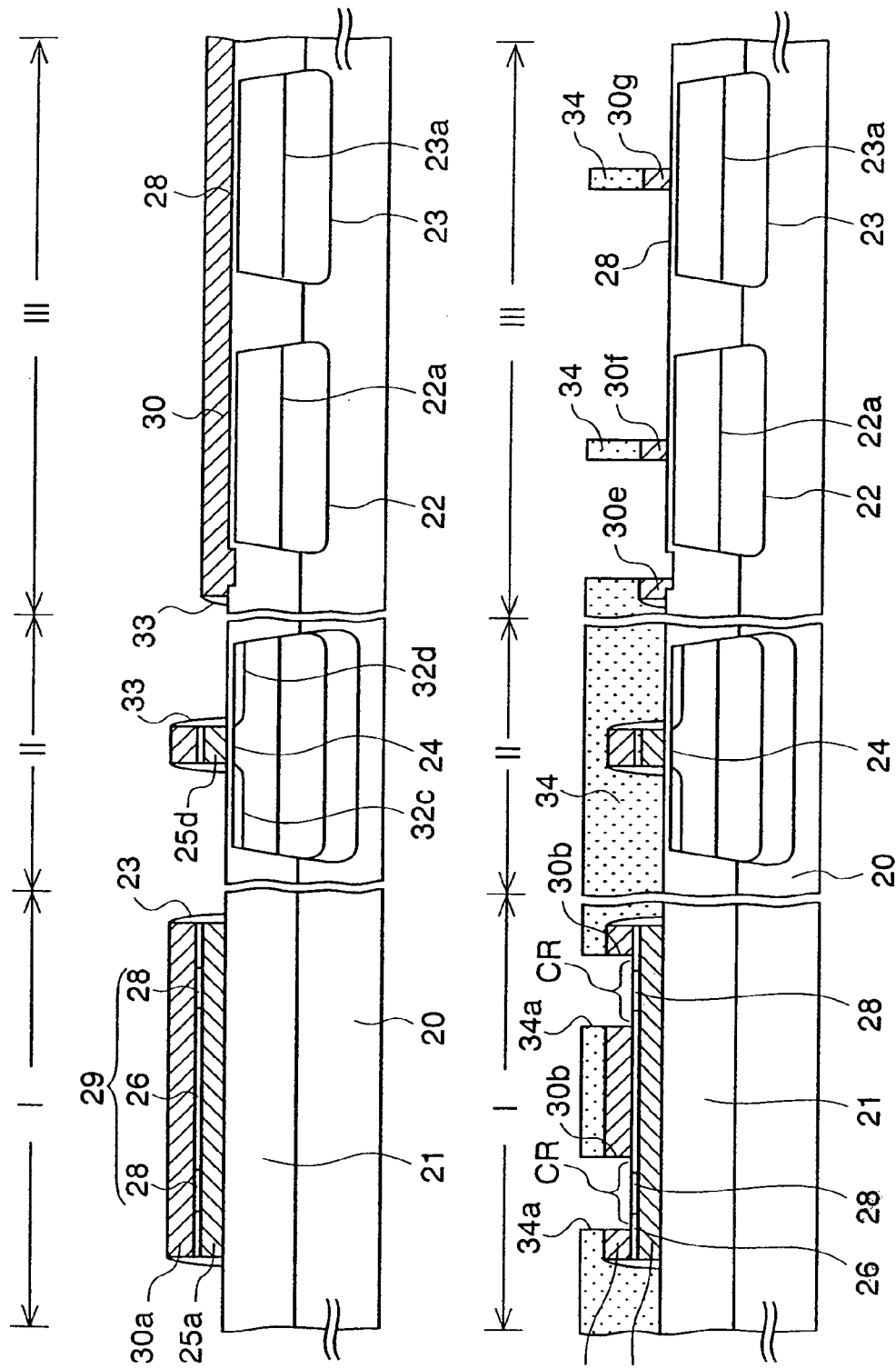

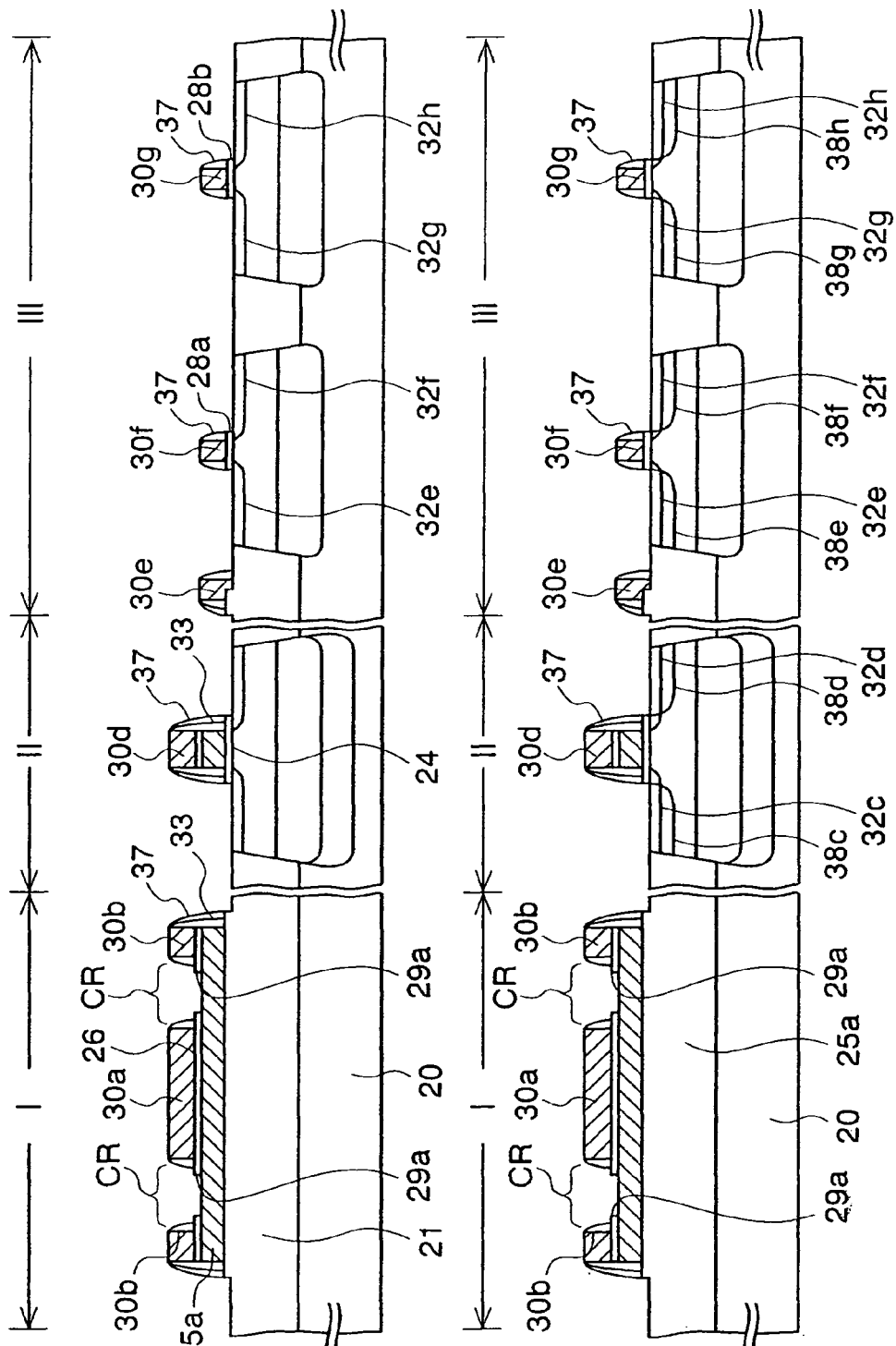

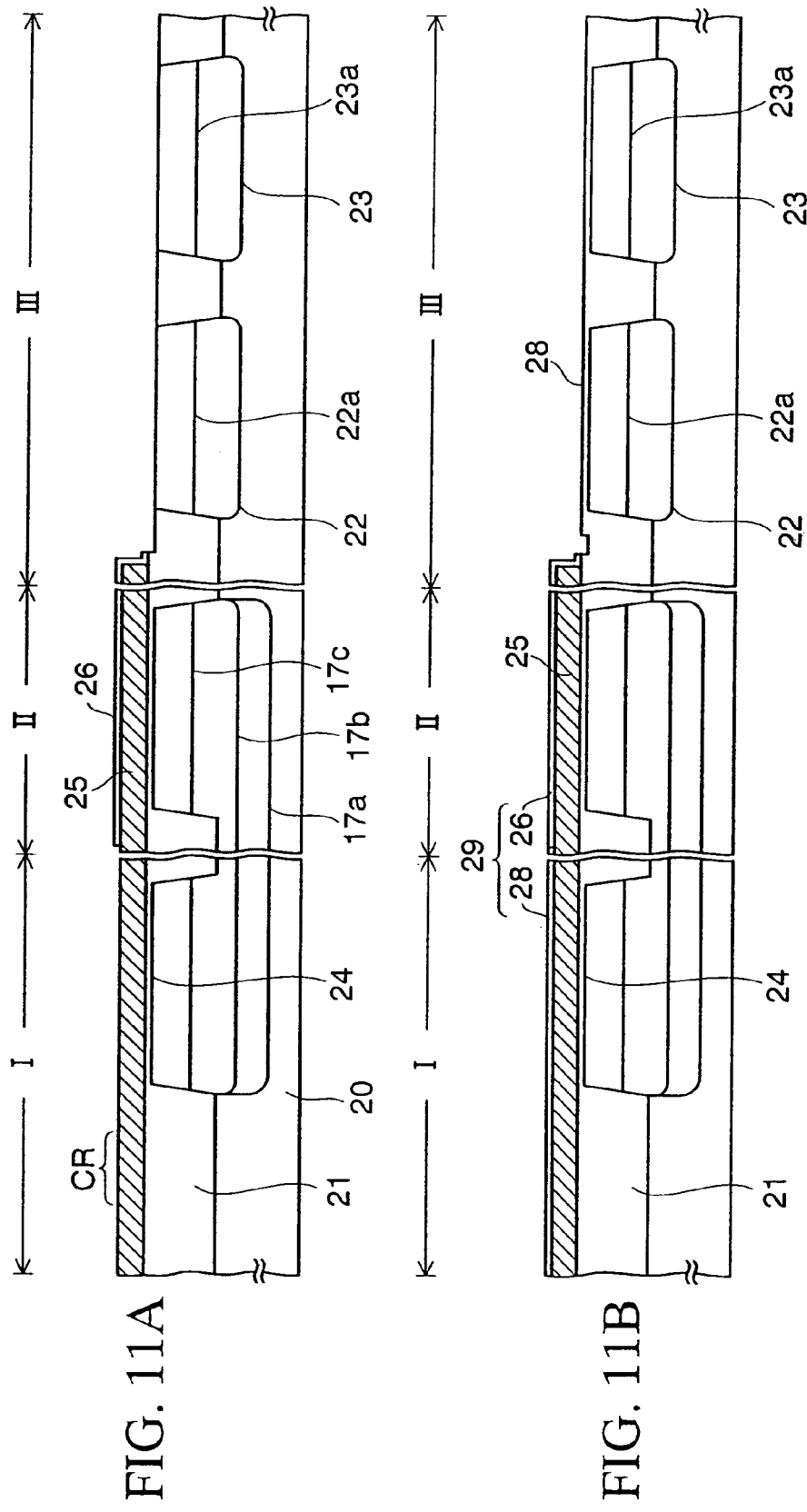

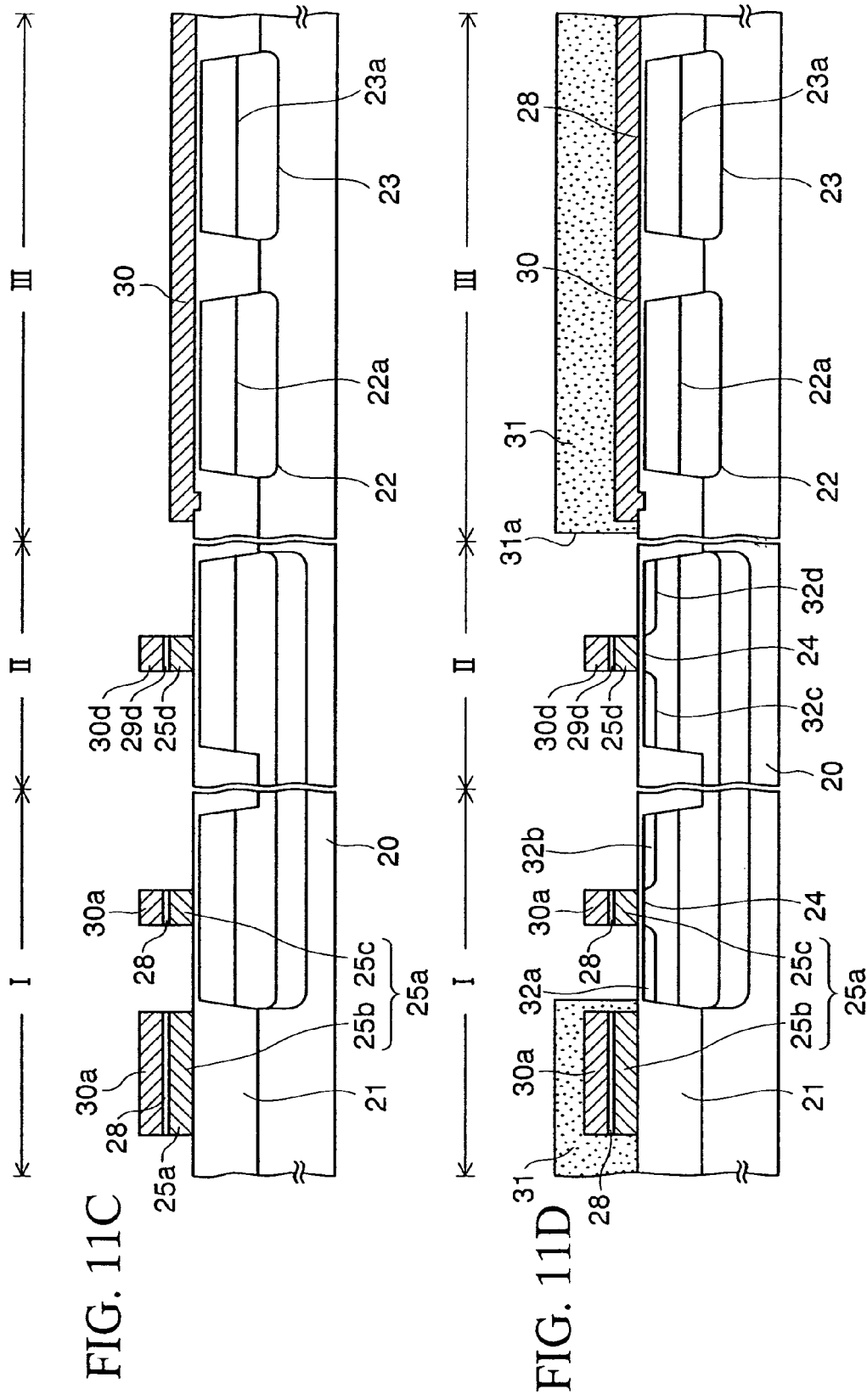

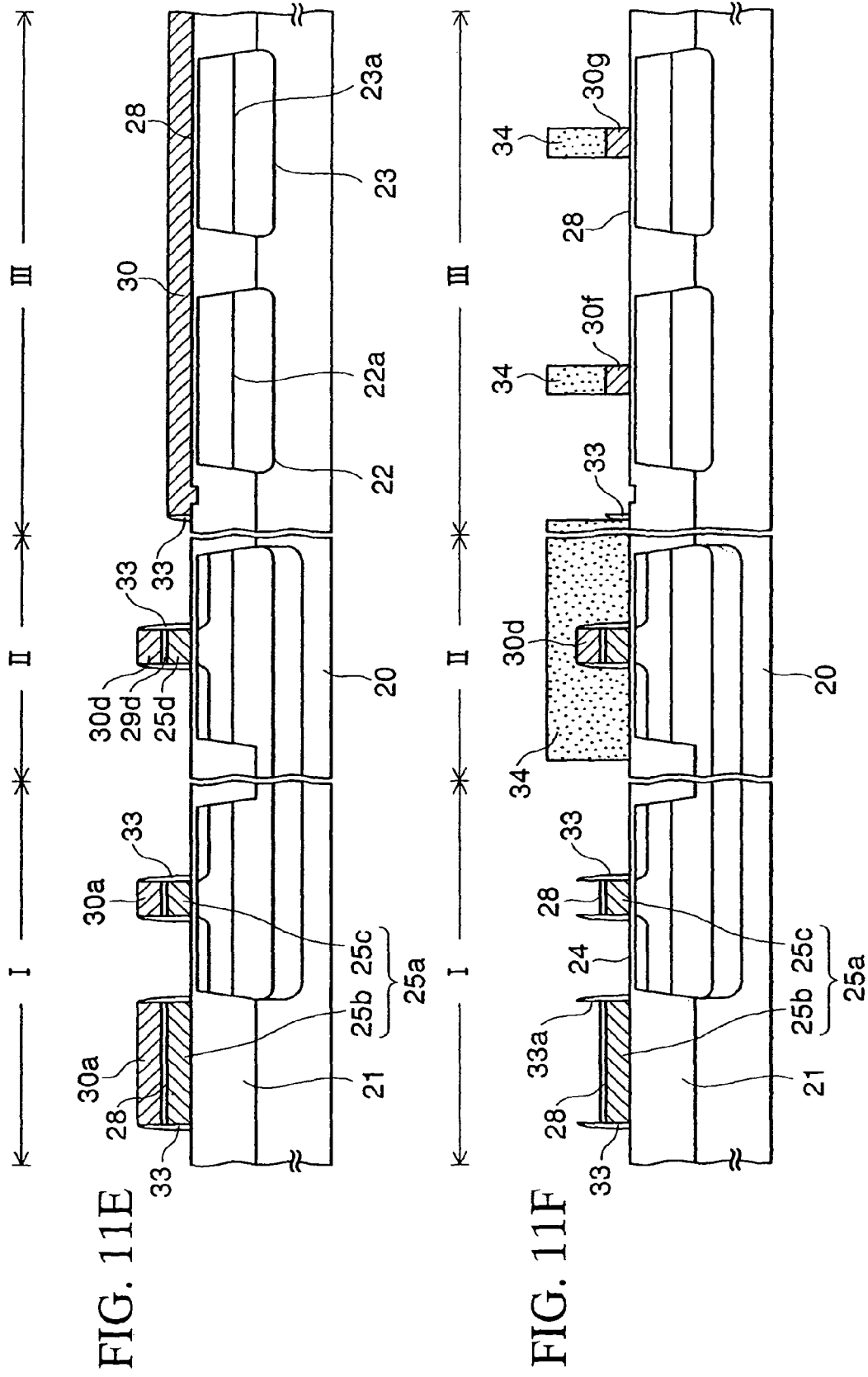

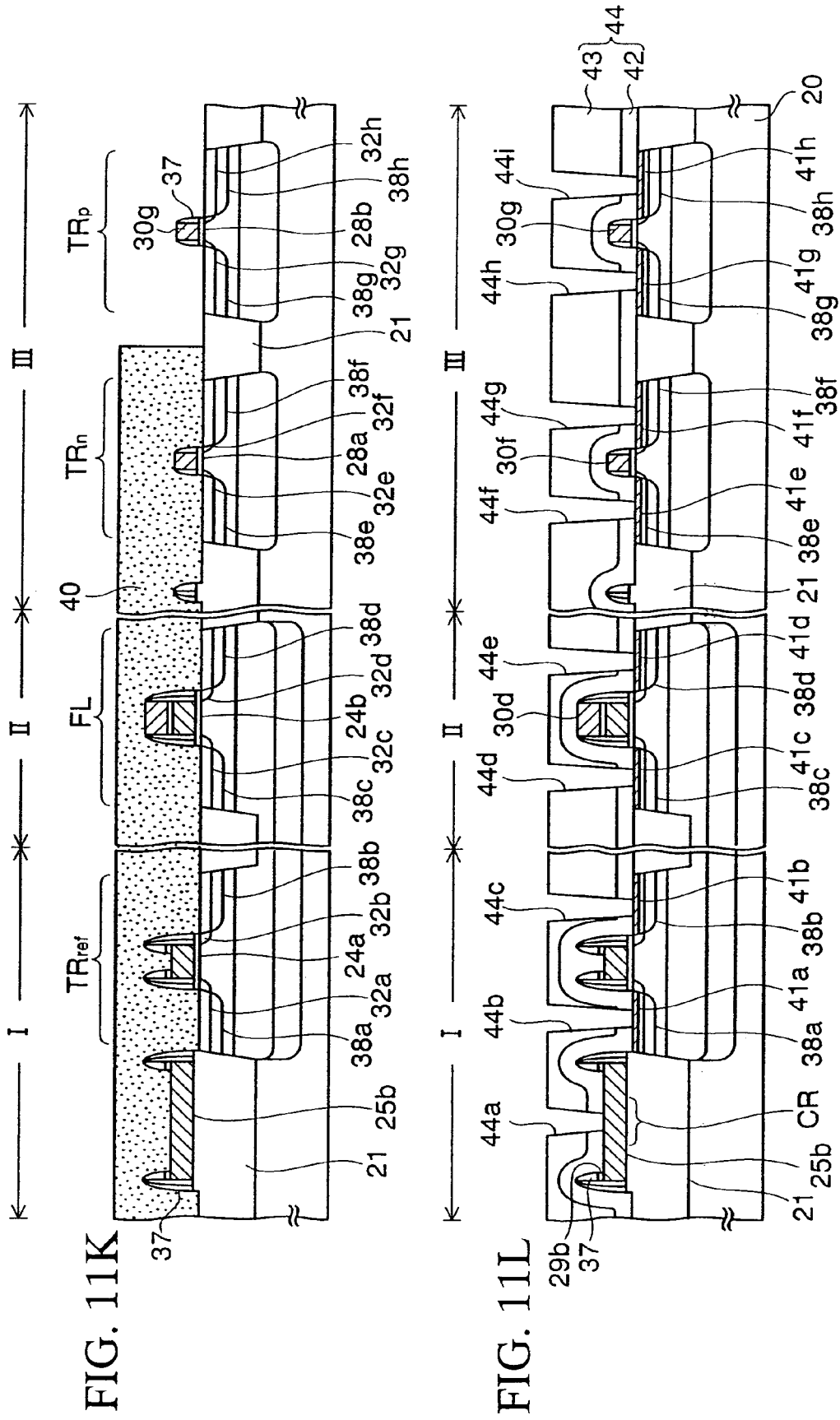

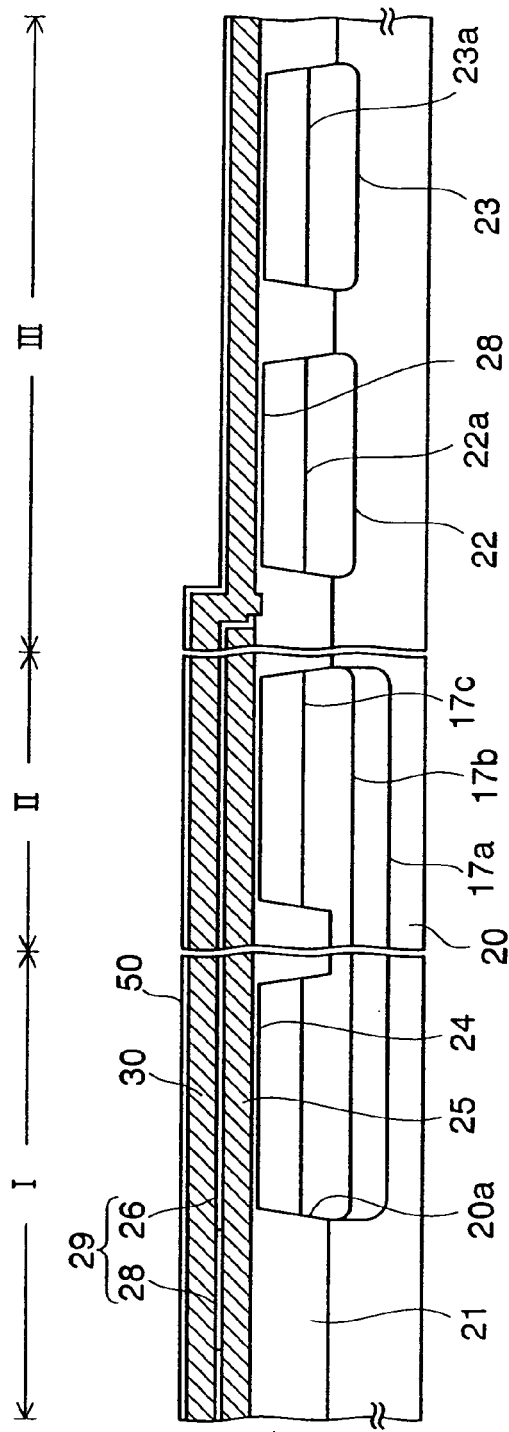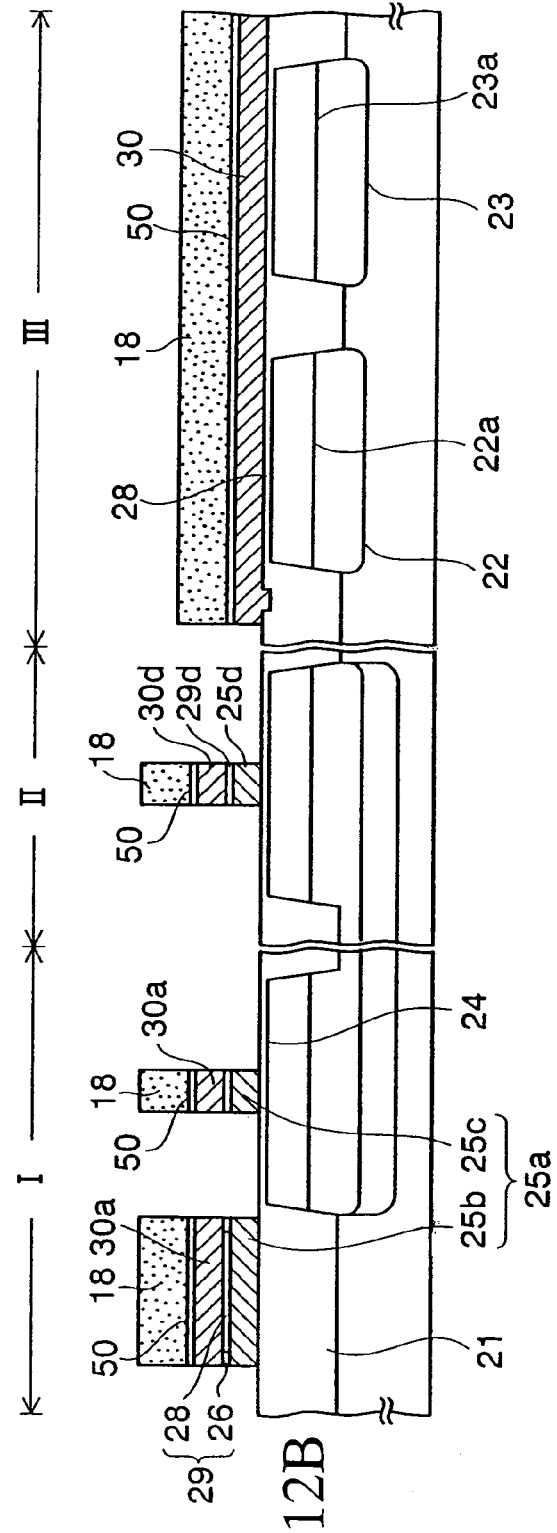

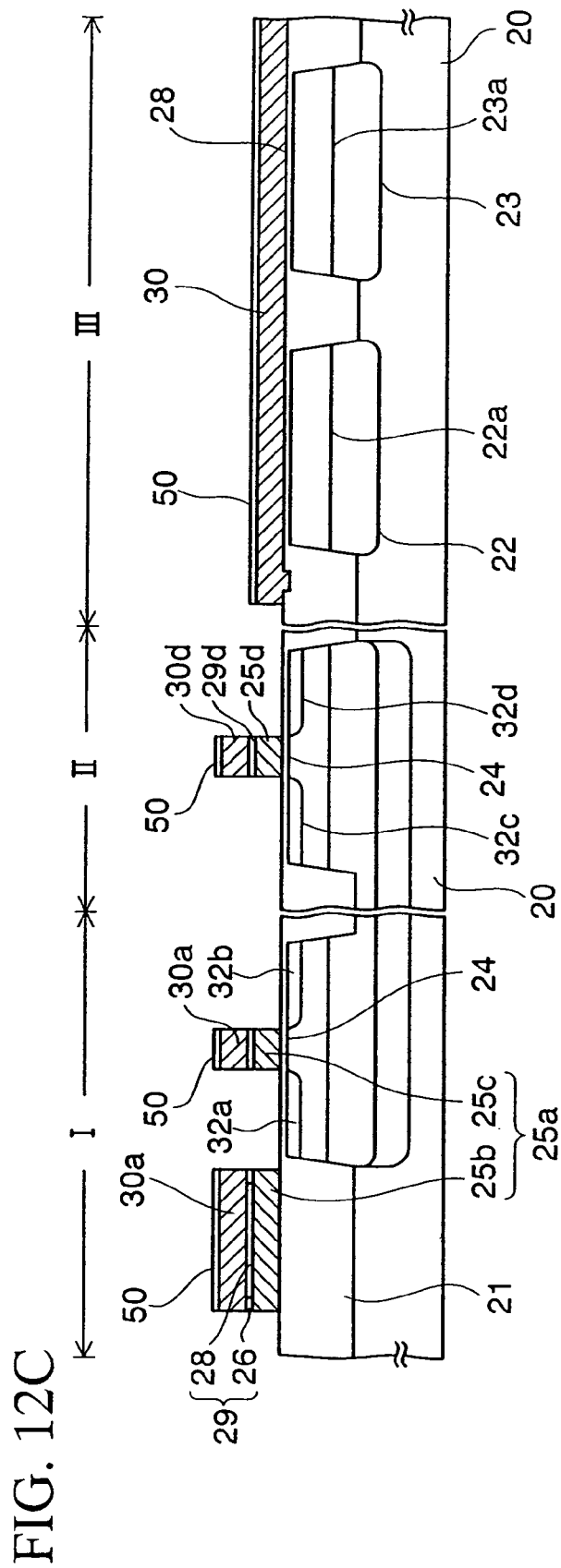

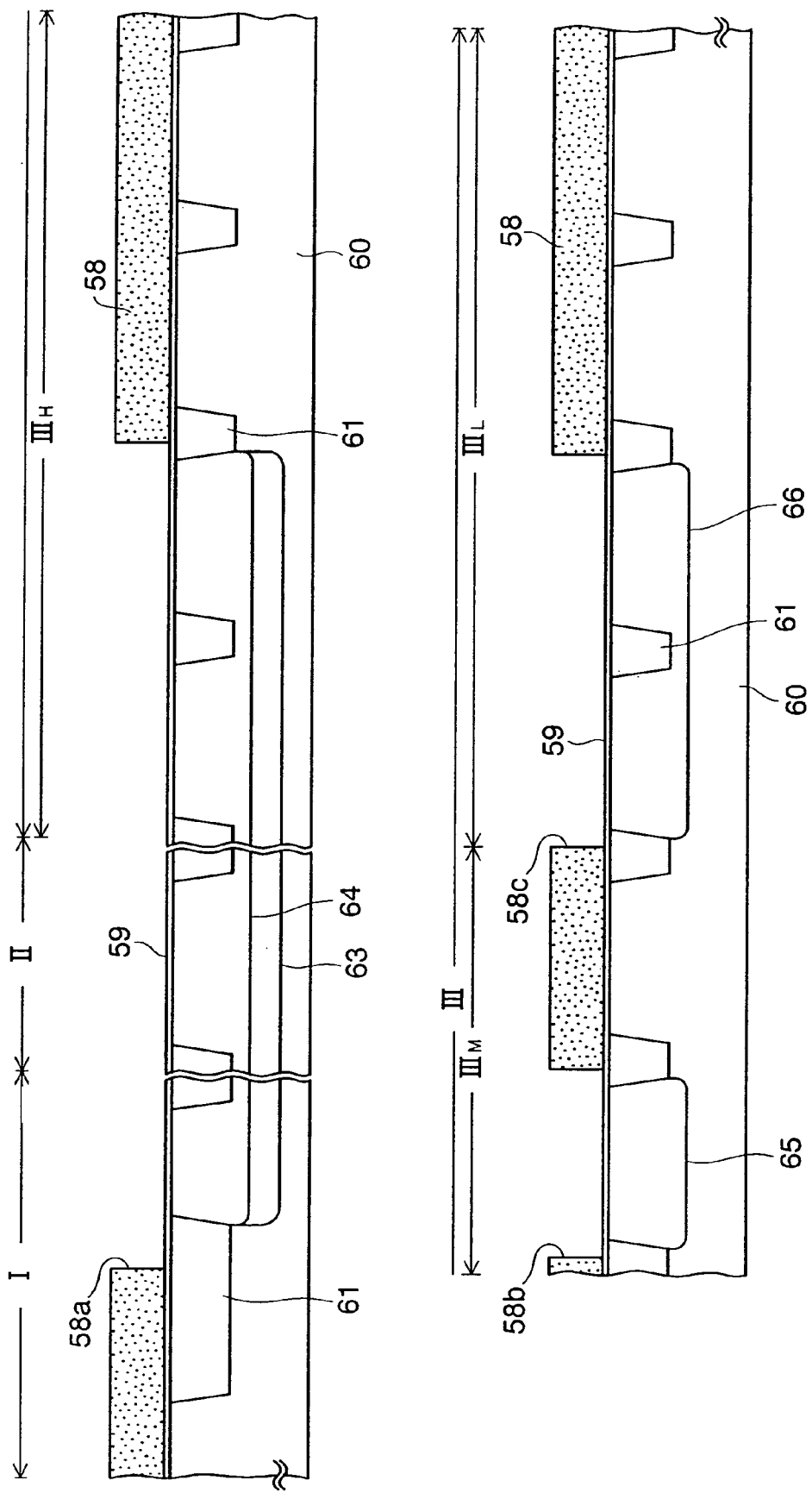

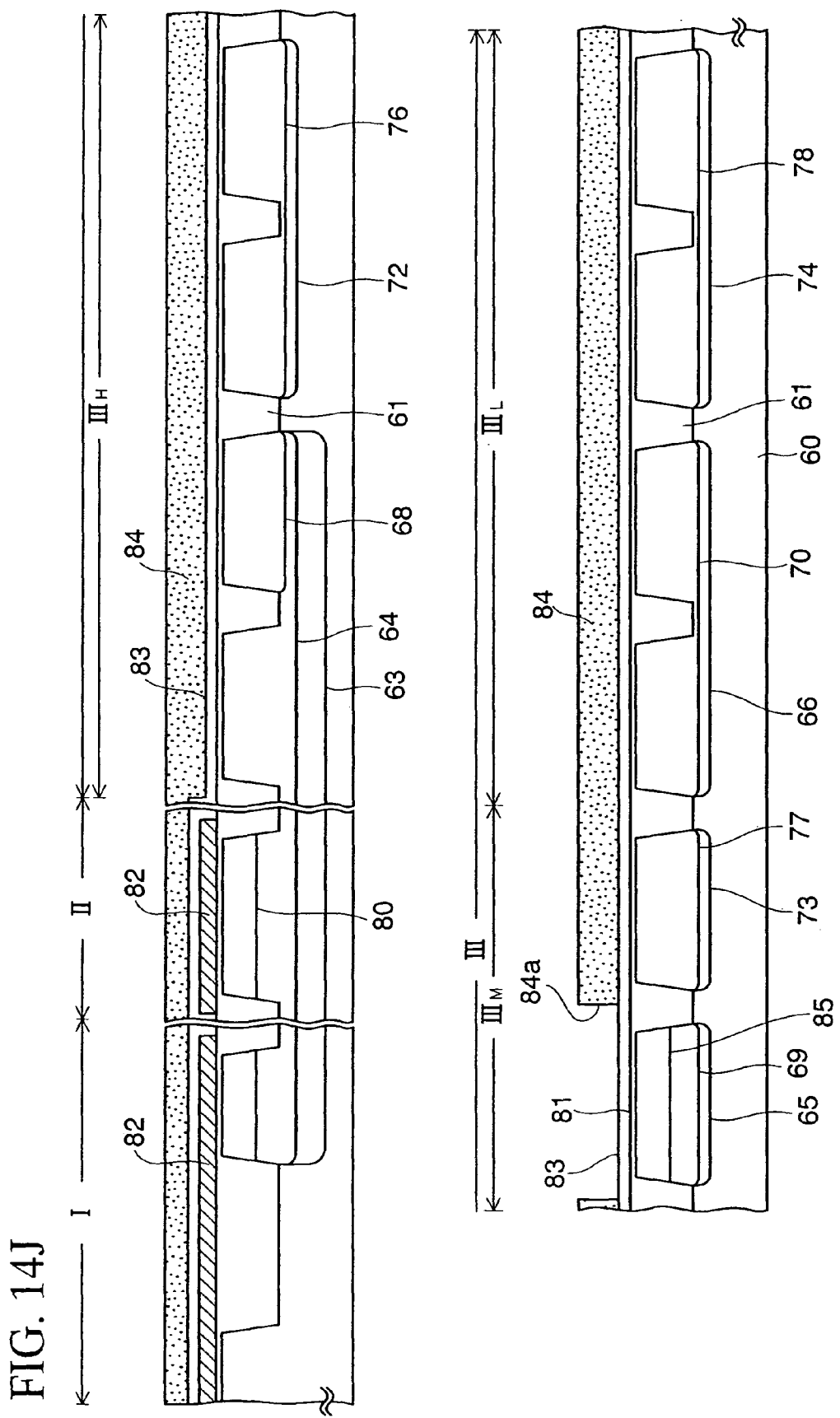

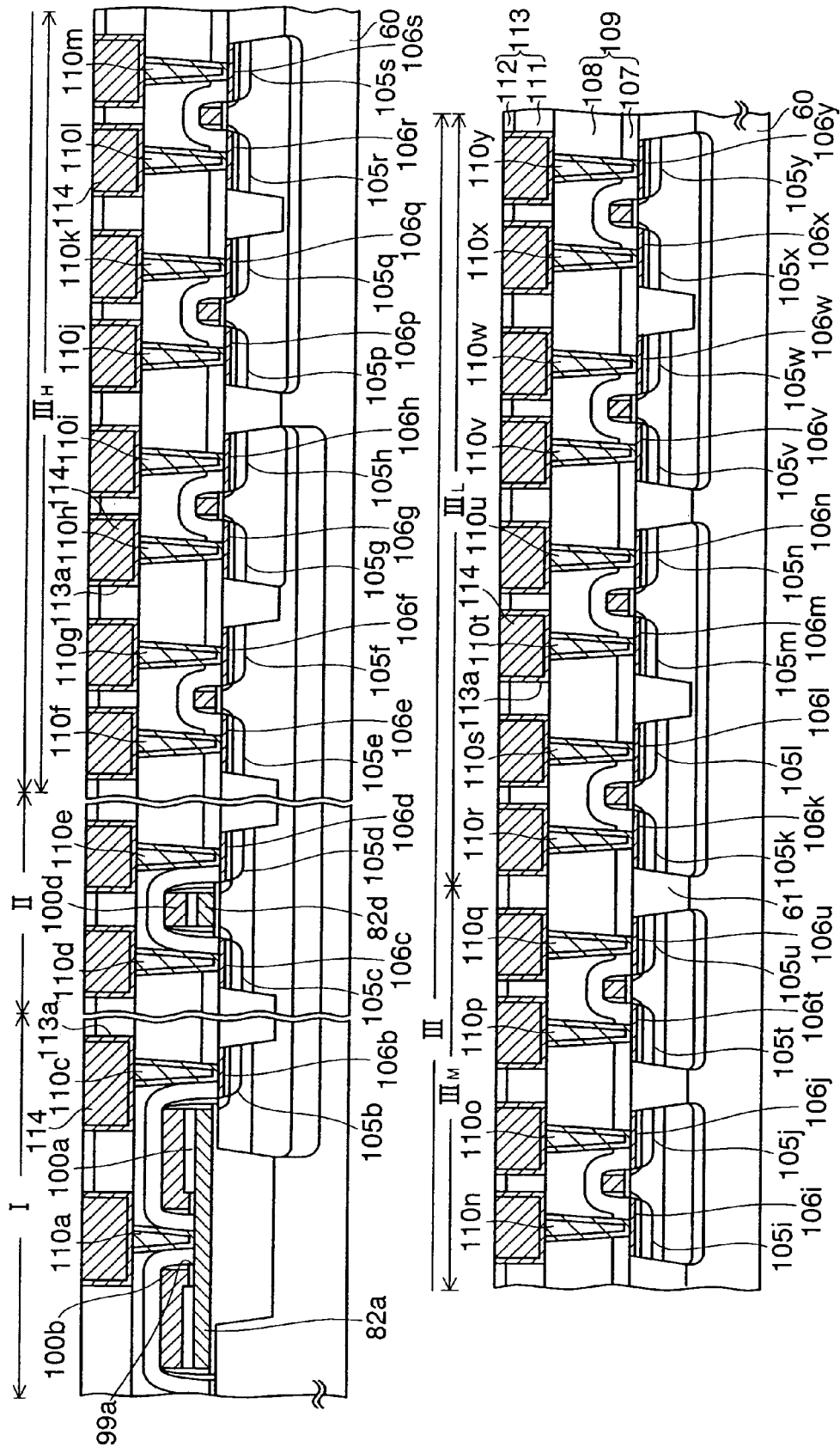

SEMICONDUCTOR DEVICE AND METHOD OF MANUFACTURING THE SAME

CROSS-REFERENCE TO RELATED APPLICATIONS

This application is a division of U.S. application Ser. No. 11/044,458, filed on Jan. 28, 2005 which is based on and claims priority of Japanese Patent Application No. 2004-316974 filed on Oct. 29, 2004, the entire contents of which are incorporated herein by reference.

BACKGROUND OF THE INVENTION

1. Field of the Invention

The present invention relates to a semiconductor device, and a method of manufacturing the device.

2. Description of the Related Art

A flash memory, which can hold memory even after power is turned off, is used in mobile devices such as a cell phone and also used in an FPGA (Field Programmable Gate Array) embedded with a logic circuit. Particularly, when the flash memory is embedded with the logic circuit as in the latter case, it is necessary to utilize each manufacturing process of the memory cell and the logic circuit well to prevent a problem from occurring in a logic-embedded memory to be shipped as a product.

In the logic-embedded memory, breakdown voltage of a tunnel insulating film that constituting the flash memory is monitored before shipping the product in some cases. However, because the tunnel insulating film is formed under a floating gate, in order to monitor the breakdown voltage by applying voltage from above and below the film, it is necessary that a conductive plug be directly contact the floating gate without contacting a control gate and test voltage be applied between the conductive plug and a semiconductor substrate.

For this reason, it is important how the process of the conductive plug contacting the floating gate is incorporated into the manufacturing process of a peripheral logic circuit.

The following Patent Documents 1 to 10 disclose various kinds of logic-embedded memory related to the present invention.

[Patent Document 1] Japanese Patent Laid-open No. 6-97457 publication
[Patent Document 2] Japanese Patent Laid-open No. 2003-158242 publication
[Patent Document 3] Japanese Patent Laid-open No. 11-219595 publication
[Patent Document 4] Japanese Patent Laid-open No. 2004-55763 publication
[Patent Document 5] Japanese Patent Laid-open No. 10-56161 publication
[Patent Document 6] Japanese Patent Laid-open No. 11-31799 publication
[Patent Document 7] Japanese Patent Laid-open No. 10-189954 publication
[Patent Document 8] Japanese Patent Laid-open No. 2003-37169 publication
[Patent Document 9] Japanese Patent Laid-open No. 2003-100887 publication
[Patent Document 10] Japanese Patent Laid-open No. 2003-124356 publication

SUMMARY OF THE INVENTION

According to one aspect of the present invention, there is provided a semiconductor device comprising: a laminated structure body, which integrally has: a first portion where a first insulating film, a first conductor, a second insulating film, and a second conductor are sequentially formed on a first region of a semiconductor substrate; a second portion where any one of said first conductor and said second conductor, or said first conductor and said second insulating film are laminated on said semiconductor substrate; and a third portion where neither said second insulating film nor said second conductor is formed on said semiconductor substrate; and a third insulating film, which covers said laminated structure body and includes a hole where a contact region of said first conductor of said laminated structure body is exposed at a part of said third portion.

Further, according to another aspect of the present invention, there is provided a semiconductor device comprising: a semiconductor substrate; a first insulating film and a first conductor sequentially formed on a first region of the semiconductor substrate; an insulator formed on a region of the first conductor other than the contact region; an interlayer insulating film that covers said first conductor and the insulator and includes hole on said contact region; and conductive plug that is formed in said hole and electrically connected with the contact region of the first conductor.

Furthermore, according to another aspect of the present invention, there is provided a method of manufacturing a semiconductor device comprising the steps of: forming a first insulating film on a first region of a semiconductor substrate; forming a first conductor on said first insulating film; forming a second insulating film on said first conductor; removing said second insulating film on the contact region of said first conductor; forming a second conductive film on said second insulating film; removing said second conductive film on the contact region of said first conductor to make the second conductive film into a second conductor; forming a third insulating film covering said second conductor; forming a first hole on said third insulating film on the contact region; and forming a first conductive plug, which is electrically connected with said contact region, in said first hole.

In the method of manufacturing a semiconductor substrate, it is preferable to form the first insulating film also on the second region of the semiconductor substrate in the step of forming the first insulating film, to form the second conductive film also on the first insulating film of the second region in the step of forming the second conductive film, to pattern the second conductive film in the second region to make it into a control gate in the step of making the second conductive film into the second conductor, to leave the second insulating film under the control gate as an intermediate insulating film in the step of removing the second insulating film on the contact region, to form a floating gate made up of the same material as the first conductor under the intermediate insulating film in the step of forming the first conductor, and to further comprise the step of forming a first and a second source/drain regions in the semiconductor substrate beside the floating gate to constitute a flash memory cell by the first and second source/drain regions, the first insulating film, the floating gate, the intermediate insulating film, and the control gate.

Furthermore, where the flash memory cell is formed in this manner, it is preferable to form the first insulating film also on the third region of the semiconductor substrate in the step of forming the first insulating film. Then, it is preferable to form the second insulating film also on the first insulating film of the third region, and to comprise the step of implanting an impurity into the semiconductor substrate of the third region while using the first and second insulating films as a through-film.

The first and second insulating films used as the through-film in this manner may be removed in the step of removing the second insulating film on the contact region after the above-described impurity is implanted.

According to this, the step of removing the second insulating film of the third region, which is not needed after it is used as the through-film for impurity implantation, serves also as a step of removing the second insulating film on the contact region. Therefore, the second insulating film above the contact region can be selectively removed without adding an additional mask step.

Moreover, in the step of removing the second insulating film in this manner, only the second insulating film is removed in the first region whereas the two layers of the first insulating film and the second insulating film are removed in the third region, so that etching amount in the third region is larger than that in the first region. Therefore, by setting the etching amount in this step to that in the third region, it is possible to prevent excessive etching of the first and second insulating films in the third region while the second insulating film in the first region is completely removed and to prevent a device isolation or the like from being etched.

BRIEF DESCRIPTION OF THE DRAWINGS

FIGS. 1A to 1G are in-process sectional views of a virtual semiconductor device (first example) on which a flash memory and a logic circuit are embedded.

FIGS. 2A to 2D are in-process sectional views of a virtual semiconductor device (second example) on which the flash memory and the logic circuit are embedded.

FIGS. 3A and 3B are in-process sectional views of a virtual semiconductor device (third example).

FIGS. 7A to 7G are in-process sectional views of a semiconductor device according to a second embodiment of the present invention.

FIGS. 8A to 8C are in-process plan views of the semiconductor device according to the second embodiment of the present invention.

FIGS. 9A to 9I are in-process sectional views of a semiconductor device according to a third embodiment of the present invention.

FIGS. 11A to 11M are in-process sectional views of a semiconductor device according to a fourth embodiment of the present invention.

FIGS. 12A to 12C are in-process sectional views of a semiconductor device according to a fifth embodiment of the present invention.

Figures 1E, 1F:
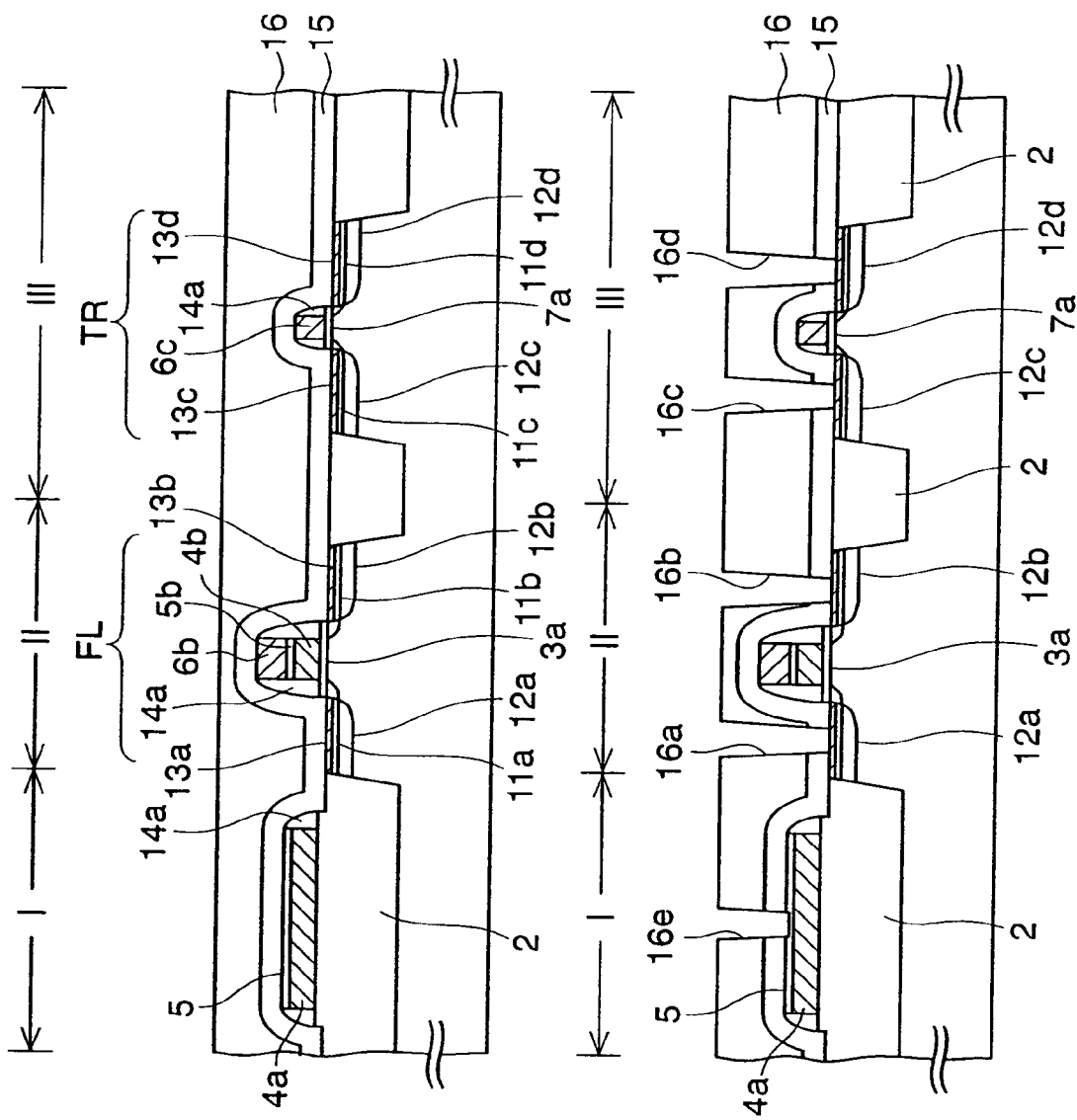

DETAILED DESCRIPTION OF THE PREFERRED EMBODIMENTS (1) Preliminary Explanation

Prior to explaining the embodiments of the present invention, preliminary explanation will be made for the present invention.

(i) First Example

FIGS. 1A to 1G are the in-process sectional views of a virtual semiconductor device on which the flash memory and the logic circuit are embedded (first example).

First of all, description will be made for the process until the sectional structure shown in FIG. 1A will be obtained.

Firstly, a device isolation trench 1a for STI (Shallow Trench Isolation) is formed in a silicon substrate 1, and then a silicon dioxide film is buried as a device isolation insulating film 2 in the trench 1a. Subsequently, after thermal oxidation is performed to the surface of the silicon substrate 1 to form a first thermal oxide film 3, a first polysilicon film 4 is formed on the entire surface and it is patterned to leave the polysilicon film 4 only in a first peripheral circuit region I and a cell region II. Then, an ONO film 5 is formed on the entire surface.

Subsequently, as shown in FIG. 1B, the first thermal oxide film 3 and the ONO film 5 on a second peripheral circuit region III are etched and removed. Then, after thermal oxidation is performed to the surface of the silicon substrate 1 in the second peripheral circuit region III to form a second thermal oxide film 7, a second polysilicon film 6 is formed on the entire surface.

Next, as shown in FIG. 1C, a resist pattern 9 is formed on the second polysilicon film 6. Then, the films (4 to 6) in the first peripheral circuit region I and the cell region II are etched by using the first resist pattern 9 as a mask. Thus, a floating gate 4b and a control gate 6b, which are made of polysilicon, are left in the cell region II. Further, first and second conductors (4a, 6a), which are made of polysilicon, are left in the first peripheral circuit region I.

Thereafter, the first resist pattern 9 is removed.

Next, as shown in FIG. 1D, a second resist pattern 10 where the second conductor 6a is exposed is formed in the cell region II and the second peripheral circuit region III. Then, by etching the second polysilicon film 6 by using the second resist pattern 10 as a mask, a gate electrode 6c is formed in the second peripheral circuit region III and the second conductor 6a in the first peripheral circuit region I is removed to expose the ONO film 5.

Subsequently, description will be made for the process until the sectional structure shown in FIG. 1E will be obtained.

Firstly, n-type impurity is ion-implanted into the silicon substrate 1 by using the floating gate 4b and the gate electrode 6c as a mask to form first to fourth source/drain extensions (11a to 11d) in the silicon substrate 1 beside each gate (4b, 6c). Next, after an insulating film such as a silicon oxide film is formed on the entire surface, the film is etched back and left as insulative sidewalls 14a beside each gate (4b, 6c) and the first conductor 4a. When etching back the film, the first and second thermal oxide films (3, 7) are patterned to be made into a tunnel insulating film 3a and a gate insulating film 7a, respectively.

Then, the n-type impurity is ion-implanted into the silicon substrate 1 again by using the insulative sidewalls 14a as a mask to form first to fourth n-type source/drain regions (12a to 12d) in the silicon substrate 1.

Next, after first to fourth silicide layers (13a to 13d) are formed on the first to fourth impurity diffusion regions (12a to 12d), a cover insulating film 15 and an interlayer insulating film 16 are sequentially formed on the entire surface. Although not shown in the figure, the silicide layers are also formed on the top surface of the gate electrodes 6b and 6c.

According to the above-described process, a peripheral transistor TR, which is made up of the first and second n-type impurity diffusion region (12a, 12b) and the gate electrode 6c, is formed in the second peripheral circuit region III, and a flash memory cell FL, which is made up of the first and second n-type impurity diffusion regions (12a, 12b), the tunnel insulating film 3a, the floating gate 4b, the intermediate insulating film 5b, and the control gate 6b, is formed in the cell region II.

On the other hand, the first conductor 4a in the first peripheral circuit region I serves also as the gate electrode of a reference transistor (not shown). Since the reference transistor has a gate insulating film formed in the same process as the tunnel insulating film 3a of the flash memory cell FL, it is possible to check the breakdown voltage of the tunnel insulating film 3a of the flash memory cell FL by checking the breakdown voltage of the reference transistor.

Next, as shown in FIG. 1F, the cover insulating film 15 and the interlayer insulating film 16 are patterned to form first to fourth holes (16a to 16d) having a depth reaching the first to fourth silicide layers (13a to 13d) and to form a fifth hole 16e above the first conductor 4a.

The holes (16a to 16d) are formed by etching the interlayer insulating film 16 while the cover insulating film 15 is firstly used as an etching stopper film, and then by etching the cover insulating film 15 after changing etching gas.

Among these holes, the contact structure of the first to fourth holes (16a to 16d) is called as a borderless contact. In the borderless contact, even if the holes (16a to 16d) suffer from slight positional shift and a part of them overlaps the device isolation insulating film 2, the etching amount of the device isolation insulating film 2 during the formation of the holes is suppressed by the difference of etching rate between the device isolation insulating film 2 and the cover insulating film 15.

On the other hand, since the fifth hole 16e is formed to contact the first conductor 4a and to apply gate voltage to the reference transistor, the first conductor 4a must be exposed under the bottom of the fifth hole 16e. However, it is necessary to etch the ONO film 5 under the cover insulating film 15 in order to form the fifth hole 16e whereas the formation of the first to fourth holes (16a to 16d) is completed simultaneously with the end of etching to the cover insulating film 15.

Therefore, when the etching time of the holes is set to the etching time of the first to fourth holes (16a to 16d), the etching amount of the fifth hole 16e becomes insufficient and the hole 16e does not open completely, and thus the first conductor 4a is not exposed.

Therefore, to open the fifth hole 16e, etching must be additionally performed by a quantity for the etching time of the ONO film 5 in which the fifth hole 16e is formed completely, in addition to the etching time necessary for forming the first to fourth holes (16a to 16d).

Despite such long etching time, problem does not arise if a positional shift does not occur between the first to fourth holes (16a to 16d) and the first to fourth silicide layers (13a to 13d).

Figure 1G:
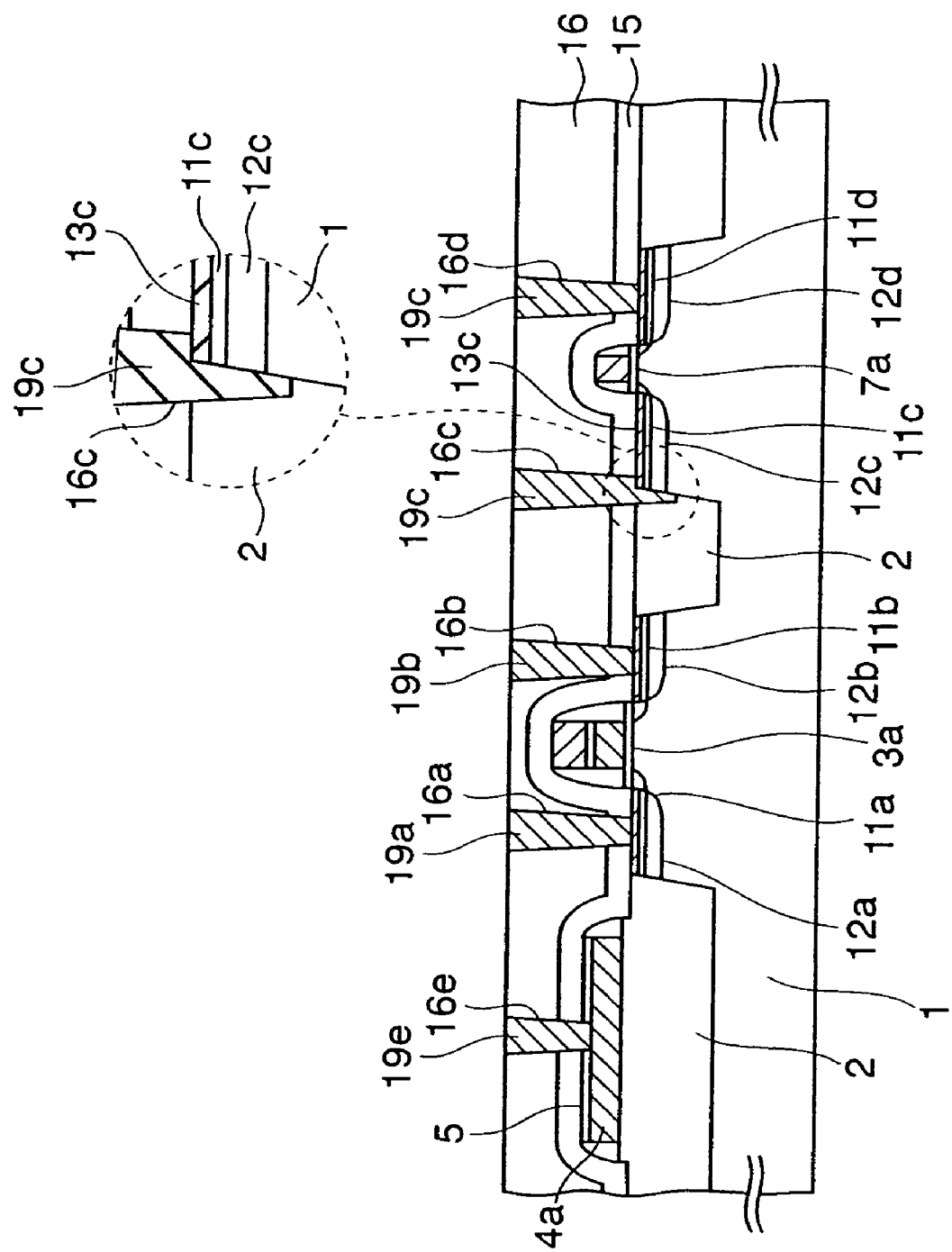

However, if there is a positional shift between them, the device isolation insulating film 2 under the third hole 16c is etched, for example, and the silicon substrate 1 is exposed on the third hole 16c as shown in the dotted circle of FIG. 1G. Consequently, short circuit occurs between a third conductive plug 19c buried in the third hole 16c and the silicon substrate 1, and it becomes impossible for the conductive plug 19c to control the electric potential of the third n-type source/drain region 12c. Such a problem could occur, not only in the third conductive plug 19c, but also in first, second and fourth conductive plugs (19a, 19b, 19d) formed in the first, second, and fourth holes (16a, 16b, 16d).

(ii) Second Example

To solve the problem in the first example, the following method is also considered.

FIGS. 2A to 2D are the in-process sectional views of the virtual semiconductor device (second example).

Firstly, after completing the process of FIG. 1D shown in the first example, the n-type impurity is ion-implanted into the silicon substrate 1 by using the floating gate 4b and the gate electrode 6c as a mask to form the first to fourth source/drain extensions (11a to 11d) in the silicon substrate 1 beside each gate (4b, 6c) as shown in FIG. 2A.

Next, as shown in FIG. 2B, the insulating film 14 such as silicon oxide is formed on the entire surface.

Subsequently, as shown in FIG. 2C, the insulating film 14 is etched back and left as the insulative sidewalls 14a beside each gate (4b, 6c) and the first conductor 4a. Etching is further performed in this example to remove the ONO film 5 on the first conductor 1.

Then, the n-type impurity is ion-implanted into the silicon substrate 1 again using the insulative sidewalls 14a as a mask to form the first to fourth n-type source/drain regions (12a to 12d) in the silicon substrate 1.

Next, the first to fourth silicide layers (13a to 13d) are formed on the first to fourth n-type source/drain regions (12a to 12d).

Thereafter, the first to fifth holes (16a to 16e) are formed in the interlayer insulating film 16 by performing the process of FIGS. 1E to 1G explained in the first example, and the sectional structure shown in FIG. 2D is obtained.

In the above-described second example, the ONO film 5 is removed simultaneously when the insulative sidewalls 14a are formed by etchback as shown in FIG. 2C, and the surface of the first conductor 4a is exposed. Accordingly, the surface of the first conductor 4a is exposed under the fifth hole 16e without conducting excessive etching to the first to fourth holes (16a to 16d).

However, since etching is performed longer than etching time originally required in the etchback process shown in FIG. 2C, the device isolation insulating film 2 is etched and its top surface becomes lower than that of the silicon substrate 1. As a result, side surfaces of the third n-type source/drain region 12c and the silicon substrate 1 appear on the sidewalls of the device isolation trench 1a as shown in the dotted line X of FIG. 2D. Therefore, when positional shift occurs in the third hole 16c, short circuit is caused between the third conductive plug 19c formed in the third hole 16c and the silicon substrate 1 similar to the first example.

(iii) Third Example

The following method is considered in addition to the above-described first and second examples.

FIGS. 3A and 3B are the in-process sectional views of the virtual semiconductor device (third example).

Firstly, after the process of FIG. 1C shown in the first example, a second resist pattern 10 is formed on the control gate 6b and the second polysilicon film 6, where the second conductor 6a is exposed, as shown in FIG. 3A.

Next, as shown in FIG. 3B, the second polysilicon film 6 is etched by using the second resist pattern 10 as a mask to form the gate electrode 6c, and the second conductor 6a and the ONO film 5 are etched and removed to expose the first conductor 4a. Then, the second resist pattern 10 is removed.

Thereafter, the process of FIGS. 1E to 1G explained in the first example will be performed.

In the third example, the ONO film 5 is etched and removed during the patterning of the gate electrode 6c. Since the top surface of the device isolation insulating film 2 becomes lower than the top surface of the silicon substrate 1 due to the etching, a problem similar to the second example occurs. Further, if the gate insulating film in the second peripheral circuit region III is thin, such a problem occurs that the surface of the silicon substrate 1 in a region, where source/drain is to be formed, is exposed to etching atmosphere of RIE or the like for a long period of time and is contaminated, and the silicon substrate 1 is etched, when the ONO film is etched.

Although the above-described first to third examples have different methods of removing the ONO film 5 on the first conductor 4a, short circuit occurs in all examples between the conductive plug and the silicon substrate 1 in the first to fourth holes (16a to 16d) when removing the ONO film. To prevent this, addition of photolithographic process exclusively for removing the ONO film 5 could be considered, but this increases the number of processes to deteriorate the productivity of semiconductor devices.

The inventors thought out the following embodiments of the present invention in order to solve the problems in the first to third examples.

(2) First Embodiment

Figure 4M:
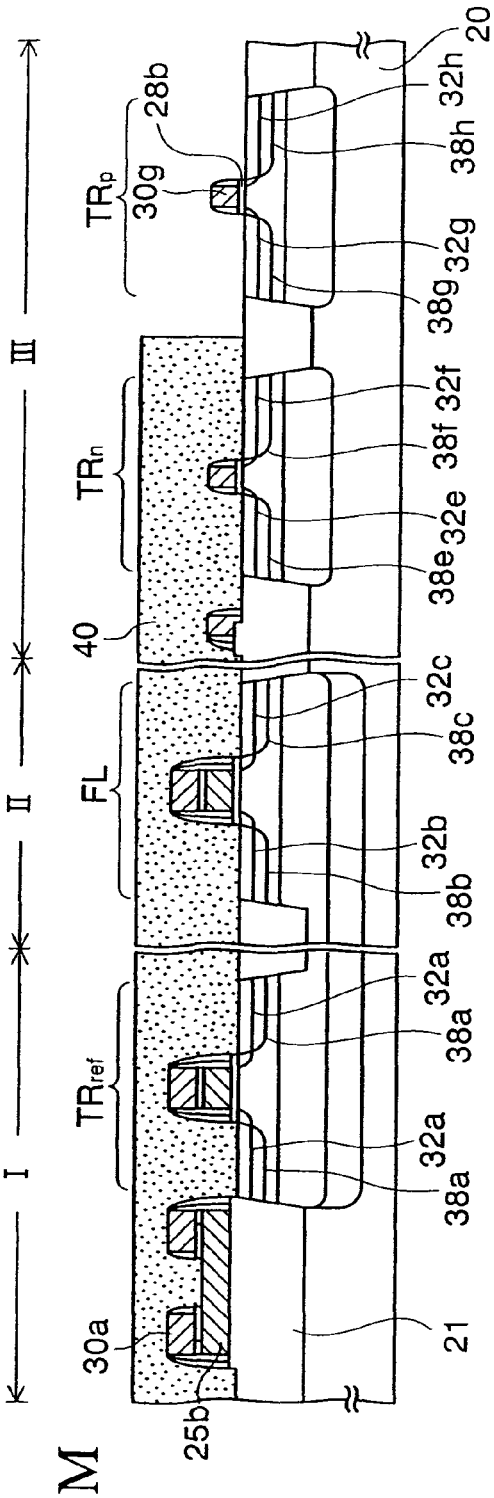
FIGS. 4A and 4B are in-process sectional views of a semiconductor device according to a first embodiment of the present invention (1).
FIGS. 4C to 4P are in-process sectional views of the semiconductor device according to the first embodiment of the present invention.
Figure 5A:
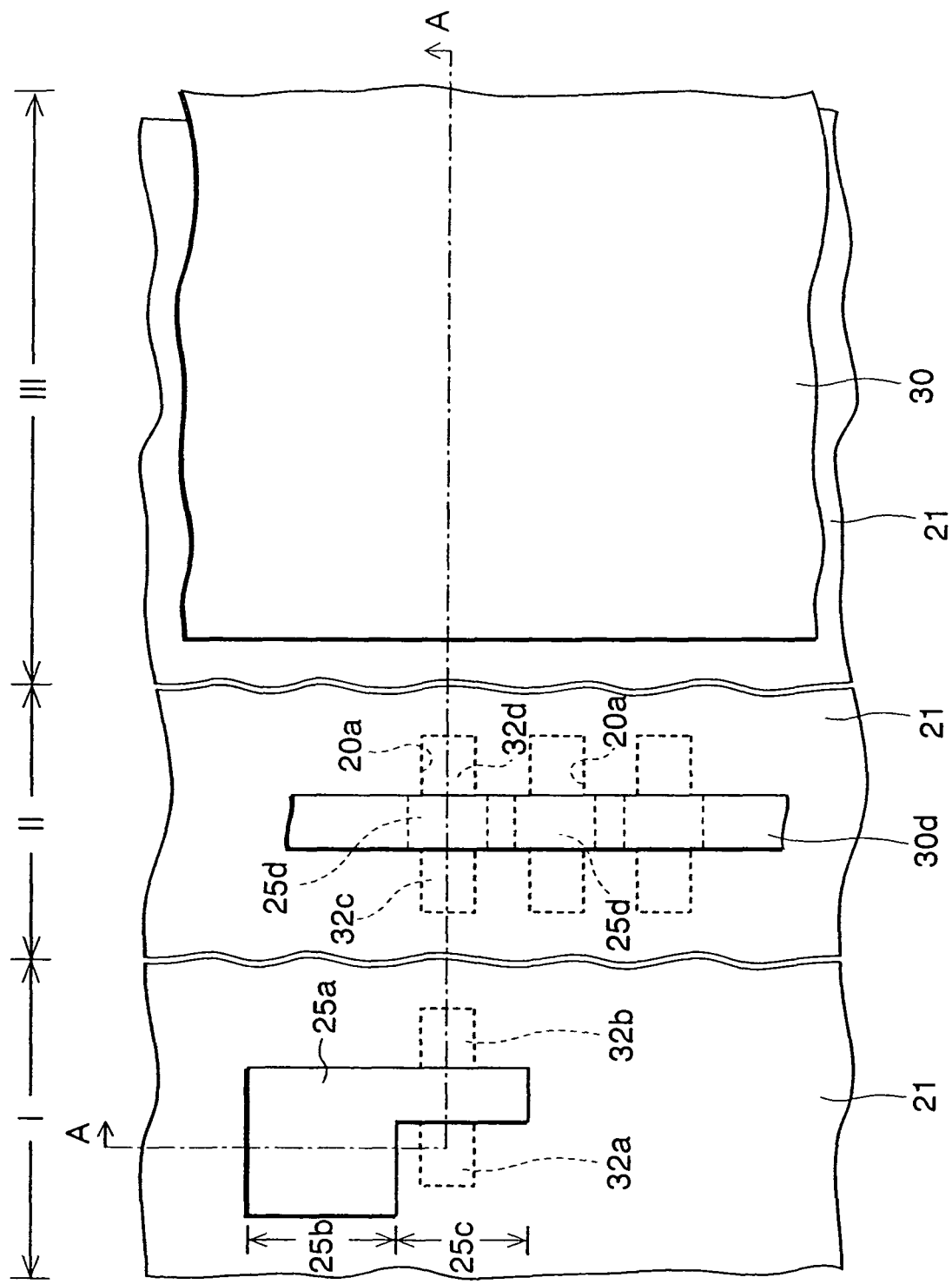
FIGS. 5A and 5B are in-process plan views of the semiconductor device according to the first embodiment of the present invention.
Figure 5B:
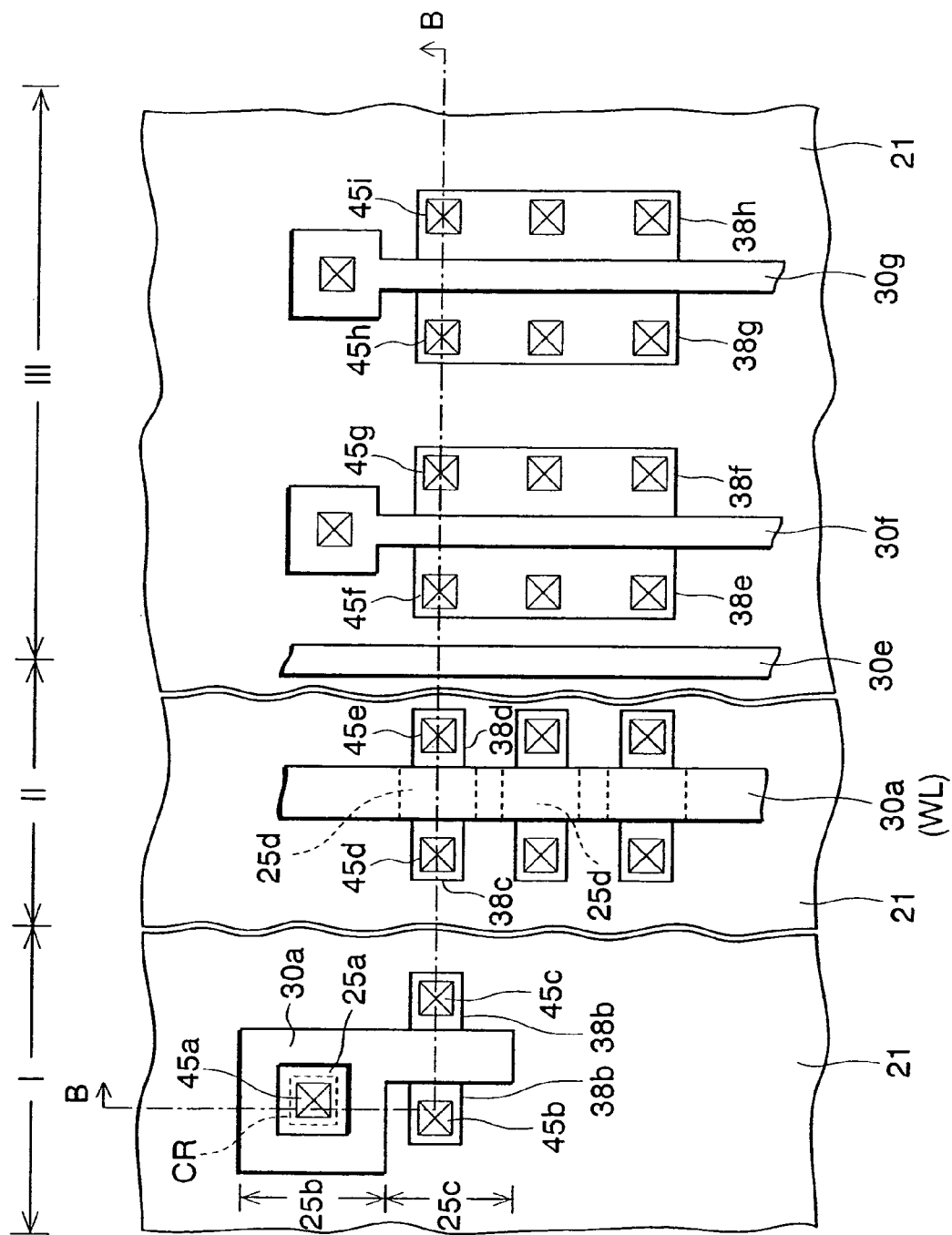

FIGS. 4A to 4P are in-process sectional views of a semiconductor device according to a first embodiment of the present invention, and FIGS. 5A and 5B are the plan views thereof.

In this embodiment, a logic-embedded memory such as an FPGA is fabricated.

First of all, description will be made for the process until the sectional structure shown in FIG. 4A will be obtained.

Firstly, after a device isolation trench 20a for STI is formed on a p-type silicon substrate (semiconductor substrate) 20, on which the first peripheral circuit region (first region) I, the cell region (second region) II, and the second peripheral circuit region (third region) III are defined, silicon oxide is buried in the device isolation trench 20a as a device isolation insulating film 21.

Next, thermal oxidation is performed to the surface of the silicon substrate 20 to form a sacrifice oxide film (not shown), and $P^+$ ion as n-type impurity is ion-implanted into the silicon substrate 20 while the sacrifice oxide film is used as a through-film to form a first n-well 17a in a deep portion of the silicon substrate 20. Accelerating energy of 2 MeV and dose of $2 \times 10^{13}$ cm$^{-3}$, for example, are employed as the conditions of ion implantation.

Subsequently, $B^+$ ion of the p-type impurity is implanted into the silicon substrate 20 to form a first p-well 17b in the silicon substrate 20 at a shallower portion than the first n-well 17a. This ion-implantation is performed by first and second steps, and the condition of the first step includes accelerating energy of 400 KeV and dose of $1.5 \times 10^{13}$ cm$^{-3}$, whereas the second step includes accelerating energy of 100 KeV and the dose of $2 \times 10^{12}$ cm$^{-3}$.

Furthermore, $B^+$ ion is ion-implanted into the silicon substrate 20 under the conditions of the accelerating energy of 40 KeV and the dose of $6 \times 10^{13}$ cm$^{-3}$, and an impurity diffusion region 17c for cell for controlling threshold voltage is formed.

Thereafter, ion implantation is also performed in the second peripheral circuit region III to form a second n-well 22 and a second p-well 23 as shown in the drawing. Of these wells, ion implantation to the second n-well 22 is conducted in the two steps, where the accelerating energy of 600 KeV and the dose of $1.5 \times 10^{13}$ cm$^{-3}$ of $P^+$ ion is employed as the first conditions, and the accelerating energy of 240 KeV and the dose of $6.0 \times 10^{12}$ cm$^{-3}$ is employed as the second conditions. Further, the second p-well 23 is formed by two step ion implantation, where the accelerating energy of 400 KeV and the dose of $1.5 \times 10^3$ cm$^{-3}$ of $B^+$ ion is employed as the first conditions, and the accelerating energy of 100 KeV and the dose of $8 \times 10^{12}$ cm$^{-3}$ are employed as the second conditions.

Note that the implantation of the above-described n-type impurity and p-type impurity are respectively performed using resist patterns (not shown), and the resist patterns are removed after the ion implantations are completed.

Then, after the sacrifice oxide film used as the through-film of ion implantation is removed by hydrofluoric acid solution to expose a clean surface of the silicon substrate 20, thermal oxidation is performed to the clean surface in the mixed atmosphere of Ar and $O_2$ under the condition of temperature at 900° C. to 1050° C. Thus, a thermal oxide film having the thickness of about 10 nm is formed as a first insulating film 24 on each region (I to III) of the silicon substrate 20.

Subsequently, description will be made for the process until the sectional structure shown in FIG. 4B will be obtained.

Firstly, a polysilicon film as a first conductive film 25 is formed on the first insulating film 24 with the thickness of about 90 nm by a low pressure CVD (Chemical Vapor Deposition) using $SiH_4$ (silane) and $PH_3$ (phosphine) as reactive gas. In-situ phosphorous is doped into the polysilicon film due to $PH_3$ in the reactive gas.

Then, the first conductive film 25 is patterned by photolithography to remove it from the second peripheral circuit region III. The first conductive film 25 in the cell region II becomes a stripe shape in word line directions.

Next, a silicon oxide film and a silicon nitride film are formed in this order on the first conductive film 25 and the first insulating film 24 on the second peripheral circuit region III with the thickness of 5 nm and 10 nm, respectively, by using the low pressure CVD method. Further, the surface of the silicon nitride film is oxidized in $O_2$ atmosphere under the condition of substrate temperature at about 950° C. and heating time for about 90 minutes to form a silicon oxide film having the thickness of about 30 nm on the surface of the silicon nitride film. Consequently, the ONO film, where the silicon oxide film, the silicon nitride film, and the silicon oxide film are laminated in this order, is formed as a second insulating film 26 on the entire surface.

The ONO film constituting the second insulating film 26 has smaller leakage current comparing to the silicon oxide film even if it is formed at low temperature. Therefore, by using the second insulating film 26 as an intermediate insulating film between the floating gate and the control gate of the flash memory cell, electric charge stored in the floating gate is difficult to flow toward the control gate, by which information written in the flash memory cell can be held for a long period of time.

After forming the second insulating film 26, by employing conditions of the accelerating energy of 150 KeV and the dose of $3\times10^{12}$ cm$^{-3}$, As$^-$ ion of the n-type impurity is ion-implanted into the silicon substrate 20 while the first and second insulating films (24, 26) are used as the through-film, thus an n-type impurity diffusion region 22a is formed. The n-type impurity diffusion region 22a serves to adjust the threshold voltage of a p-type MOS transistor that will be formed later.

Furthermore, B$^+$ ion of the p-type impurity is ion-implanted into the silicon substrate 20 while the first and second insulating films (24, 26) are used as the through-film under the conditions of the accelerating energy of 30 KeV and the dose of $5\times10^{12}$ cm$^{-3}$. Thus, a p-type impurity diffusion region 23a for adjusting the threshold voltage of the n-type MOS transistor is formed in the second peripheral circuit region III.

Note that n-type impurity and p-type impurity are independently implanted in the silicon substrate 20 for the impurity diffusion regions (22a, 23a) by using resist patterns (not shown).

Subsequently, as shown in FIG. 4C, a first resist pattern 27 is formed on the second insulating film 26. The first resist pattern 27 has a first window 27a on a contact region CR of the first conductive film 25, which will be connected with the conductive plug later, and a second window 27b in the second peripheral circuit region III. Then, the second insulating film 26 in a region that is not covered by the first resist pattern 27 is etched by plasma etching using the gas mixture of CHF$_3$ and O$_2$ while the first resist pattern 27 is used as a mask, and thus the silicon oxide film and the silicon nitride film of the top layer, which constitute the second insulating film 26, are etched. Next, by using HF solution, wet etching is performed for the silicon oxide film of the bottom layer of the second insulating film 26 to remove it while the first resist pattern is used as a mask.

Consequently, the first conductive film 25 in the contact region CR and the silicon substrate 20 in the second peripheral circuit region III are exposed, and the second insulating film is left only in a region other than the contact region CR.

Then, after removing the first resist pattern 27 by oxygen ashing, the surface of the silicon substrate 20 is cleaned by wet treatment.

Next, description will be made for the process until the sectional structure shown in FIG. 4D will be obtained.

Firstly, oxidizing condition where substrate temperature is set to about 850° C. in oxygen atmosphere is employed, and thus silicon in an area that is not covered by the second insulating film 26 is thermally oxidized. Consequently, a thermal oxide film having the thickness of about 2.2 nm is formed as a third insulating film 28 on the surface of an area on the first conductive film 25 made of polysilicon, where the second insulating film 26 has been removed, and on the surface of the silicon substrate 20 of the second peripheral circuit region III. The third insulating film 28 is formed adjacent to the second insulating film 26, and the second and third insulating films (26, 28) constitute an insulator 29. Although not shown in FIG. 4D, it should be noted that the thickness of the insulator 29 on the contact region CR is significantly thinner than that of other regions.

Thereafter, a non-doped polysilicon film having the thickness of about 180 nm is formed as a second conductive film 30 on each insulating film (26, 28) by a low-pressure CVD method using SiH$_4$ as reactive gas.

Next, description will be made for the process until the sectional structure shown in FIG. 4E will be obtained.

Firstly, photoresist is coated on the second conductive film 30, and it is exposed and developed to form a second resist pattern 18. Next, the first and second conductive films (25, 30) and the insulator 29 are patterned by using the second resist pattern 18 as an etching mask. The patterning is conducted in a plasma etching chamber, gas mixture of Cl$_2$ and O$_2$ is used as etching gas for the first and second conductive films (25, 30) made of polysilicon, and gas mixture of CHF$_3$ and O$_2$ is used as etching gas for the second insulating film 26 made of the ONO film.

As a result of the patterning, the first and second conductive films (25, 30) in the first peripheral circuit region I are made into first and second conductor (25a, 30a) respectively in the region including the contact region CR while the second conductive film 30 is left in the second peripheral circuit region III. In the cell region, the first and second conductive films (25, 30) and the insulator 29 are made into a floating gate 25d, a control gate 30d, and an intermediate insulating film 29d, respectively.

After this, the second resist pattern 30 is removed.

FIG. 5A is the plan view after completing the process, and the previous FIG. 4E corresponds to the sectional view taken along A-A line of FIG. 5A. As shown in this drawing, the first conductor 25a is made up of a pad portion 25b on the device isolation insulating film 21 and a gate portion 25c on the first insulating film 24.

Next, as shown in FIG. 4F, a third resist pattern 31, which covers the pad portion 25b of the first conductor 25a and the second conductive film 30 and includes a third window 31a where the gate portion 25c and the floating gate 25d are exposed, is formed on each region (I to III). Then, As of the n-type impurity is ion-implanted into the silicon substrate 20 through the third window 31a under the conditions of the accelerating energy of 50 KeV and the dose of $6\times10^{14}$ cm$^{-3}$, first to fourth n-type source/drain extensions (32a to 32d) are formed in the silicon substrate 20 beside the floating gate 25d and the gate portion 25c.

The third resist pattern 31 is removed after this.

Next, as shown in FIG. 4G, after the side surfaces of the floating gate 25d and the control gate 30d are oxidized to form a thermal oxide film (not shown), a silicon nitride film is formed on the entire surface and it is etched back, and it is left as first insulative sidewalls 33 on the side surfaces of the second conductor 30a and the floating gate 25d.

Next, as shown in FIG. 4H, a fourth resist pattern 34 is formed on each region (I to III). The fourth resist pattern 34 has a fourth window 34a on the contact region CR of the pad portion 25b and has a gate electrode shape on the second peripheral circuit region III. Then, the mixed gas of Cl$_2$ and O$_2$ is employed as etching gas and plasma etching is performed to the second conductor 30a and the second conductive film 30 while the fourth resist pattern 34 is used as a mask. Thus, the second conductor 30a on the contact region CR is removed to form a first opening 30b and first and second gate electrodes (30f, 30g) are formed on the second peripheral circuit region III. Further, in this etching, the second conductive film 30 extended on the device isolation insulating film 21 is patterned into wiring 30e.

The fourth resist pattern 34 is removed after this.

Next, as shown in FIG. 4I, a fifth resist pattern 35 including a fifth window 35a of a size, where the third insulating film 28 beside the first gate electrode 30f is exposed, is formed on each region (I to III). Then, B$^+$ is ion-implanted into the silicon substrate 20 under the conditions of the tilt angle of 0°, the accelerating energy of 0.5 KeV and the dose of $3.5\times10^{14}$ cm$^{-3}$ while the fifth resist pattern 35 is used as a mask. Subsequently, As$^+$ is ion-implanted into the silicon substrate 20 from four directions through the fifth window 35a under the conditions of the tilt angle of 28°, the accelerating energy of 80 KeV and the dose of 7.0×10$^{12}$ cm$^{-3}$, and thus fifth and sixth p-type source/drain extensions (32e, 32f) including n-type pocket regions are formed in the silicon substrate 20 beside the first gate electrode 30f. After this, the fifth resist pattern 35 is removed.

Then, as shown in FIG. 4J, sixth resist pattern 36 including a sixth window 36a of a size, where the third insulating film 28 beside the second gate electrode 30g is exposed, is formed on each region (I to III).

Then, As$^+$ is ion-implanted into the silicon substrate 20 under the conditions of the tilt angle of 0°, the accelerating energy of 3.0 KeV and the dose of 1.0×10$^{15}$ cm$^{-3}$ while the sixth resist pattern 36 is used as a mask. Subsequently, BF$_2$ is ion-implanted into the silicon substrate 20 through the sixth window 36a under the conditions of the tilt angle of 28°, the accelerating energy of 35 KeV and the dose of 1.0×10$^{13}$ cm$^{-3}$, and thus first and second n-type source/drain extensions (32g, 32h) including p-type pocket regions are formed in the silicon substrate 20 beside the second gate electrode 30g. After this, the sixth resist pattern 36 is removed.

Next, description will be made for the process until the sectional structure shown in FIG. 4K will be obtained.

Firstly, after a silicon oxide film is formed on the entire surface by the CVD method, the silicon oxide film is etched back to form second insulative sidewalls 37 on the side surfaces of the second conductor 30a, the control gate 30d, the wiring 30e, and the first and second gate electrodes (30f, 30g). Then, by continuing the etchback, the third insulating film 28 that constitutes the insulator 29 on the pad portion 25b is etched by using the second insulative sidewall 37 as a mask, and a second opening having a smaller diameter than the first opening 30b is formed.

Further, the first insulating film 24 is patterned by the etchback while the second insulative sidewalls 37 function as a mask, and the first insulating film 24 is left as a gate insulating film 24a and a tunnel insulating film 24b under the gate portion 25c and the floating gate 25d, respectively.

Furthermore, the third insulating film 28 is patterned in the second peripheral circuit region III, and it is left as gate insulating films (28a, 28b) under the first and second gates (30f, 30g).

Subsequently, as shown in FIG. 4L, a seventh resist pattern 39 where an NMOS forming region is exposed is formed on the silicon substrate 20, and P$^+$ is ion-implanted into the silicon substrate 20 under the conditions of the accelerating energy of 10 KeV and the dose of 6×10$^{15}$ cm$^{-3}$ while the resist pattern 39 is used as a mask. Consequently, first and sixth n-type source/drains (38a to 38f) are formed in the silicon substrate 20 beside the gate portion 25c, the floating gate 25d, and the first gate electrode 30f. In addition, the n-type impurity is also introduced into the second conductor 30a, the control gate 30d, and the first gate electrode 30f, in this ion implantation, and they are made into n-type.

As a result, a reference transistor TR$_{ref}$, which is made up of the gate portion 25c, gate insulating film 24a, and the first and second n-type source/drain regions (28a, 28b), is formed in the first peripheral circuit region I. On the other hand, a flash memory cell FL, which is made up of the control gate 30d, the intermediate insulating film 29d, the floating gate 25d, the tunnel insulating film 24b, and the third and fourth n-type source/drain regions (38c, 38d), is formed in the cell region II. Then, an n-type MOS transistor TR$_n$, which is made up of the first gate electrode 30f, the gate insulating film 28a, and the fifth and sixth n-type source/drain regions (38e, 38f), are formed in the second peripheral circuit region III.

After this, the seventh resist pattern 39 is removed.

Subsequently, as shown in FIG. 4M, the first peripheral circuit region I, the cell region II, and the n-type MOS transistor TR$_n$ is covered by an eighth resist pattern 40. Then, the ion implantation conditions of the accelerating energy of 5 KeV and the dose of 4×10$^{15}$ cm$^{-3}$ are employed, and first and second p-type source/drain regions (38g, 38h) are formed by introducing p-type impurity in the silicon substrate 20 beside the second gate electrode 30g. Consequently, a p-type MOS transistor TR$_p$, which is made up of the second gate electrode 30g, the gate insulating film 28b, and the first and second p-type source/drains (38g, 38h), are formed in the second peripheral circuit region III next to the n-type MOS transistor TR$_n$.

The p-type MOS transistor TR$_p$ constitutes a logic circuit such as a sense amplifier together with the n-type MOS transistor TR$_n$.

The eighth resist pattern 40 is removed after the ion implantation is completed.

Next, description will be made for the process until the sectional structure shown in FIG. 4N will be obtained.

Firstly, after a cobalt film is formed on the entire surface at the thickness of about 8 nm by a sputtering method, the cobalt film is annealed to allow it to react with silicon. Then, the cobalt film on the device isolation insulating film 21 or the like, which has not been reacted, is removed by wet etching to form first to eighth cobalt-silicide layers (41a to 41h) on the surface layer of the silicon substrate 20. Although not shown in the figure, cobalt-silicide layers are also formed on the top surface of the gate electrodes Subsequently, a silicon nitride film is formed in the thickness of about 50 nm by the CVD method, and is used as an etching stopper film 42. Next, a silicon oxide film as a fourth insulating film 43 is formed on the etching stopper film 42 by the CVD method, and the etching stopper film 42 and the fourth insulating film 43 are made to be a first interlayer insulating film 44. Note that the thickness of the fourth insulating film 43 is about 1000 nm on the flat surface of the silicon substrate 20.

Subsequently, the top surface of the first interlayer insulating film 44 is polished to make it flat by a CMP (Chemical Mechanical Polishing) method. Then, the first interlayer insulating film 44 is patterned by photolithography to form first to ninth holes (44a to 44i). Of these holes, the first hole 44a is positioned on the contact region CR of the pad portion 25b, and is formed inside the first and second openings (30b, 29a). Further, the remaining second to ninth holes (44b to 44i) are respectively formed on the cobalt-silicide layers (41a to 41h). Since the second insulating film 26 constituted by the ONO film is not formed under the above-described first hole 44a, it is possible to expose the surface of the pad portion 25b by forming the first hole 44a under the same forming conditions of the fourth to ninth holes (44a to 44i) in the second peripheral circuit region III.

Next, description will be made for the process until the sectional structure shown in FIG. 4O will be obtained.

Firstly, a Ti (titanium) film and a TiN (titanium nitride) film are formed in this order in the first to ninth holes (44a to 44i) and on the first interlayer insulating film 44 by the sputtering method, and they are used as a glue-film, and a W (tungsten) film is formed on the glue-film by a CVD method using tungsten hexafluoride as reactive gas to completely fill the inside of the first to ninth holes (44a to 44i). Then, excessive W film and glue-film formed on the top surface of the first interlayer insulating film 44 are removed by the CMP method, and they are left as first to ninth conductive plugs (45a to 45i) inside the first to ninth holes (44a to 44i).

Of these conductive plugs, the second to ninth conductive plugs (45b to 45i) are electrically connected with the source/drain regions (38a to 38h) via the cobalt-silicide layers (41a to 41h).

On the other hand, the first conductive plug 45a is electrically connected with the contact region CR of the first conductor 25b.

Further, as shown in the drawing, the second insulating film 26 constituting the insulator 29 is structured to be farther from the contact region CR than the third insulating film 28.

Next, description will be made for the process until the sectional structure shown in FIG. 4P will be obtained.

Firstly, after a low dielectric constant insulating film 46 of a coating type is formed on the entire surface, a silicon oxide film to prevent the low dielectric constant insulating film 46 from absorbing moisture is formed on it as a cover insulating film 47, and the low dielectric constant insulating film 46 and the cover insulating film 47 are made to be a second interlayer insulating film 48.

Subsequently, the second interlayer insulating film 48 is patterned by photolithography to form first to ninth wiring grooves (48a to 48i) on each plug (45a 59 45i). Note that, in the photolithography, mixed gas of $CHF_3$ and $O_2$ is used as the etching gas of plasma etching to the cover insulating film 47 made of silicon oxide, and $O_2$ is used as the etching gas of plasma etching to the low dielectric constant insulating film 46.

Then, a Cu (copper) film is formed as a seed layer on the entire surface by the sputtering method after depositing TaN layer, an electrolytic copper plated film is formed on the seed layer by supplying electric power to the seed layer, and each wiring groove (48a to 48i) is completely filled by the copper plated film. After that, excessive seed layer and copper plated film formed on the second interlayer insulating film 48 are removed by the CMP method, and they are left in each wiring groove (48a to 48i) as first to ninth copper wirings (49a to 49i).

Although the function of the first to ninth copper wirings (49a to 49i) is not particularly limited, the fourth and fifth copper wirings (49d, 49e) above the flash memory cell FL function as a bit line (BL) and a source line (SL) of an NOR type flash memory, for example. Furthermore, the control gate 30d functions as a word line (WL).

FIG. 5B is the plan view after the process has been finished, and the previous FIG. 4P corresponds to the sectional view taken along B-B line of FIG. 5B. It is to be noted that the first to ninth copper wirings (49a to 49i) and the second interlayer insulating film 28 in FIG. 5B are omitted to make the planar layout of each layer be easily read.

As shown in the drawing, the second conductor 30a is formed so as to extend from above the gate portion 25c of the first conductor 25a to the outside of the contact region CR of the pad portion 25b. Further, the second conductor 30a is surrounded by the insulating film and is in an electrically floating state.

The basic structure of the semiconductor device according to the present invention is thus completed.

The semiconductor device has a first portion L where the first insulating film 24, the first conductor 25a, the second insulating film 26, and the second conductor 30a are sequentially formed on the silicon substrate 20, as shown in FIG. 4O. Additionally, the semiconductor device has a second portion M where either the first conductor 25a and the second conductor 30a or the first conductor 25a and the second insulating film 26 are laminated, and a third portion N where neither the second insulating film 26 nor the second conductor 30a is laminated. Then, a laminated structure body 120 that integrally has the first to third portions (L to N) has been formed in the semiconductor device.

Further, the reference transistor $TR_{ref}$ is formed in this semiconductor device as shown in FIG. 4P, but the function of the reference transistor $TR_{ref}$ is not particularly limited. For example, the reference transistor $TR_{ref}$ is used to check the breakdown voltage of the tunnel insulating film 24b of the flash memory cell FL before it is shipped from a factory. To check this, the electric potential of the gate portion 25c is increased via the first conductive plug 45a in the state where predetermined voltage is applied to the first and second n-type source/drain regions (38a, 38b) via the second and third conductive plugs (45b, 45c). Then, since electric current is made to flow in the first conductive plug 45a when breakdown is caused in the gate insulating film 24a to allow electrons to enter the gate portion 25c, it is possible to check the breakdown voltage of the tunnel insulating film 24b, which has been formed in the same process as the gate insulating film 24a, of the flash memory cell FL by detecting the current.

Figure 6:
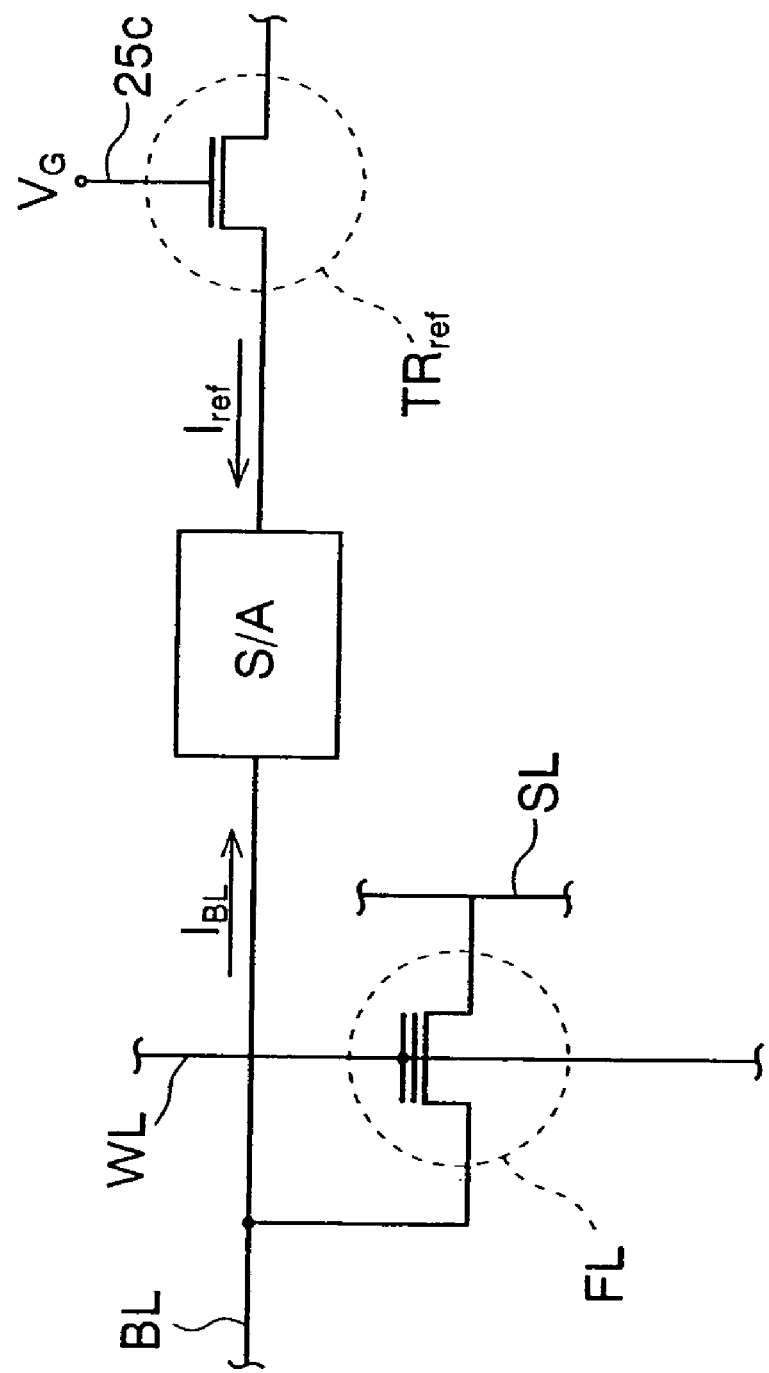
FIG. 6 is a view showing an example of an equivalent circuit of the semiconductor device according to the first embodiment of the present invention.

Alternatively, as shown in FIG. 6, the above-described reference transistor $TR_{ref}$ may be used in order to generate reference current $I_{ref}$ that is input to a sense amplifier S/A. In this case, voltage of about 2V is applied as gate voltage $V_g$ to the gate portion 25c of the reference transistor $TR_{ref}$ and voltage of about 0.5V is applied between source-drain. Thus, the reference current $I_{ref}$ is allowed to flow between the source-drain of the reference transistor $TR_{ref}$, and is input to the sense amplifier S/A. Then, the sense amplifier S/A compares the sizes of the reference current $I_{ref}$ and the readout current $I_{BL}$ of the flash memory cell FL, and it is determined which information of 1 and 0 is written in the flash memory cell FL.

Since the reference transistor $TR_{ref}$ has the same temperature characteristic as the flash memory cell FL, the size of the reference current $I_{ref}$ becomes small when ambient temperature is increased and the size of the readout current $I_{BL}$ becomes small, for example, so that a difference between the currents $I_{ref}$ and $I_{BL}$ is not affected by temperature. Therefore, it is difficult to cause error in the sense amplifier S/A in comparing the currents $I_{ref}$ and $I_B$ even if the ambient temperature is changed, and readout operation of the flash memory cell FL can be performed accurately.

According to this embodiment described above, the n-type impurity diffusion region 22a and the p-type impurity diffusion region 23a, which are used for adjusting threshold value, are formed in the second peripheral circuit region III by ion implantation while the first insulating film 24 and the second insulating film 26 made up of the ONO film are used as a through-film, as shown in FIG. 4B. Then, as shown in FIG. 4C, the first and second insulating films (24, 26), which completed their function as the through-film after the ion implantation, are removed on the second peripheral circuit region III, and the second insulating film 26 on the contact region CR of the first peripheral circuit region I is also removed simultaneously. Accordingly, this embodiment does not need an additional mask process for removing the second insulating film 26 on the contact region CR, and it is made possible to selectively remove the second insulating film 26 on the contact region CR while suppressing the increase of the number of processes.

In addition, in the etching process of FIG. 4C, only the second insulating film 26 is removed in the first peripheral circuit region I whereas the two layers of the first and second insulating films (24, 26) are removed in the second peripheral circuit region III, so that the etching amount in the second peripheral circuit region III becomes larger than that in the first peripheral circuit region I. For this reason, by setting the etching amount in this process to that in the second peripheral circuit region III, it is possible to prevent excessive etching of the first and second insulating films (24, 26) in the second peripheral circuit region III while the second insulating film 26 in the first peripheral circuit region I is completely removed. Therefore, since the etching of the device isolation insulating film 21 such as the first to third examples explained in the preliminary explanation of the present invention does not occur in the second peripheral circuit region III, short circuit between the conductive plugs (45f to 45i) and the silicon substrate 20 due to the etching of the device isolation insulating film 21 can be prevented, which reduces the number of defective semiconductor devices and improves productivity.

(3) Second Embodiment

Although the transistor having the first conductor 25a as a gate was formed in the first embodiment, it is also possible to form a capacitor having the first conductor 25a and the second conductor 30 as an electrode. In this embodiment, the above-described first conductor is used in a pumping capacitor to generate high voltage for controlling a flash memory cell.

Figures 7E, 7F:
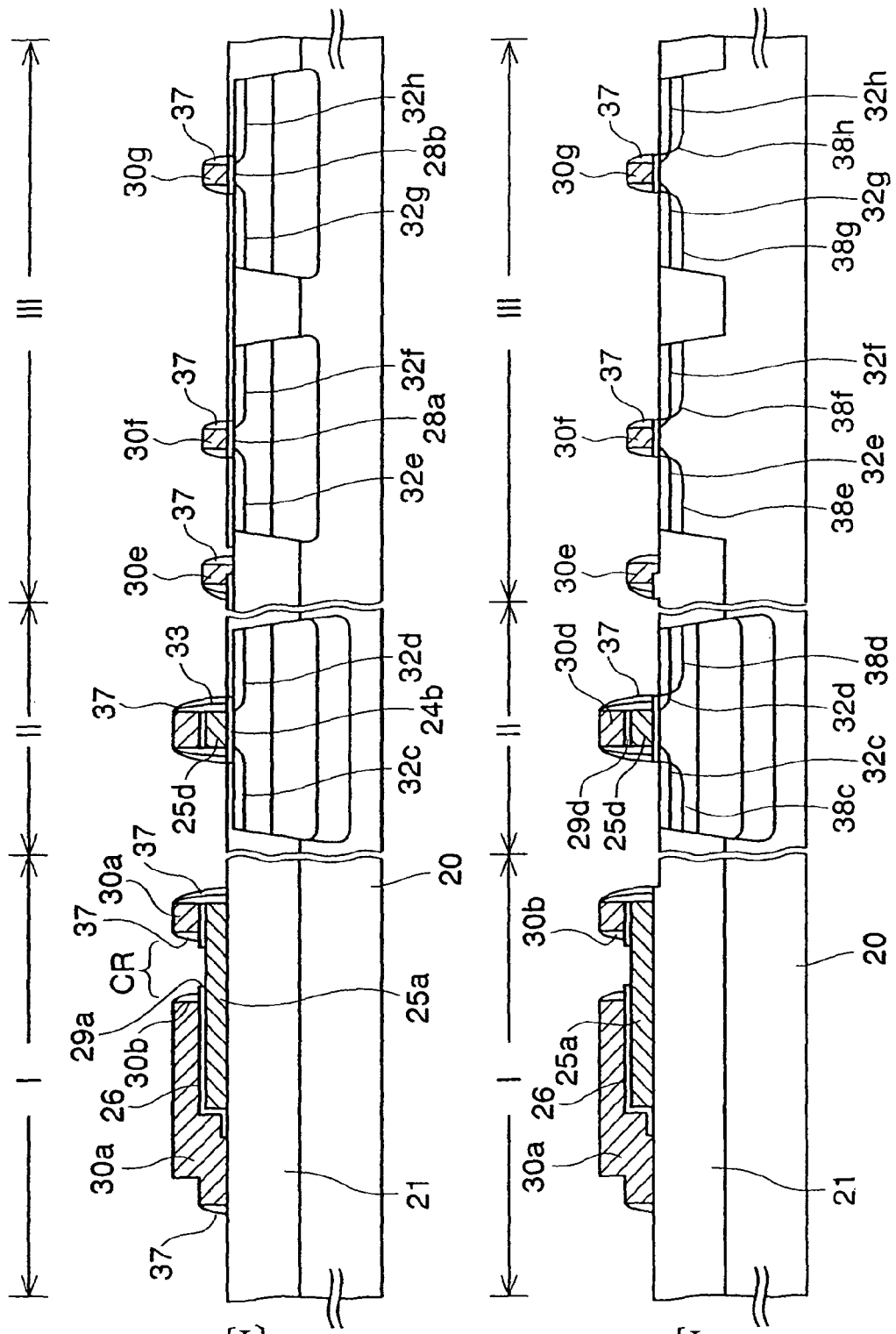
Figure 7G:
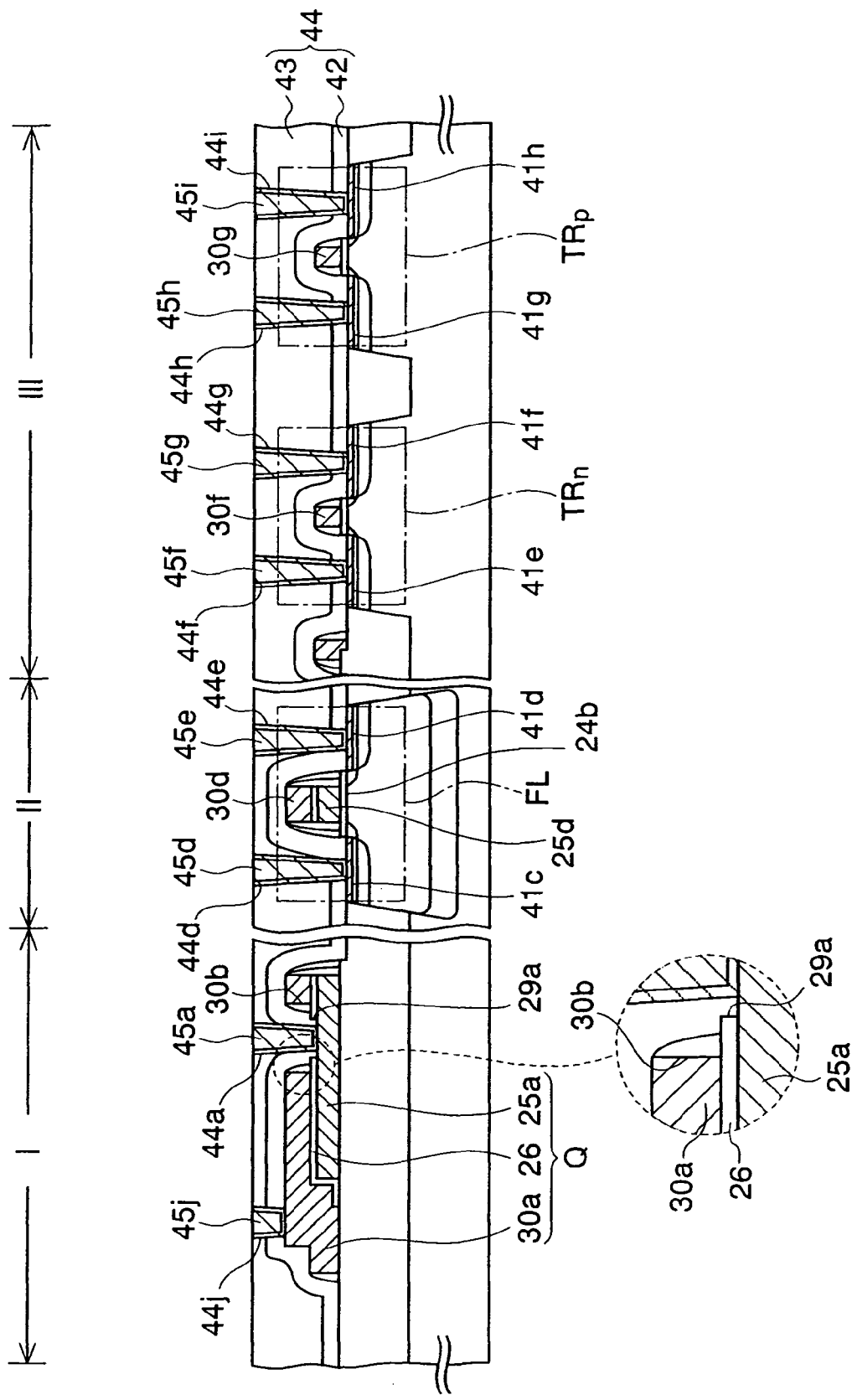
Figure 8B:
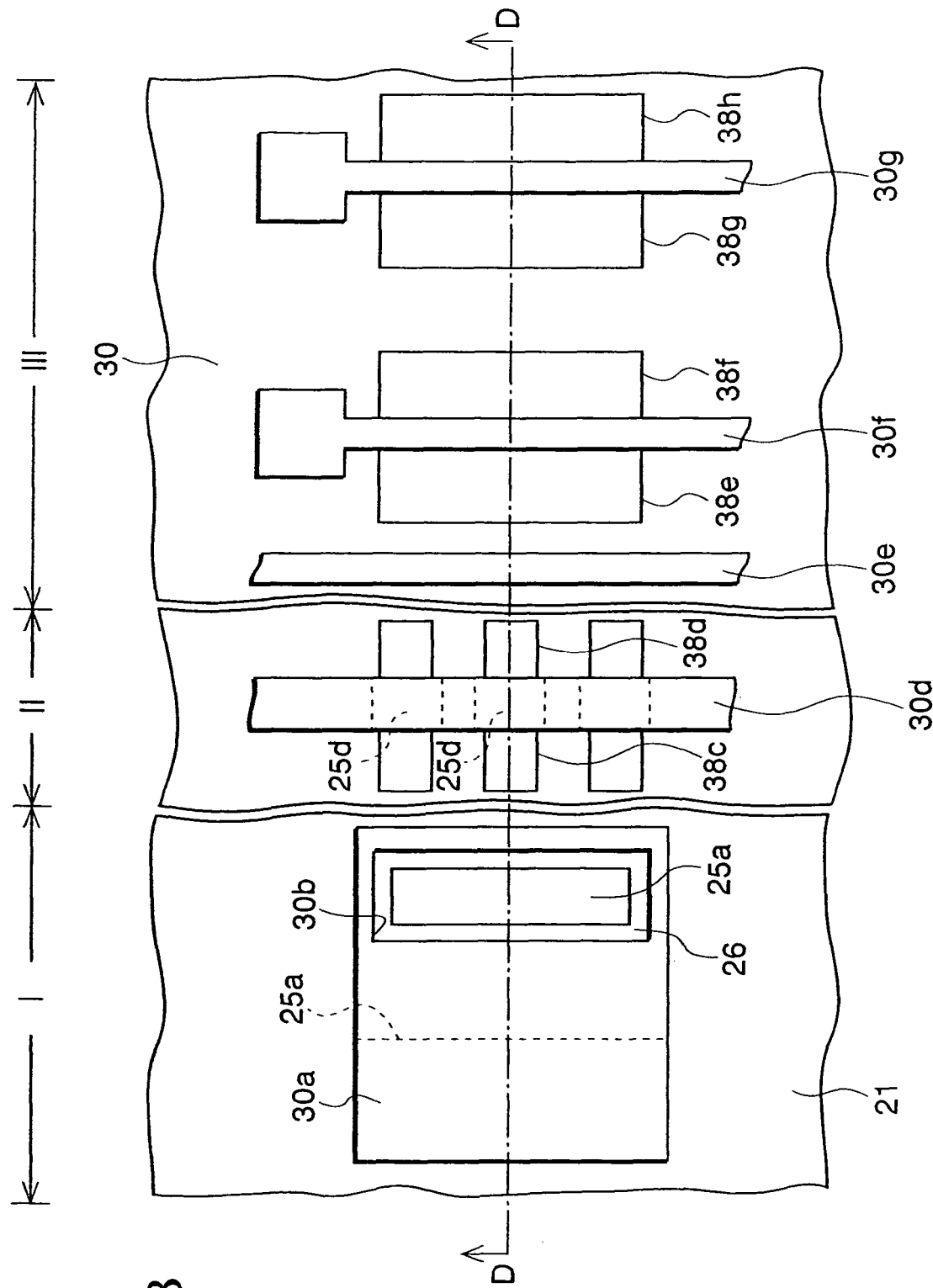
Figure 8C:
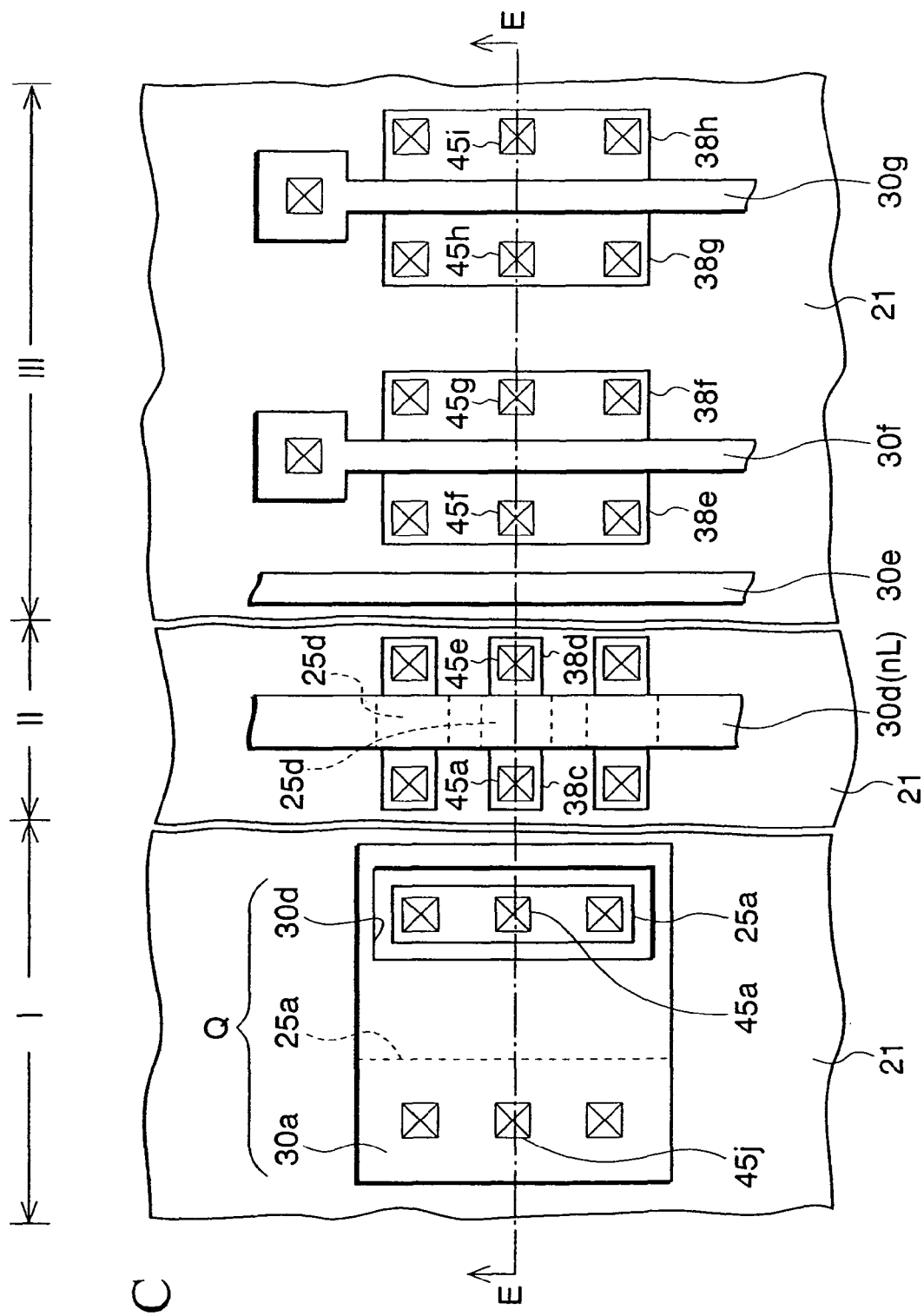

FIGS. 7A to 7G are the in-process sectional view of the semiconductor device according to the second embodiment of the present invention, and FIGS. 8A to 8C are the plan views thereof. In these drawings, reference numerals same as those of the first embodiment are attached to elements explained in the first embodiment, and their explanation will be omitted in the following.

First of all, description will be made for the process until the sectional structure shown in FIG. 7A will be obtained.

Firstly, as described in FIG. 4E of the first embodiment, the first and second conductive films (25, 30) and the insulator 29 are patterned by using the second resist pattern 18 as an etching mask. However, the gate portion 25b as shown in the first embodiment is not formed in the first conductor 25a, which was formed by the patterning, on the first peripheral circuit region I, as shown in FIG. 7A.

FIG. 8A is the plan view at the point when the patterning completed, and the above FIG. 7A corresponds to the sectional view taken along C-C line of FIG. 8A. As shown in the drawing, the first conductor 25a is patterned into a rectangular shape of a capacitor lower electrode.

Next, As is ion-implanted into the silicon substrate 20 through the third window 31a of the third resist pattern 31 as shown in FIG. 7B under the conditions of the accelerating energy of 50 KeV and the dose of $6\times10^{14}$ cm$^{-3}$, second and third n-type source/drain extensions (32c, 32d) are formed in the silicon substrate 20 beside the floating gate 25d. The third resist pattern 31 is removed after that.

Subsequently, as shown in FIG. 7C, after forming the silicon nitride film on the entire surface, it is etched back and left as the first insulative sidewalls 33 on the side surfaces of the first insulator 30 and the floating gate 25d.

Next, as shown in FIG. 7D, the fourth resist pattern 34 is formed on each region (I to III) and plasma etching is performed to the second conductor 30a and the second conductive film 30 by using the fourth resist pattern 34 as a mask. Thus, the first opening 30b is formed in the second conductor 30a on the contact region CR, and the second conductor 30a is patterned into the rectangular shape of a capacitor upper electrode. The second conductive film 30 is patterned to form the first and second gate electrodes (30f, 30g) and the wiring 30e in the second peripheral circuit region III.

The fourth resist pattern 34 is removed after this.

FIG. 8B is the plan view at the point when this process is ended, and the above FIG. 7D corresponds to the sectional view taken along D-D line of FIG. 8B.

Next, description will be made for the process until the sectional structure shown in FIG. 7E will be obtained.

Firstly, by performing the processes described in FIGS. 4I and 4J of the first embodiment, the first and second n-type source/drain extensions (32e, 32f) and the first and second p-type source/drain extensions (32g, 32h) are formed in the silicon substrate 20 beside the first and second gate electrodes (30f, 30g). Then, after forming the silicon oxide film on the entire surface by the CVD method, the silicon oxide film is etched back to form the second insulative sidewalls 37 on the side surfaces of the second conductor 30a, the control gate 30d, the wiring 30e, and the first and second gate electrodes (30f, 30g).

By conducting small amount of over-etching after the etch-back, the third insulating film 28 made of silicon oxide under the first opening is removed to form the second opening 29a, and the contact region CR is exposed from the second opening 29a. Note that the etchback is performed to the extent where the second insulating film 26 constituted by the ONO film is left, so that a problem of significant reduction of the device isolation insulating film 21 in the peripheral circuit regions does not occur.

Furthermore, as a result of the etchback, the first insulating film 24 under the floating gate 25d is patterned into the tunnel insulating film 24b, and the third insulating film 28 under the first and second gate electrodes (30f, 30g) are patterned into the gate insulating films (28a, 28).

Thereafter, by performing the ion implantation process of FIGS. 4L and 4M described in the first embodiment, the third to sixth n-type source/drain regions (38c to 38f) and the first and second p-type source/drain regions (38g, 38h) are formed in the silicon substrate 20 beside the floating gate 25d and the first and second gate electrodes (30f, 30g).

Figure 4N:
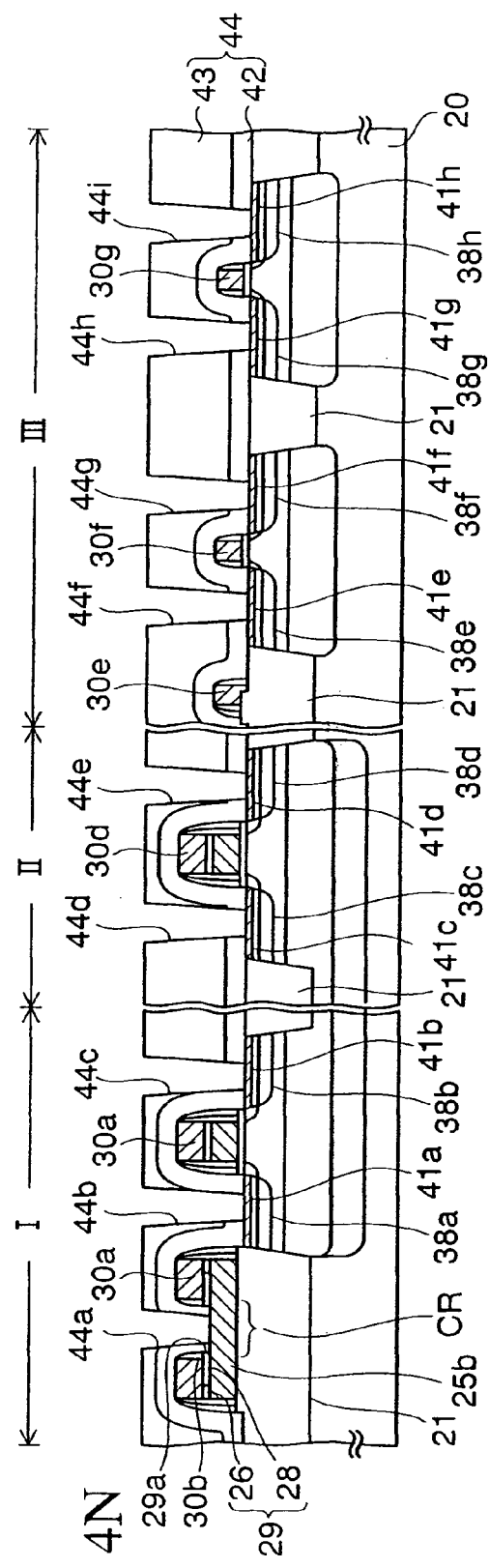

Next, by performing the process of FIGS. 4N and 4O described in the first embodiment, the basic structures of the flash memory cell FL, the n-type MOS transistor TR$_n$, and the p-type MOS transistor TR$_p$ as in the sectional view of FIG. 7G are completed. Then, as shown in FIG. 7G, a tenth hole 44j having the depth reaching the second conductor 30a is formed, and a tenth conductive plug 45j electrically connected with the second conductor 30a is formed in the hole.

FIG. 8C is the plan view at the point when this process is ended, and the above FIG. 7F corresponds to the sectional view taken along E-E line of FIG. 8C.

After this, by performing the same process described in FIG. 4P of the first embodiment, the second interlayer insulating layer and the copper wiring are formed to complete the basic structure of the semiconductor device according to this embodiment.

In the semiconductor device, as shown in FIG. 7G, the insulating film 26 that constitutes the insulator 29 between the first and second conductors (25a, 30a) functions as a capacitor dielectric film, and the first and second conductors (25a, 30a) and the insulating film 26 constitute a capacitor Q.

Although the function of the capacitor Q is not particularly limited, it is preferable to use the capacitor Q as a pumping capacitor in a voltage boost circuit that boosts the power source voltage of 1.2V to generate high voltage of 10V. The high voltage obtained in this manner is applied to the control gate 30d when writing or erasing is performed to the flash memory cell FL, by which electrons are injected or drawn out to/from the floating gate 25d via the tunnel insulating film 24b.

Further, since the diameter of the second opening 29a was set smaller than that of the first opening 30b in the capacitor Q, the second insulating film 26 is structured so as to expand between the side surface of the first opening 30b and the first conductor 25a as shown in the dotted line circle. According to such structure, the second insulating film 26 always exists between the first conductor 25a and the second conductor 30a, so that the breakdown voltage of the capacitor Q is not deteriorated via the second insulating film 26.

According to this embodiment described above, as explained referring to FIGS. 4B and 4C in the first embodiment, the second insulating film 26 made of the ONO film on the contact region CR of the first peripheral circuit region I is removed simultaneously with the removal of the first and second insulating films (24, 26) that were used as the through-film when forming the impurity regions (22a, 23b) for adjusting threshold value of transistor by ion implantation. Consequently, it becomes possible to selectively remove the second insulating film on the contact region CR without adding the mask process, and the etching of the device isolation insulating film 21 such as the first to third examples explained in the preliminary explanation of the present invention does not occur.

(4) Third Embodiment

In this embodiment, the first conductor 25a described in the first embodiment is used as a resistor element.

FIGS. 9A to 9I are the in-process sectional views of the semiconductor device according to the third embodiment of the present invention, and FIG. 31 is the plan view thereof. In these drawings, reference numerals same as those of the first embodiment are attached to elements explained in the first embodiment, and their explanation will be omitted in the following.

First of all, description will be made for the process until the sectional structure shown in FIG. 9A will be obtained.

Firstly, after performing the process of FIG. 4B of the first embodiment, the first resist pattern 27 including the first windows 27a on the two contact regions CR of the first conductive film 25 is formed on the second insulating film 26. Then, the second insulating film 26 on the contact regions CR is removed and the first and second insulating films (24, 26) on the second peripheral circuit region III are removed by photolithography by using the first resist pattern 27 as a mask. After that, the first resist pattern 27 is removed.

Next, as shown in FIG. 9B, the oxidation conditions same as the first embodiment is employed and silicon that is not covered by the second insulating film 26 is thermally oxidized, and a thermal oxide film formed by the oxidation is used as the third insulating film 28. Then, a polysilicon film as the second conductive film 30 is formed on the insulator 29 that is made up of the third insulating film 28 and the second insulating film 26.

Subsequently, as shown in FIG. 9C, the first and second conductive films (25, 30) and the insulator 29 are patterned by photolithography, and the first and second conductive films (25, 30), which are left without being etched in the first peripheral circuit region I, are made into the first and second conductor (25a, 30a), and the first and second conductive films (25, 30) and the insulator in the cell region II are made into the floating gate 25d, the control gate 30d, and the intermediate insulating film 29d, respectively.

Next, as shown in FIG. 9D, n-type impurity is ion-implanted to the silicon substrate 20 through the third window 31a of the third resist pattern 31, and the second and third n-type source/drain extensions (32c, 32d) are formed on the silicon substrate 20 beside the floating gate 25d.

The third resist pattern 31 is removed after that.

Next, as shown in FIG. 9E, after the silicon nitride film is formed on the entire surface, it is etched back to leave it as the first insulative sidewalls 33 on the side surfaces of the second conductor 30a and the floating gate 25d.

Subsequently, as shown in FIG. 9F, the second conductor 30a and the second conductive film 30 are etched while the fourth resist pattern 34, which includes two of the fourth windows 34a corresponding to the two contact regions CR of the first conductor 25a, is used as an etching mask. Consequently, the second conductive film 30 is patterned and the first opening 30b is formed on the contact region CR, and the second conductive film 30 on the second peripheral circuit region III is patterned and the first and second gate electrodes (30f, 30g) are formed. Further, the second conductive film 30 that has been extended over the device isolation insulating film 21 is also patterned into the wiring 30e.

After that, the fourth resist pattern 34 used in patterning is removed.

Next, as shown in FIG. 9G, the fifth and sixth n-type source/drain extensions (32e, 32f) and the first and second p-type source/drain extensions (32g, 32h) are formed in the silicon substrate 20 beside the first and gate electrodes (30f, 30g).

Then, after the silicon oxide film is formed on the entire surface by the CVD method, the silicon oxide film is etched back to form the second insulative sidewalls 37 on the side surfaces of the second conductor 30a, the control gate 30d, the wiring 30e, and the first and second gate electrodes (30f, 30g).

Furthermore, as a result of the etchback, the first insulating film 24 under the floating gate 25d is patterned into the tunnel insulating film 24b, and the third insulating film 28 under the first and second gate electrodes (30f, 30g) is patterned into the gate insulating films (28a, 28b). Still further, the third insulating film 28 on the contact region CR of the first conductor 25a is removed and the second opening 29a smaller than the first opening 30b is formed, and the contact region CR is exposed on the second opening 29a.

Subsequently, as shown in FIG. 9H, the third to sixth n-type source/drain extensions (32c to 32f) and the first and second p-type source/drain extensions (32g, 32h) are formed in the silicon substrate 20 beside the floating gate 25d, the first and gate electrodes (30f, 30g).

Figure 9I:
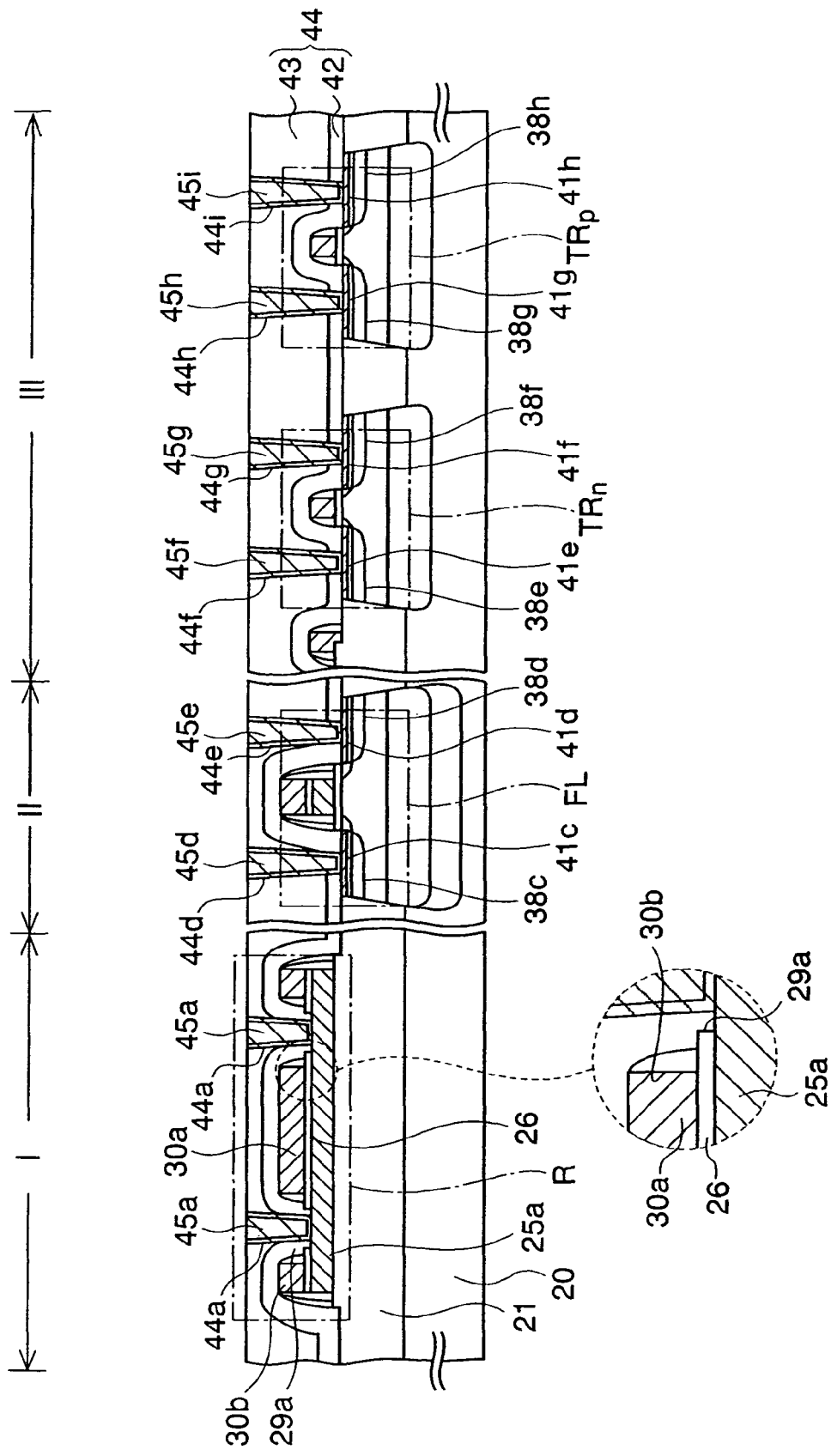

Next, by performing the processes of FIGS. 4H to 4O described in the first embodiment, the first, fourth to ninth holes (44a, 44d to 44i) are formed in the first interlayer insulating film 44 as shown in FIG. 9I, and then, the first, fourth to ninth conductive plugs (45a, 45d to 45i) are formed in the holes.

With the foregoing processes, the basic structure of the flash memory cell FL, n-type MOS transistor $TR_n$, and the p-type MOS transistor $TR_p$ have been completed.

Figure 10:
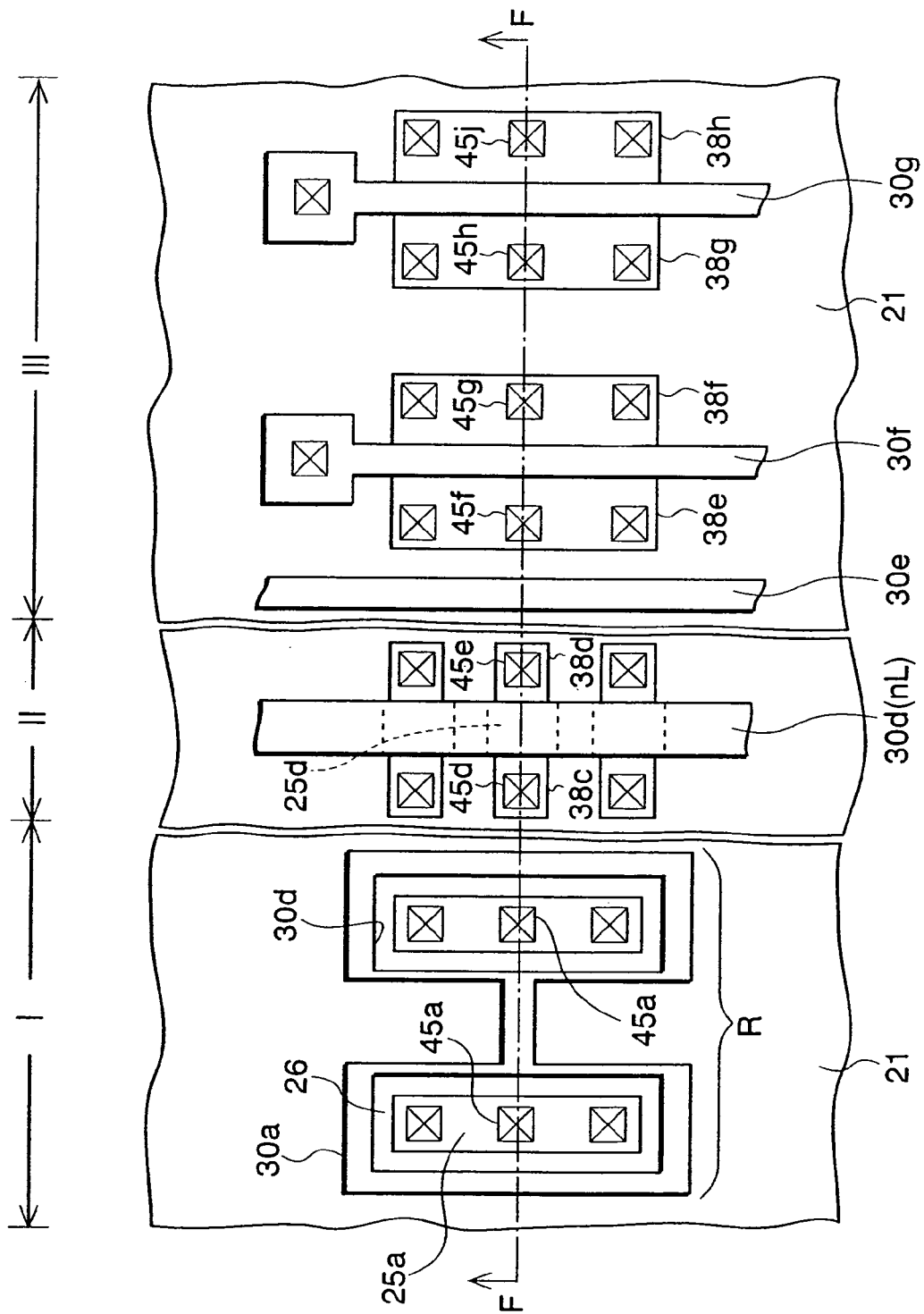
FIG. 10 is an in-process plan view of the semiconductor device according to the third embodiment of the present invention.

FIG. 10 is the plan view at the point when the processes have completed, and the above FIG. 9I corresponds to the sectional view taken along F-F line of FIG. 10.

After this, the second interlayer insulating layer and the copper wiring are formed by performing the process same as the one described in FIG. 4P of the first embodiment to complete the basic structure of the semiconductor device according to this embodiment.

In the semiconductor device, as shown in FIG. 9I, two of the first holes 44a are formed on the first conductor 25a at an interval, and the first conductive plugs 45a are formed in each of the first holes 44a. Then, a resistor element R having the two of the first conductive plugs 45a as a terminal and the first conductor 25a as a resistor is formed as shown in the drawing.

The function of the resistor element R is not particularly limited, and may be any resistor required in a logic circuit.

Meanwhile, the second conductor 30a on the second insulating film 26 is in an electrically floating state, and is not electrically connected with the above-described resistive element R. However, if the second conductor has short circuit with the first conductor 25a near the first opening 30b, there is a fear that electric current that should flow in the first conductor 25a flows into the second conductor 30a to lower the resistance of the resistive element R higher than a designed value.

In view of such point, the diameter of the second opening 29a is formed smaller than that of the first opening 30b. According to this, the second insulating film 26 is structured so as to expand between the side surface of the first opening 30b and the first conductor 25a as shown in the dotted line circle, so that the short circuit does not occur between the first conductor 25a and the second conductor 30a similar to the second embodiment. As the result, variation of the resistance of the resistive element R associated with the short circuit between the first and second conductors (25a, 30a) can be controlled, and thus the resistance can be attained as designed.

Furthermore, in this embodiment described above, the second insulating film 26 made of the ONO film on the contact region CR of the first peripheral circuit region I is removed simultaneously with the removal of the first and second insulating films (24, 26) that was used as the through-film when forming the impurity regions (22a, 23b) for adjusting threshold value of transistor by ion implantation, as described referring to FIGS. 4B to 4C in the first embodiment. For this reason, it is possible to selectively remove the second insulating film on the contact region CR without increasing the number of processes.

Still further, similar to the first embodiment, the etching amount of the second peripheral circuit region III is larger than that in the first peripheral circuit region I in the process of removing the first and second insulating films (24, 26). Therefore, by setting the etching amount in this process to that in the second peripheral circuit region III, it is possible to prevent the etching amount in the second peripheral circuit region III from becoming excessive while the second insulating film 26 on the contact region CR is completely removed, and thus the device isolation insulating film 21 of the second peripheral circuit region III can be prevented from being etched.

(5) Fourth Embodiment

In the first embodiment, the second conductor 30a was left in the first peripheral circuit region I, but it is removed halfway during the process in this embodiment.

FIGS. 11A to 11M are the in-process sectional view of the semiconductor device according to the fourth embodiment of the present invention. In these drawings, reference numerals same as those of the first embodiment are attached to elements explained in the first embodiment, and their explanation will be omitted in the following.

Firstly, by performing the process of FIG. 4C described in the first embodiment, the second insulating film 26 is patterned as shown in FIG. 11A. However, although the second insulating film 26 after patterning was left in the first peripheral circuit region I other than the contact region CR as well in the first embodiment, the second insulating film 26 is left by patterning only in the cell region II in this embodiment.

Subsequently, as shown in FIG. 11B, the oxidation conditions same as the first embodiment are employed and the first conductive film 25 made of polysilicon on the first peripheral circuit region I and the silicon substrate 20 on the second peripheral circuit region III are thermally oxidized. Then, a thermal oxide film formed by the oxidation is used as the third insulating film 28, and the third insulating film 28 and the second insulating film 26 are made to be the insulator 29.

Then, by performing the same process as FIG. 4E of the first embodiment, the first conductive film 25, the insulator 29, and the second conductive film 30 are patterned as shown in FIG. 11C. As a result, a laminated body of the first conductor 25a, the third insulating film 28 constituting the insulator 29, and the second conductor 30a is formed in the first peripheral circuit region I. Then, a laminated body of the floating gate 25d that will constitute the flash memory cell later, the intermediate insulating film 29d, and the control gate 30d is formed in the cell region II.

Next, as shown in FIG. 11D, n-type impurity is ion-implanted into the silicon substrate 20 through the third window 31a of the third resist pattern 31 in the same manner as FIG. 4F of the first embodiment. With the ion implantation, the first to fourth n-type source/drain extensions (32a to 32d) are formed in the silicon substrate 20 beside the floating gate 25d and the gate portion 25c. After that, the third resist pattern is removed.

Subsequently, as shown in FIG. 1E, after the silicon nitride film is formed on the entire surface, the silicon nitride film is etched back to leave it as the first insulative sidewalls 33 on the side surfaces of the second conductor 30a and the floating gate 25d.

Next, description will be made for the process until the sectional structure shown in FIG. 11F will be obtained.

Firstly, the fourth resist pattern 34 is formed on each region (I to III). The fourth resist pattern 34 covers the cell region II and has a gate electrode shape on the second peripheral circuit region III. The first peripheral circuit region I is not covered by the fourth resist pattern 34 but exposed.

Then, the mixed gas of $Cl_2$ and $O_2$ is employed as etching gas and plasma etching is performed to the second conductor 30a of the first peripheral circuit region I and the second conductive film 30 of the second peripheral circuit region II while the fourth resist pattern 34 is used as a mask. As a result, all of the second conductor 30a is removed to expose the third insulating film 28 and the first insulative sidewalls 33 protrude from the top surface of the third insulating film 28 in the first peripheral circuit region I, and a structure where the side surfaces 33a of the sidewalls are exposed is obtained. Then, the second conductive film 30 is patterned into first and second gate electrodes (30f, 30g).

The fourth resist pattern 34 is removed after this.

Figure 11G:
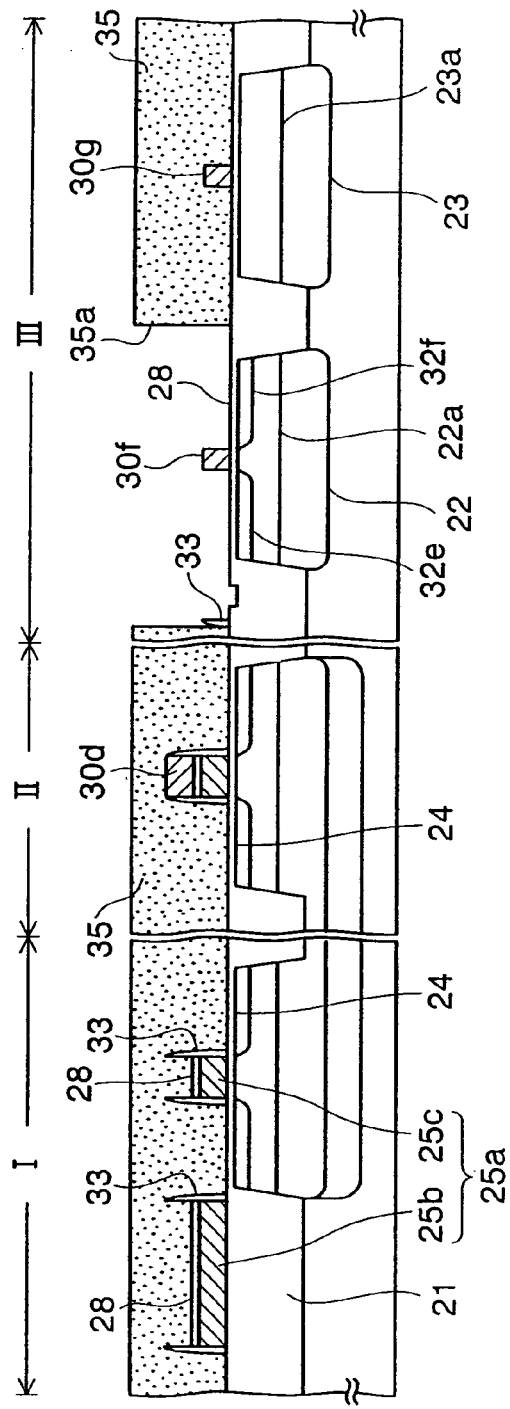

Subsequently, as shown in FIG. 11G, n-type impurity is ion-implanted into the silicon substrate 20 through the fifth window 35a of the fifth resist pattern 35 to form the fifth and sixth n-type source/drain extensions (32e, 32f) in the silicon substrate 20 beside the first gate electrode 30f. After that, the fifth resist pattern 35 is removed.

Figure 11H:
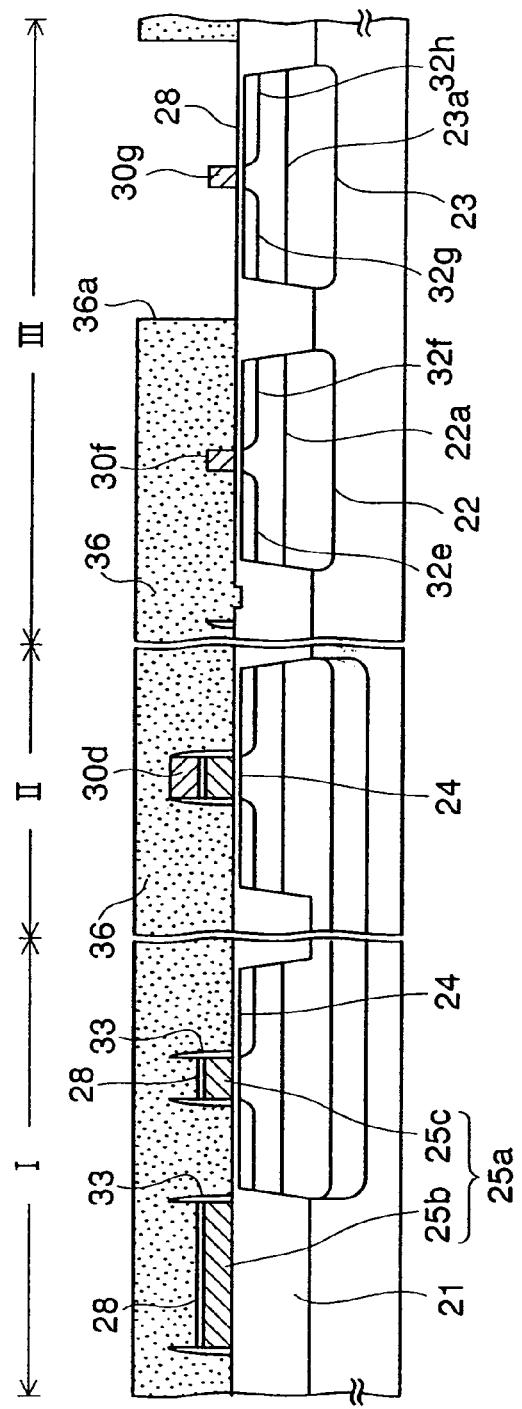

Next, as shown in FIG. 11H, p-type impurity is ion-implanted into the silicon substrate 20 through the sixth window 36a of the sixth resist pattern 36 to form the first and second p-type source/drain extensions (32g, 32h) in the silicon substrate 20 beside the second gate electrode 30g. After that, the sixth resist pattern 36 is removed.

Figure 11I:
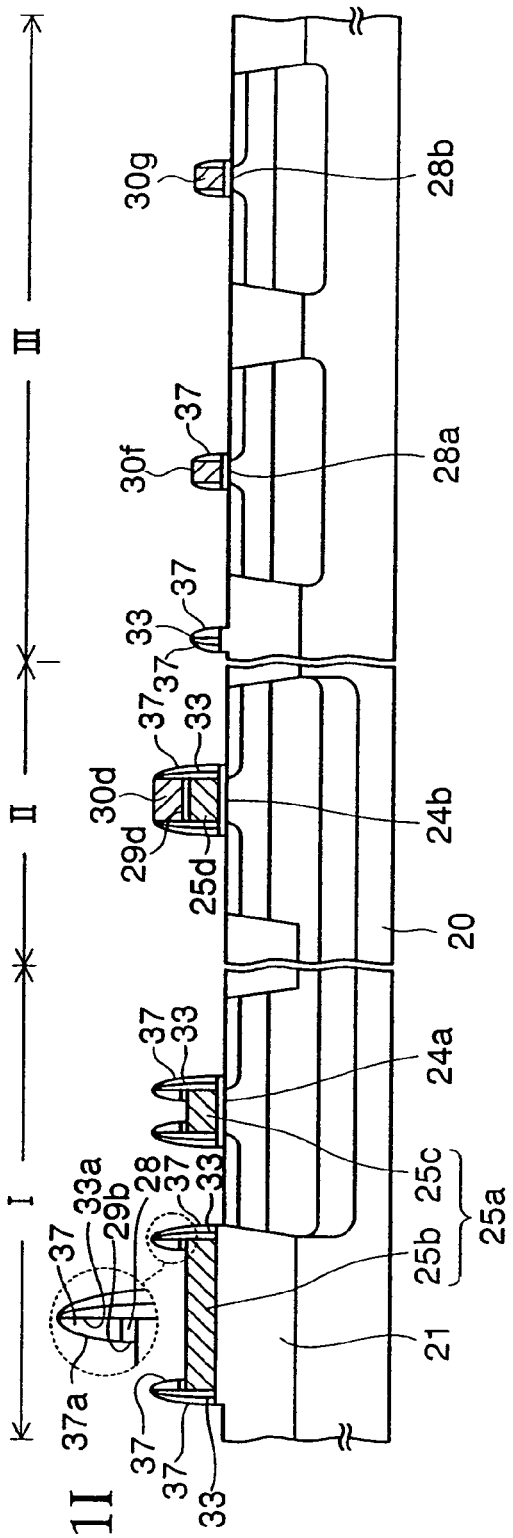

Next, description will be made for the process until the sectional structure shown in FIG. 11I will be obtained.

Firstly, after the silicon oxide film is formed on the entire surface by the CVD method, the silicon oxide film is etched back to form second insulative sidewalls 37 on the side surfaces 33a of the first insulative sidewalls 33, which have been exposed after the second conductor 30a was removed (refer to FIG. 11E), and on the third insulating film 28. The second insulative sidewalls 37 are also formed on the control gate 30d, and the first and second gate electrodes (30f, 30g).

Further, by continuing the etchback, the third insulating film 28 that constitutes the insulator 29 on the pad portion 25b is etched by using the second insulative sidewalls 37 as a mask. Thus, the third insulating film 28 of the pad portion 25b is patterned to form a third opening 29b, and a structure is obtained where a curved surface 37a of the second insulative sidewall 37 is in a continuous shape with the side surface of the third opening 29b, as shown in the dotted line circle.

Further, the first insulating film 24 is patterned by this etch back while the second insulative sidewalls 37 function as a mask, and the first insulating film 24 is left as the gate insulating film 24a and the tunnel insulating film 24b under the gate portion 25c and the floating gate 25d, respectively.

Furthermore, the third insulating film 28 is patterned in the second peripheral circuit region III, and it is left as the gate insulating films (28a, 28b) under the first and second gates (30f, 30g).

Figure 11J:
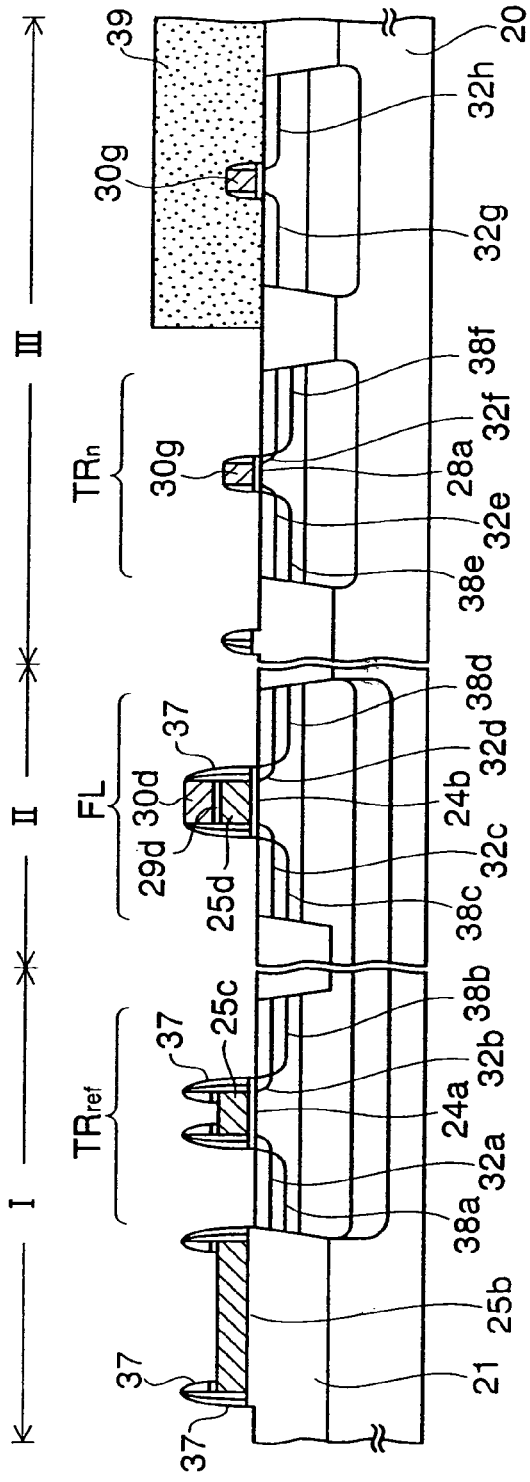
Figure 11M:
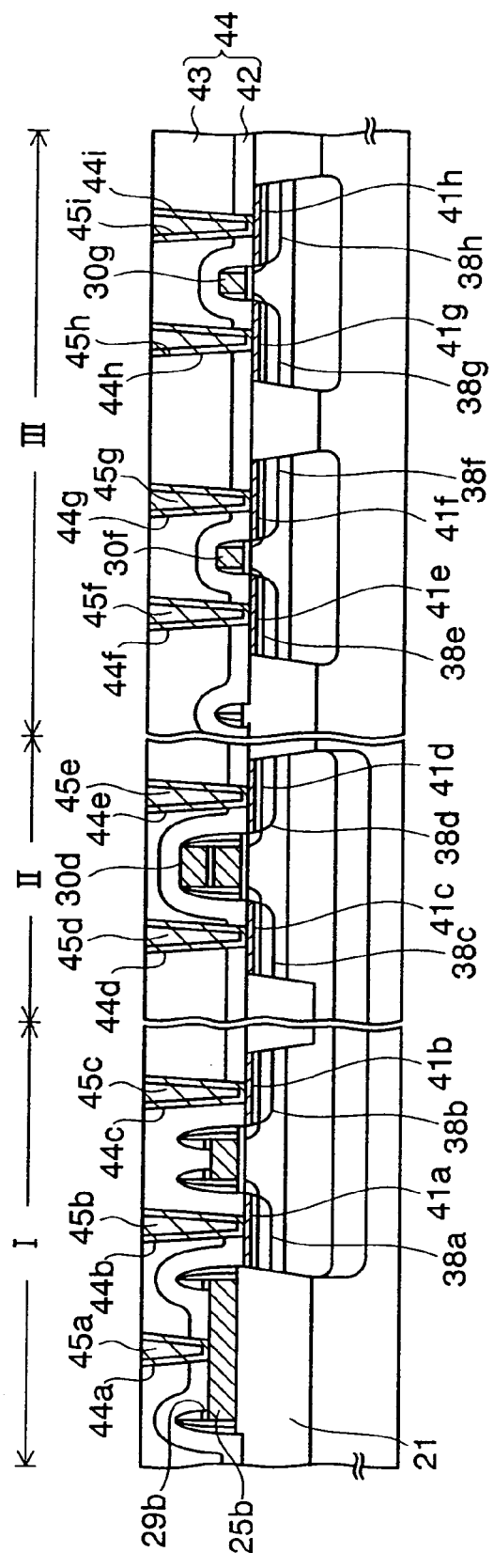

Subsequently, similar to the process of FIG. 4L described in the first embodiment, the first to sixth n-type source/drain extensions (38a to 38f) are formed in the silicon substrate 20 beside the gate portion 25c, the floating gate 25d, and the first gate electrode 30f by the ion implantation using the seventh resist pattern 39 as a mask, as shown in FIG. 11J. After that, the seventh resist pattern 39 is removed.

With the foregoing processes, the basic structures of the reference transistor $TR_{ref}$, the flash memory cell FL, and the n-type MOS transistor $TR_n$ have been completed.

Next, similar to the process of FIG. 4M described in the first embodiment, the first and second p-type source/drain regions (38g, 38h) are formed in the silicon substrate 20 beside the second gate electrode 30g by the ion implantation using the eighth resist pattern 40 as a mask, as shown in FIG. 11K. After the ion implantation is ended, the eighth resist pattern 40 is removed. Then, with this process, the p-type MOS transistor $TR_p$ described in the first embodiment is completed in the second peripheral circuit region III.

Subsequently, by performing the process of FIG. 4N of the first embodiment, the first to eighth-silicide layers (41a to 41h) are formed on the surface layer of each of the source/drain regions (38a to 38h), and the first interlayer insulating film 44 on them is patterned to form first to ninth holes (44a to 44i).

Subsequently, by performing the process of FIG. 4O of the first embodiment, the first to ninth conductive plugs (45a to 45i) that are electrically connected with each of the source/drain regions (38a to 38h) are formed in the first to ninth holes (44a to 44i).

The forming processes of the second interlayer insulating film and the copper wiring is performed after this, but its explanation will be omitted because the processes are the same as the first embodiment.

According to this embodiment described above, the second insulating film 26 on the contact region CR can be removed without adding an excessive mask process in the process shown in FIG. 11A due to reasons described in the first to third embodiments, and it is possible to prevent the device isolation insulating film 21 from being etched when removing the second insulating film 26.

Further, in the process shown in FIG. 11F, the fourth resist pattern 34 was formed not covering the first peripheral circuit region I, and the second conductor 30a on the first peripheral circuit region I was etched and removed. According to this method, the fourth window 34a is not formed in the fourth resist pattern 34 as in FIG. 4H of the first embodiment, so that there is no need to consider alignment between the fourth window 34a and the second conductor 30a and the alignment accuracy of the fourth resist pattern 34 can be loosened. Moreover, since it is possible to simplify the shape of the fourth resist pattern 34 by an amount of the fourth window 34a that is not formed, exposure data required for forming the fourth resist pattern 34 becomes smaller than for the first embodiment, and labor for creating the exposure data can be reduced.

(6) Fifth Embodiment

FIGS. 12A to 12C are the in-process sectional views of the semiconductor device according to the fifth embodiment of the present invention. In these drawings, reference numerals same as those of the first embodiment are attached to elements explained in the first embodiment, and their explanation will be omitted in the following.

First of all, description will be made for the process until the sectional structure shown in FIG. 12A will be obtained.

Firstly, by performing the process of FIG. 4C of the first embodiment, a polysilicon film having the thickness of about 180 nm is formed as the second conductive film 30 on the second and third insulating films (26, 28) as shown in FIG. 12A.

After that, a silicon nitride film having the thickness of 70 nm or more is formed as an anti-reflection film 50 that prevents reflection of exposure light during patterning the first and second conductive films (25, 30).

Next, as shown in FIG. 12B, the second resist pattern 18 is formed on the anti-reflection film 50, and the anti-reflection film 50, the first and second conductive films (25, 30) and the insulator 29 are etched by using the second resist pattern 18 as a mask. Mixed gas of $Cl_2$ and $O_2$ is used as etching gas for the first and second conductive films (25, 30) made of polysilicon in the etching. Further, mixed gas of $CH_3$ and $O_2$ is used as etching gas for the anti-reflection film 50 made of the silicon nitride film and the second insulating film 26 made of the ONO film.

As a result of the etching, the first and second conductive films (25, 30) on the first peripheral circuit region I are made into the first and second conductors (25a, 30a), and the first and second conductive films (25, 30) and the insulator 29 on the cell region II are made into the floating gate 25d, the control gate 30d, and the intermediate insulating film 29d, respectively.

The second resist pattern 18 is removed after this.

Subsequently, as shown in FIG. 12C, As of n-type impurity is ion-implanted into the silicon substrate 20 under the conditions of the accelerating energy of 50 KeV and the dose of $6 \times 10^{15}$ $cm^{-3}$, while the thick anti-reflection film 50 having the thickness of 70 nm or more is used as a mask and ion is prevented from being implanted into the control gate 30d and the second conductive film 30 of the second peripheral circuit region III by the anti-reflection film 50. Thus, the first to fourth n-type source/drain extensions (32a to 32d) are formed in the silicon substrate 20 beside the floating gate 25d and the gate portion 25c.

After this, by performing the same processes of FIG. 4G to 4P described in the first embodiment, the basic structure of the semiconductor device according to the present invention is completed.

In this embodiment described above, as shown in FIG. 12A, the anti-reflection film 50 on the control gate 30d has the thickness of equal to or more than 70 nm, so that the anti-reflection film 50 can block ion when the first to fourth n-type source/drain extensions (32a to 32d) are formed by ion implantation. Therefore, the third resist pattern 31 (see FIG. 4F), which was formed in the first embodiment in order to prevent n-type impurity from being implanted into the second conductive film 30 during ion implantation, is not necessary, and it is possible to simplify processes by the amount of the forming process of the third resist pattern.

Figure 13:
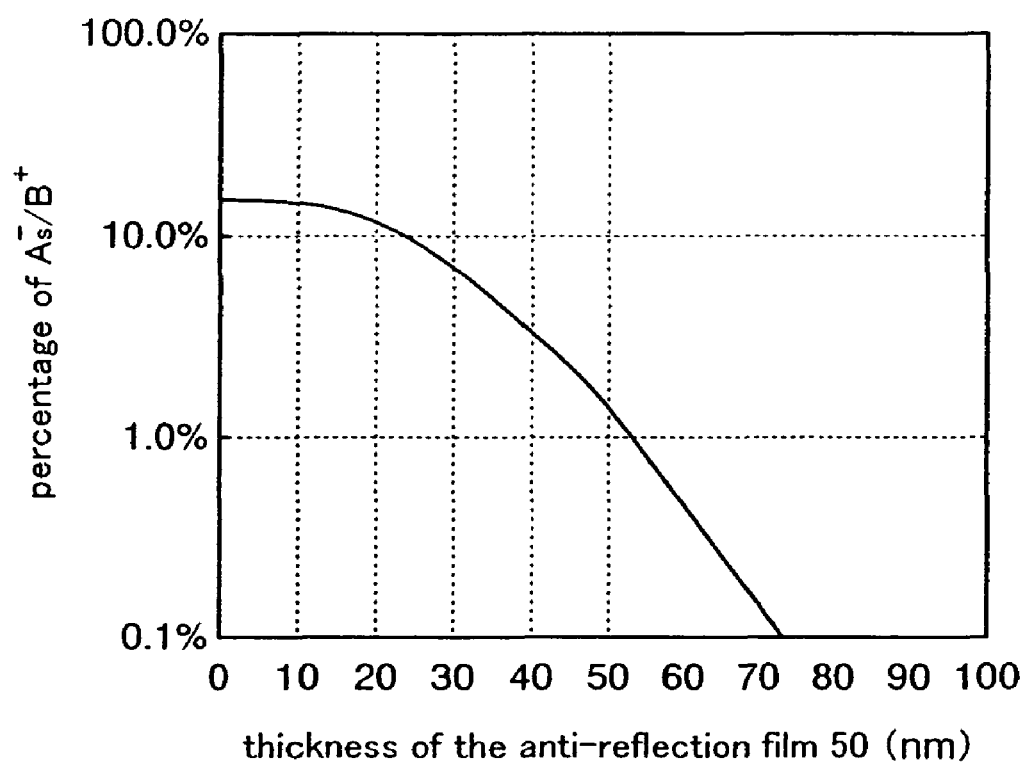
FIG. 13 is a graph obtained after checking how much As⁻ ion is blocked depending on the thickness of an anti-reflection film in the fifth embodiment of the present invention.

FIG. 13 is the graph obtained by checking how much $As^-$ ion was blocked depending on the thickness of the anti-reflection film 50 made of the silicon nitride film. Particularly, in this survey, percentage of the ratio between the concentration of $B^+$, which was ion-implanted into the second gate electrode 30g to achieve low resistance in the process of FIG. 4M, and the concentration of $As^-$, which was implanted into the second gate electrode 30g after passing through the anti-reflection film 50 in the ion implantation process of FIG. 40, has been calculated. The axis of ordinate of FIG. 13 denotes the percentage.

As shown in FIG. 13, by setting the thickness of the anti-reflection film 50 made of the silicon nitride film to 70 nm or more, it is understood that almost all $As^-$ are blocked by the anti-reflection film 50.

(7) Sixth Embodiment

Figure 14A:
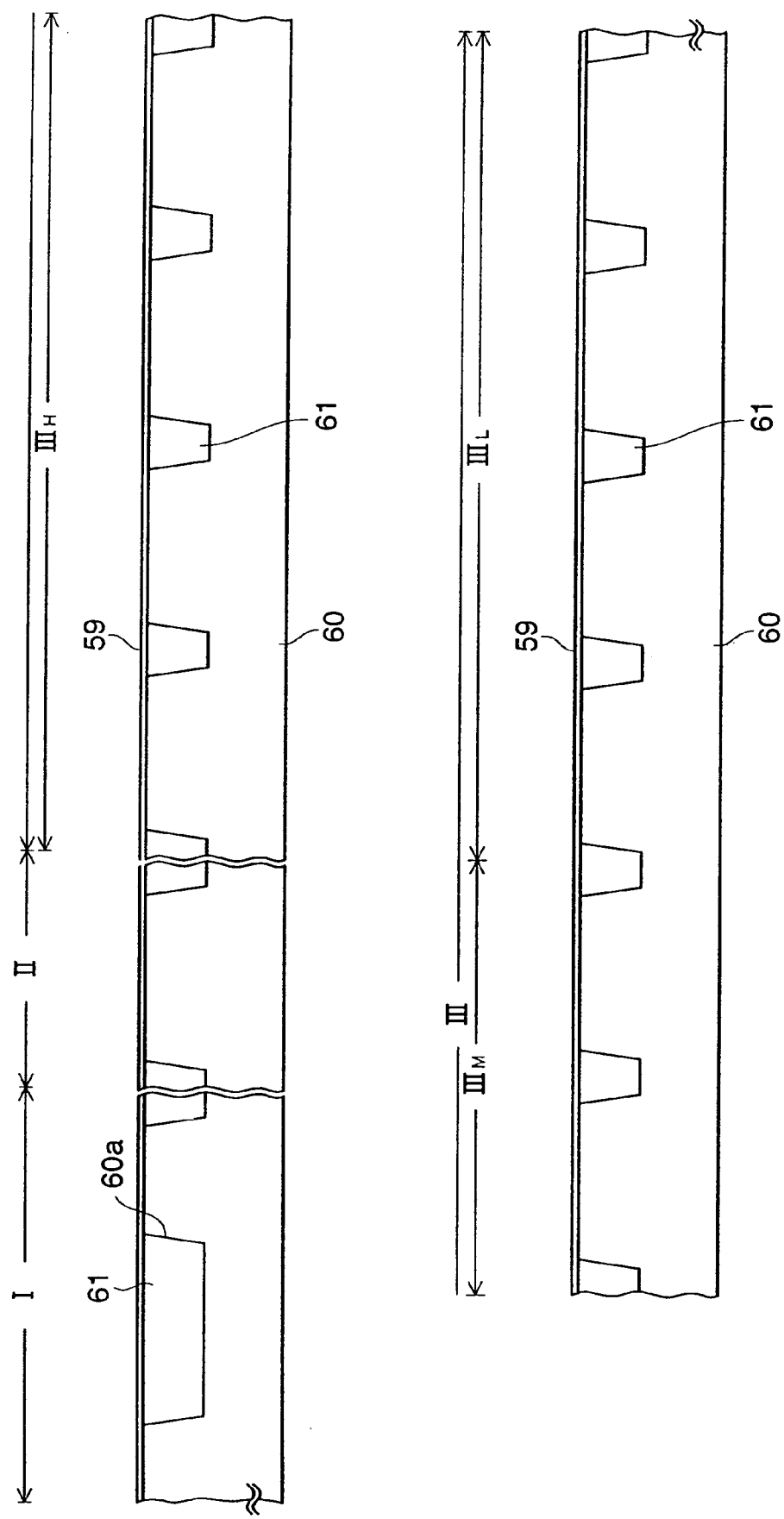
FIGS. 14A to 14Y are in-process sectional views of a semiconductor device according to a sixth embodiment of the present invention.
Figure 15A:
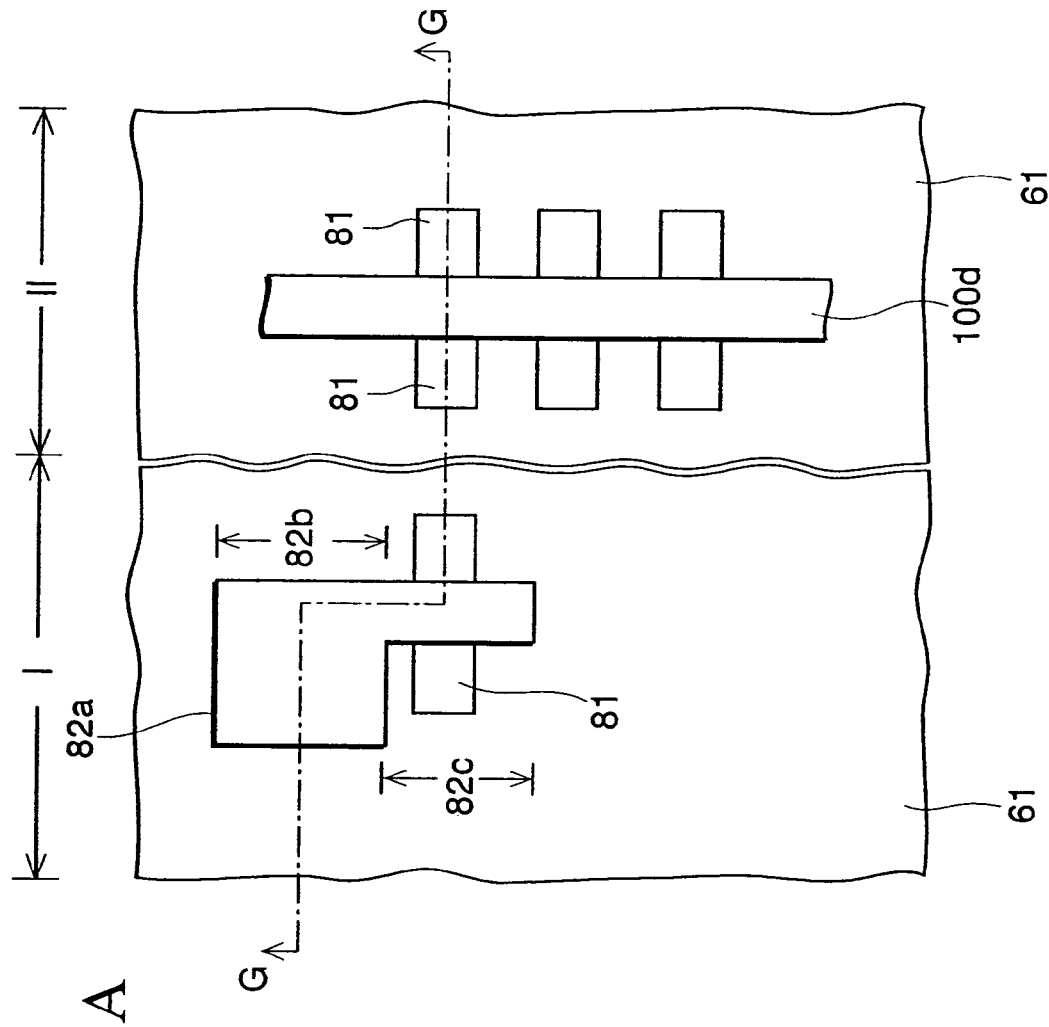
FIGS. 15A to 15C are in-process plan views of the semiconductor device according to the sixth embodiment of the present invention.
Figure 15B:
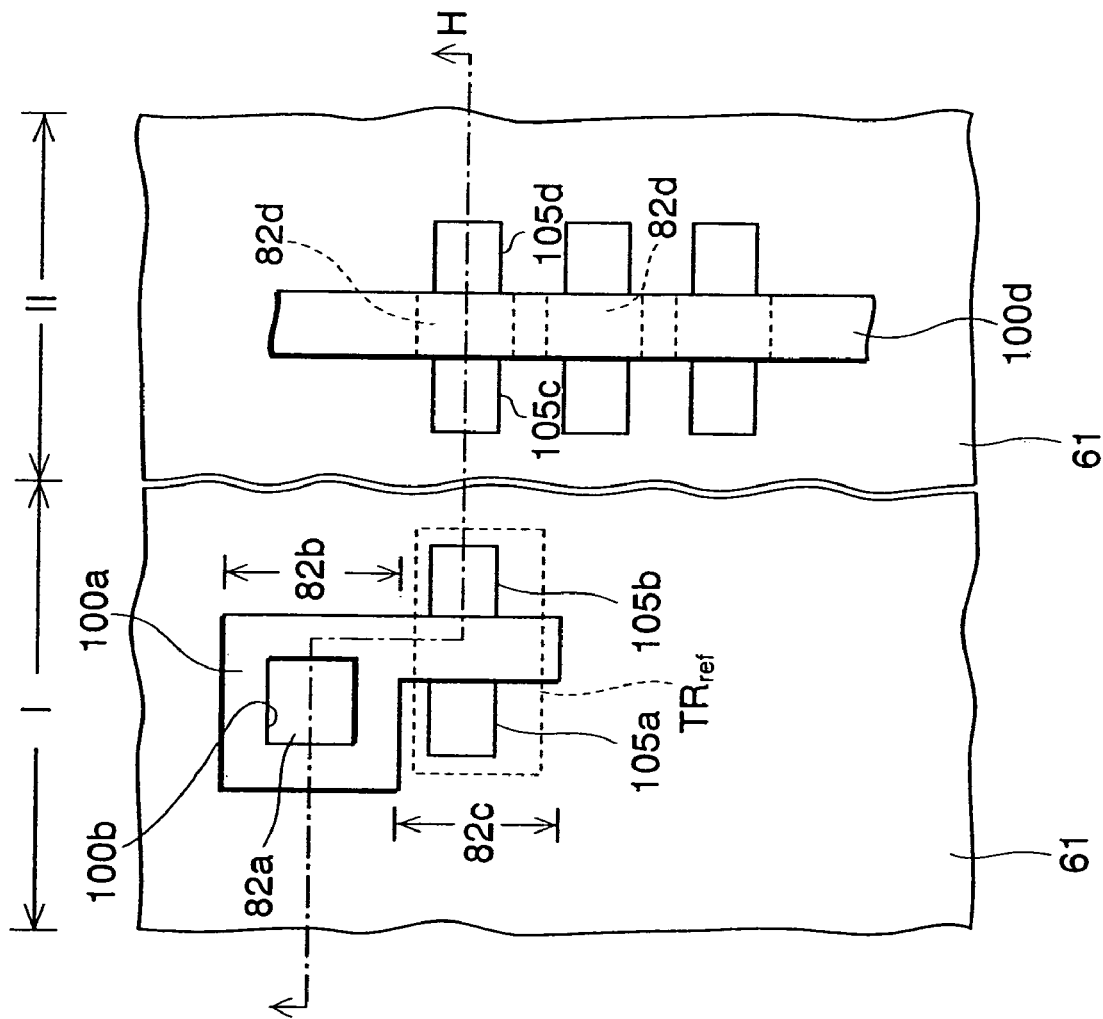
Figure 15C:
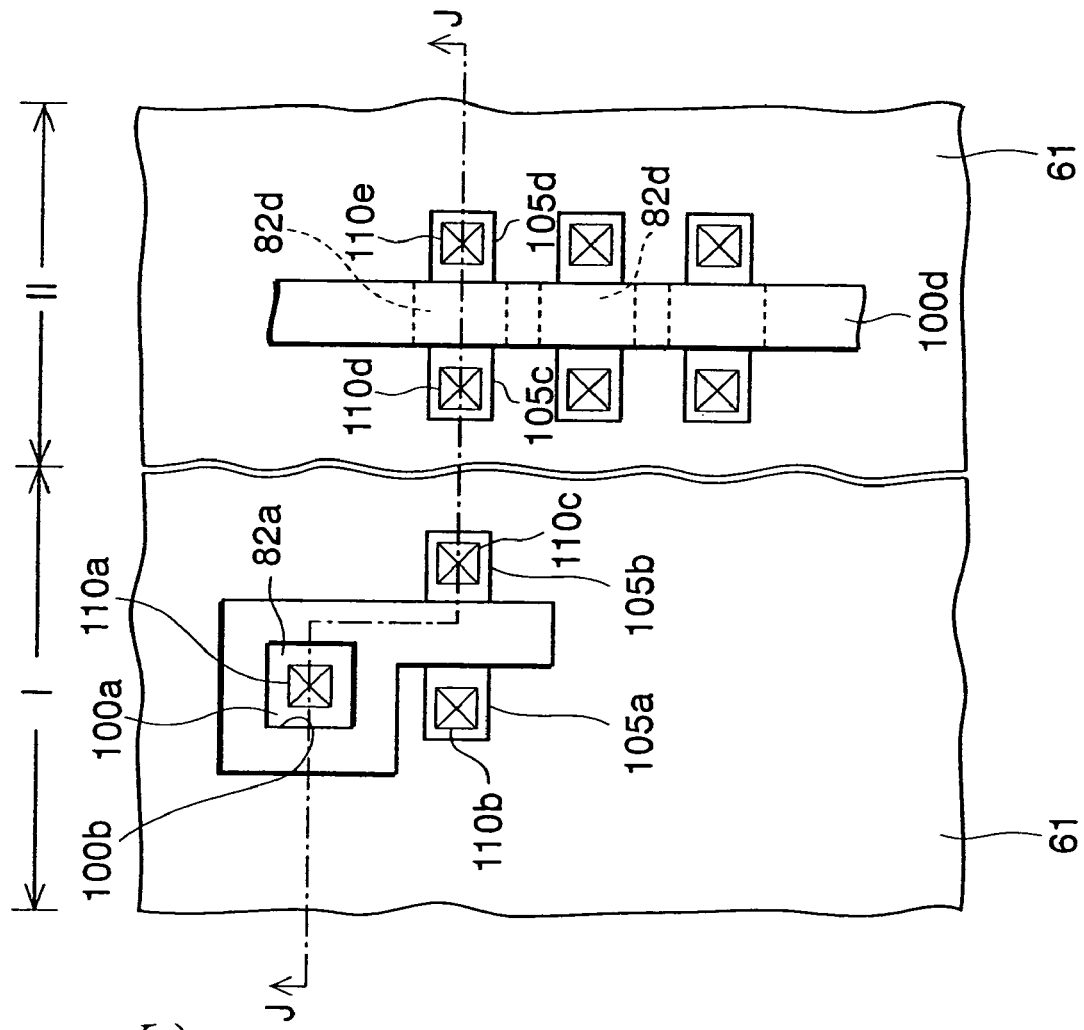

FIGS. 14A to 14Y are in-process sectional views of the semiconductor device according to the sixth embodiment of the present invention, and FIGS. 15A to 15C are its plan views.

In this embodiment, although a logic-embedded memory such as FPGA is fabricated similar to the first embodiment, the function of the logic-embedded memory can be improved significantly because a far larger number of transistors than the first embodiment are formed.

First of all, description will be made for the process until the sectional structure shown in FIG. 14A will be obtained.

Firstly, a trench 60a for STI is formed in a silicon substrate 60 where the first and second peripheral circuit regions (I, III) and the cell region II are defined, and silicon oxide is formed as a device isolation insulating film 61 in the trench 60a. Then, the entire surface of the silicon substrate 60 is thermally oxidized to form a thermal oxide film having the thickness of about 10 nm, and it is used as a sacrifice insulating film 59.

Note that the second peripheral circuit region III of the silicon substrate 60 is further divided into a high voltage transistor forming region $III_H$, a middle voltage transistor forming region $III_M$, and a low voltage transistor forming region $III_L$.

Figure 14B:
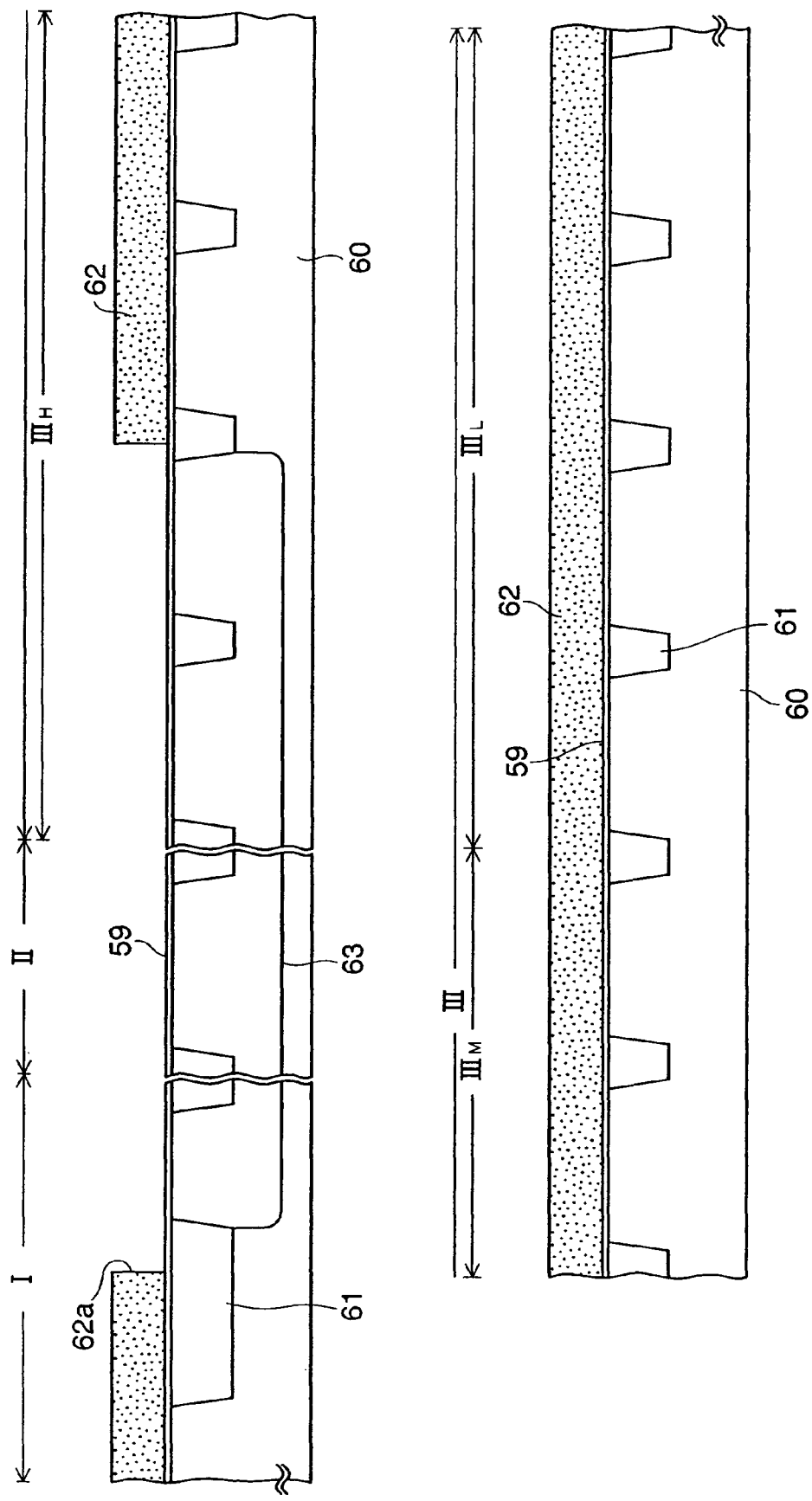

Next, as shown in FIG. 14B, a first resist pattern 62 including a first window 62a, where a region in which an n-type MOS transistor is formed in the high voltage transistor forming region $III_H$ and the cell region II are exposed, is formed on the sacrifice insulating film 59. A part of the first peripheral circuit region I is also exposed from the first window 62a. Then, $P^+$ ion of n-type impurity is ion-implanted into the silicon substrate 60 through the first window 62a to form a first n-well 63 is formed in a deep portion of the silicon substrate 60. Although the conditions of ion implantation is not particularly limited, the accelerating energy of 2 MeV and dose of $2 \times 10^{13}$ cm$^{-3}$ are employed in this embodiment.

The first resist pattern 62 is removed after this.

Next, as shown in FIG. 14C, photoresist is coated on the sacrifice insulating film 59, and it is exposed and developed to form a second resist pattern 58. The second resist pattern 58 has a second window 58a, where a region in which an n-type MOS transistor is formed in the high voltage transistor forming region $III_H$ and the cell region II are exposed. A part of the first peripheral circuit region I is also exposed from the second window 58a.

Further, third and fourth windows (58b, 58c) are formed in the second resist pattern 58 on regions where the n-type MOS transistors are formed in the middle voltage transistor forming region $III_M$ and the low voltage transistor forming region $III_L$, respectively.

Then, by implanting $B^+$ ion of the p-type impurity into the silicon substrate 60 based on ion implantation of the first conditions as the accelerating energy of 400 KeV and the dose of $1.5 \times 10^{13}$ cm$^{-3}$, and the second conditions as the accelerating energy of 100 KeV and the dose of $2 \times 10^{12}$ cm$^{-3}$ by using the second resist pattern 58 as a mask, first to third p-wells (64 to 66) are formed.

N-type MOS transistors having high threshold voltage and n-type MOS transistors having low threshold voltage are formed in the high voltage transistor forming region $III_H$, and the latter threshold voltage is controlled by the first p-well 64.

The second resist pattern 58 is removed after this.

Figure 14D:
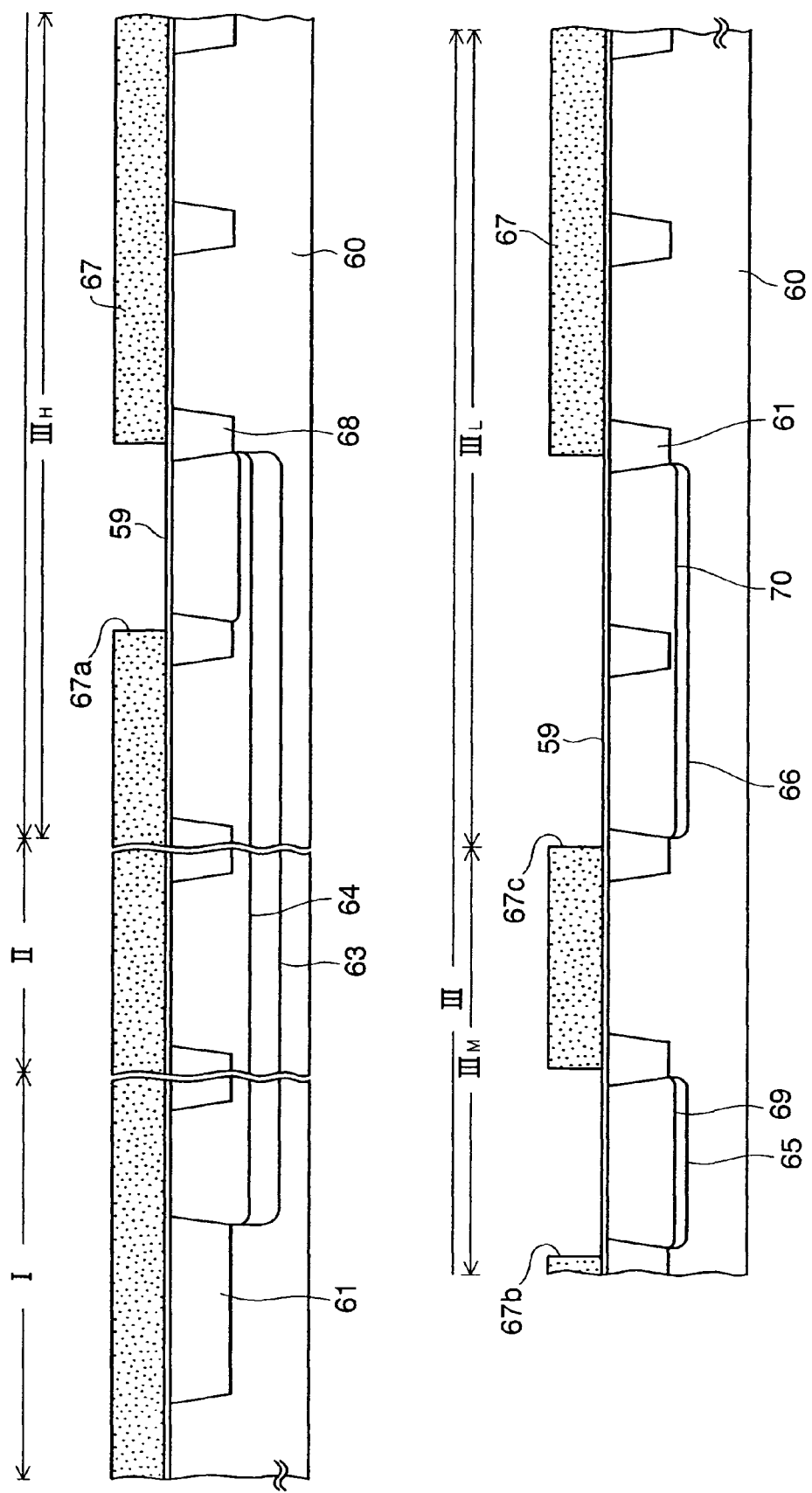

Next, as shown in FIG. 14D, a third resist pattern 67 including a fifth window 67 on a region, where the n-type MOS transistor having high threshold voltage is formed in the high voltage transistor forming region $III_H$, in each of the regions (I to III). In the third resist pattern 67, sixth and seventh windows (67b, 67c) are formed in addition to the fifth window 67a on regions where the n-type MOS transistors are formed in the middle voltage transistor forming region $III_M$ and the low voltage transistor forming region $III_L$.

Then, by implanting $B^+$ ion of the p-type impurity into the silicon substrate 60 based on the conditions as the accelerating energy of 100 KeV and the dose of $6 \times 10^{12}$ cm$^{-1}$, fourth to sixth p-wells (68 to 70) are formed.

Of these wells, the fourth p-well 68 controls the threshold voltage of the n-type MOS transistors having high threshold voltage, which will be formed later in the high voltage transistor forming region $III_H$. On the other hand, the fifth and sixth p-wells (69, 70) have a function of a channel stop layer for the n-type MOS transistors that will be formed later in the middle voltage transistor forming region $III_M$ and the low voltage transistor forming region $III_L$.

The third resist pattern 67 is removed after this.

Figure 14E:
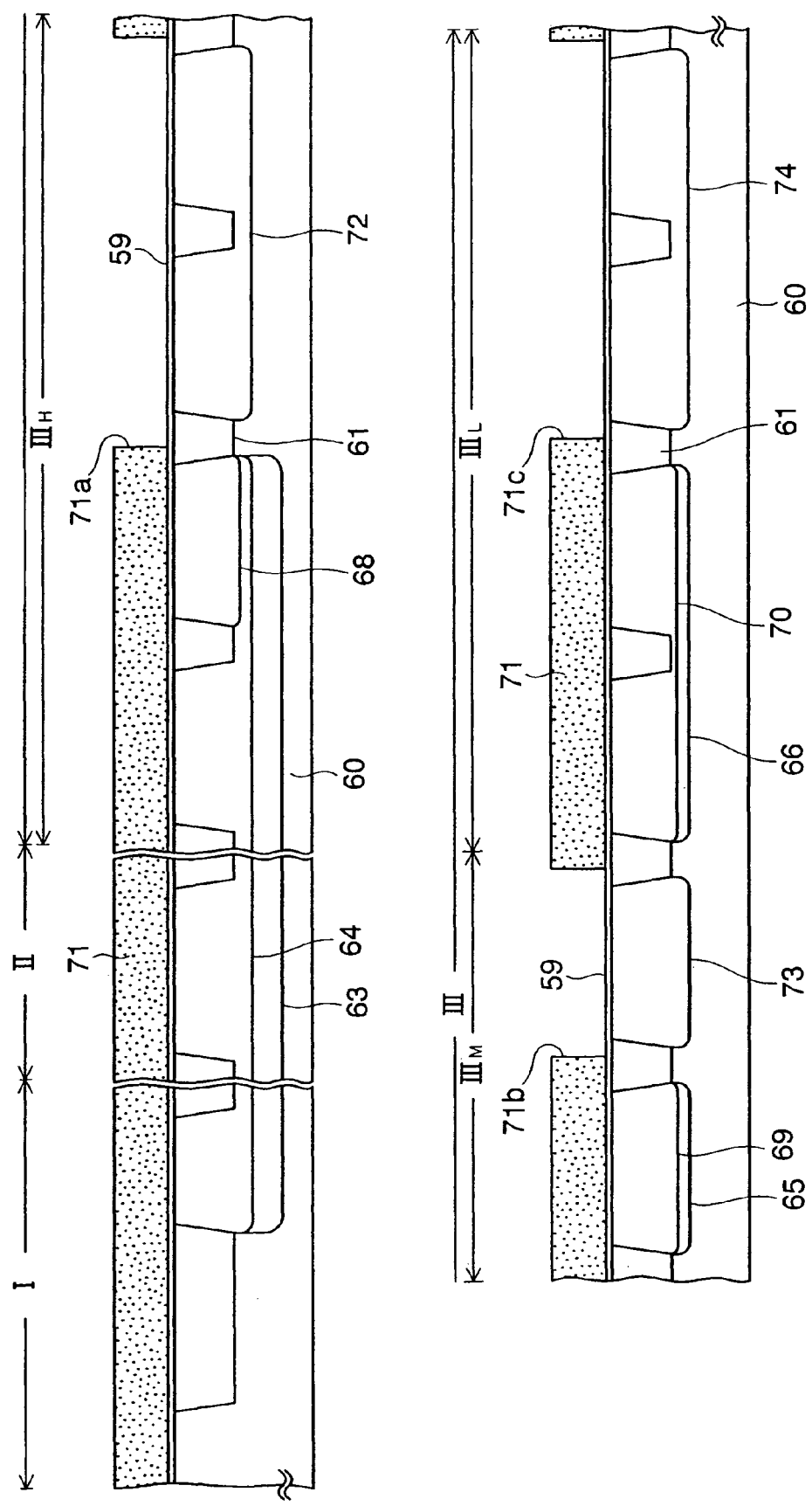

Subsequently, as shown in FIG. 14E, a fourth resist pattern 71 including eighth to tenth windows (71a to 71c) on regions, where p-type MOS transistors are formed in each region ($III_H$, $III_M$, $III_L$), is formed on each region (I to III).

Then, by implanting $P^+$ ion of the n-type impurity into the silicon substrate 60 based on ion implantation of the first conditions as the accelerating energy of 600 KeV and the dose of $1.5 \times 10^{13}$ cm$^{-3}$, and the second conditions as the accelerating energy of 240 KeV and the dose of $3 \times 10^{12}$ cm$^{-3}$ by using the fourth resist pattern 71 as a mask, second to fourth n-wells (72 to 74) are formed.

P-type MOS transistors having high threshold voltage and p-type MOS transistors having low threshold voltage are formed in the high voltage transistor forming region $III_H$, and the latter threshold voltage is controlled by the second p-well 72.

The second resist pattern 71 is removed after this.

Figure 14F:
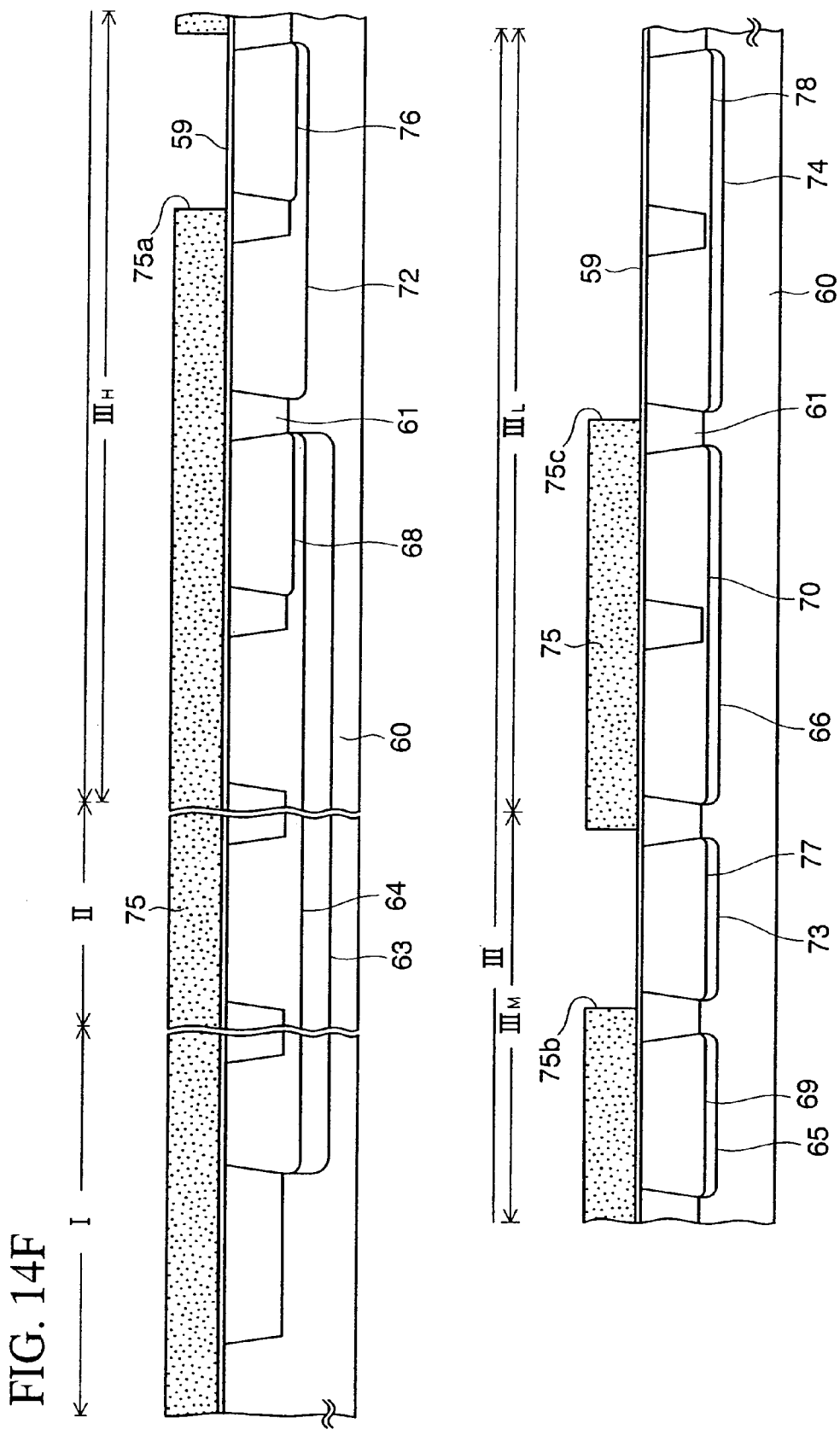

Next, as shown in FIG. 14F, a fifth resist pattern 75 including eleventh window 75a on a region, where the p-type MOS transistors having high threshold voltage are formed in the high voltage transistor forming region $III_H$ is formed on each region (I to III). On the fifth resist pattern 75, twelfth and thirteenth windows (75b, 75c) are formed on regions where the p-type MOS transistors are formed in the middle voltage transistor forming region $III_M$ and the low voltage transistor forming region $III_L$.

Then, by implanting $P^+$ ion of the n-type impurity into the silicon substrate 60 based on the conditions as the accelerating energy of 240 KeV and the dose of $6.5\times10^{12}$ cm$^{-3}$ while the fifth resist pattern 75 is used as a mask, fifth to seventh n-wells (76 to 78) are formed.

Of these wells, the fifth n-well 76 controls the threshold voltage of the p-type MOS transistors having high threshold voltage, which will be formed later in the high voltage transistor forming region $III_H$. On the other hand, the sixth and seventh n-wells (77, 78) have a function of a channel stop layer for the p-type MOS transistors that will be formed later in the middle voltage transistor forming region $III_M$ and the low voltage transistor forming region $III_L$.

The fifth resist pattern 75 is removed after this.

Figure 14G:
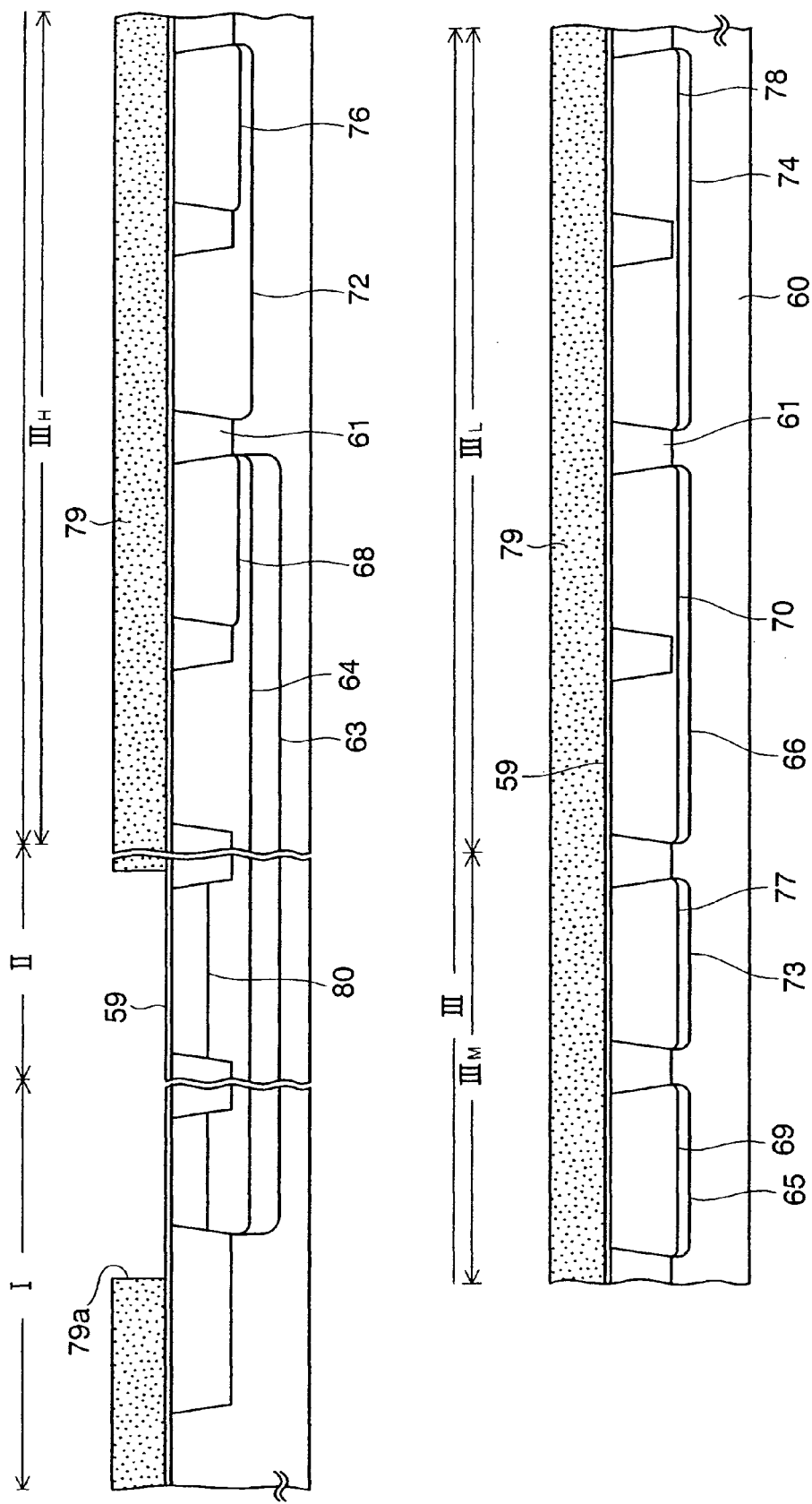

Subsequently, as shown in FIG. 14G, a sixth resist pattern 79 including a fourteenth window 79a on the first peripheral circuit region I and the cell region II is formed in each region (I to III). Then, $B^+$ of the p-type impurity is ion-implanted into the silicon substrate 60 under the conditions of the accelerating energy of 40 KeV and the dose of $6\times10^{13}$ cm$^{-3}$ while the sixth resist pattern 79 is used as a mask, and a first p-type impurity diffusion region 80 is formed. The first p-type impurity diffusion region 80 serves to control the threshold voltage of a flash memory cell that will be formed later in the cell region II.

After this, the sixth resist pattern 79 is removed.

Next, description will be made for the process until the sectional structure shown in FIG. 14H will be obtained.

Firstly, the sacrifice insulating film 59 is removed by wet etching of hydrofluoric acid solution to expose a clean surface of the silicon substrate 60. Then, a thermal oxide film having the thickness of about 10 nm is formed on the silicon substrate 60 in the mixed atmosphere of Ar and $O_2$ under the thermal treatment condition to set the temperature of substrate to 900° C. to 1050° C., and it is used as a first insulating film 81. The first insulating film 81 will be the tunnel insulating film of the flash memory cell later.

Subsequently, description will be made for the process until the sectional structure shown in FIG. 14I will be obtained.

Firstly, a polysilicon film into which phosphorous is doped in-situ is formed on the first insulating film 81 at the thickness of about 90 nm by the low pressure CVD method where $SiH_4$ and $PH_3$ are used as reactive gas, and it is used as a first conductive film 82. Subsequently, the first conductive film 82 is patterned by photolithography and removed from the second peripheral circuit region III. The first conductive film 82 in the cell region II becomes a stripe shape in word line directions.

Next, a silicon oxide film and a silicon nitride film are formed in this order on the first conductive film 82 and the first insulating film 81 in the second peripheral circuit region III in the thickness of 5 nm and 10 nm, respectively, by using the low pressure CVD method. Further, the surface of the silicon nitride film is oxidized in $O_2$ atmosphere under the condition of substrate temperature at about 950° C. to form a silicon oxide film having the thickness of about 3 nm on the surface of the film. Consequently, the ONO film, where the silicon oxide film, the silicon nitride film, and the silicon oxide film are laminated in this order, is formed as a second insulating film 83 on the entire surface.

Figure 14H:
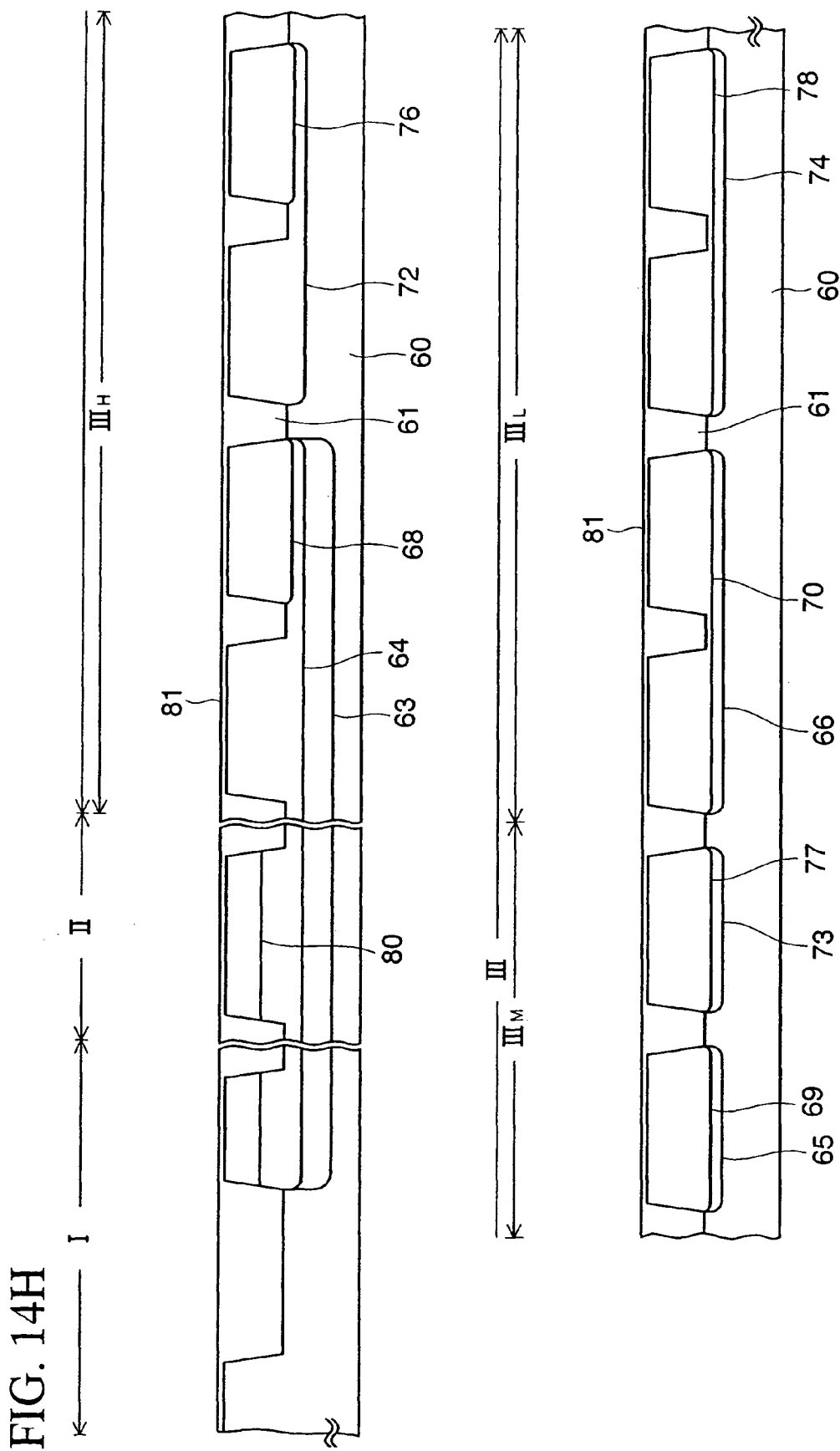
Figure 14I:
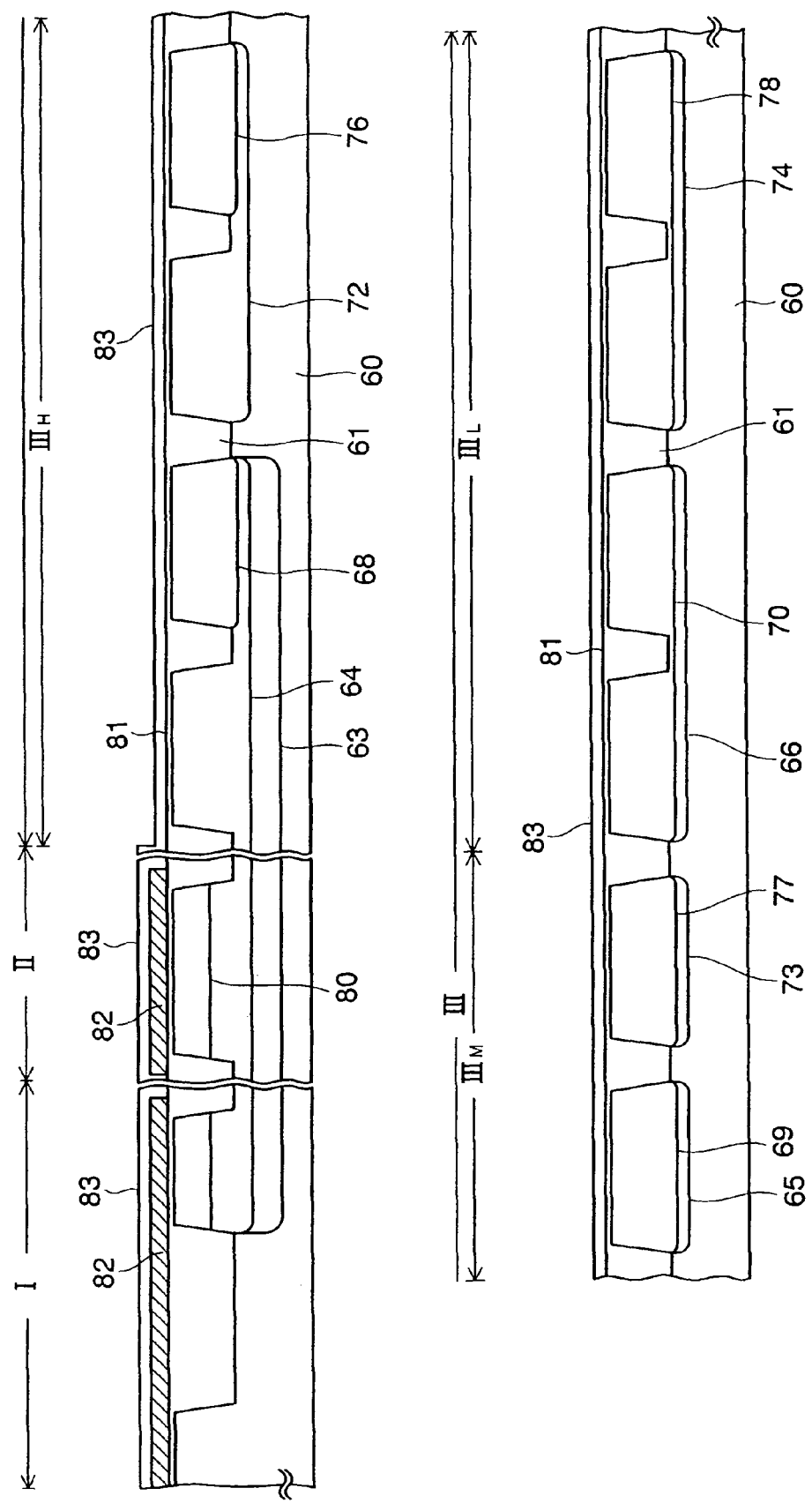

Note that due to the thermal treatment when oxidizing the silicon nitride film in the ONO film or the thermal treatment when forming the first insulating film 81 described in FIG. 14H, the impurity in the wells that were formed in the silicon substrate 60 is diffused by about 0.1 to 0.2 µm or more and the impurity distribution in the wells becomes broad.

Subsequently, as shown in FIG. 14J, a seventh resist pattern 84 including a fifteenth window 84a on a region, where n-type transistors are formed in the middle voltage transistor forming region $III_M$, is formed on each region (I to III). Then, $B^+$ of the p-type impurity is ion-implanted into the silicon substrate 60 under the conditions of the accelerating energy of 30 KeV and the dose of $5\times10^{12}$ cm$^{-1}$, while the seventh resist pattern 84 is used as a mask and the first and second insulating films (81, 83) are used as a through-film. Consequently, a second p-type impurity diffusion region 85 for adjusting the threshold voltage of the n-type transistor is formed in the middle voltage transistor forming region $III_M$.

After this, the seventh resist pattern 84 is removed.

Figure 14K:
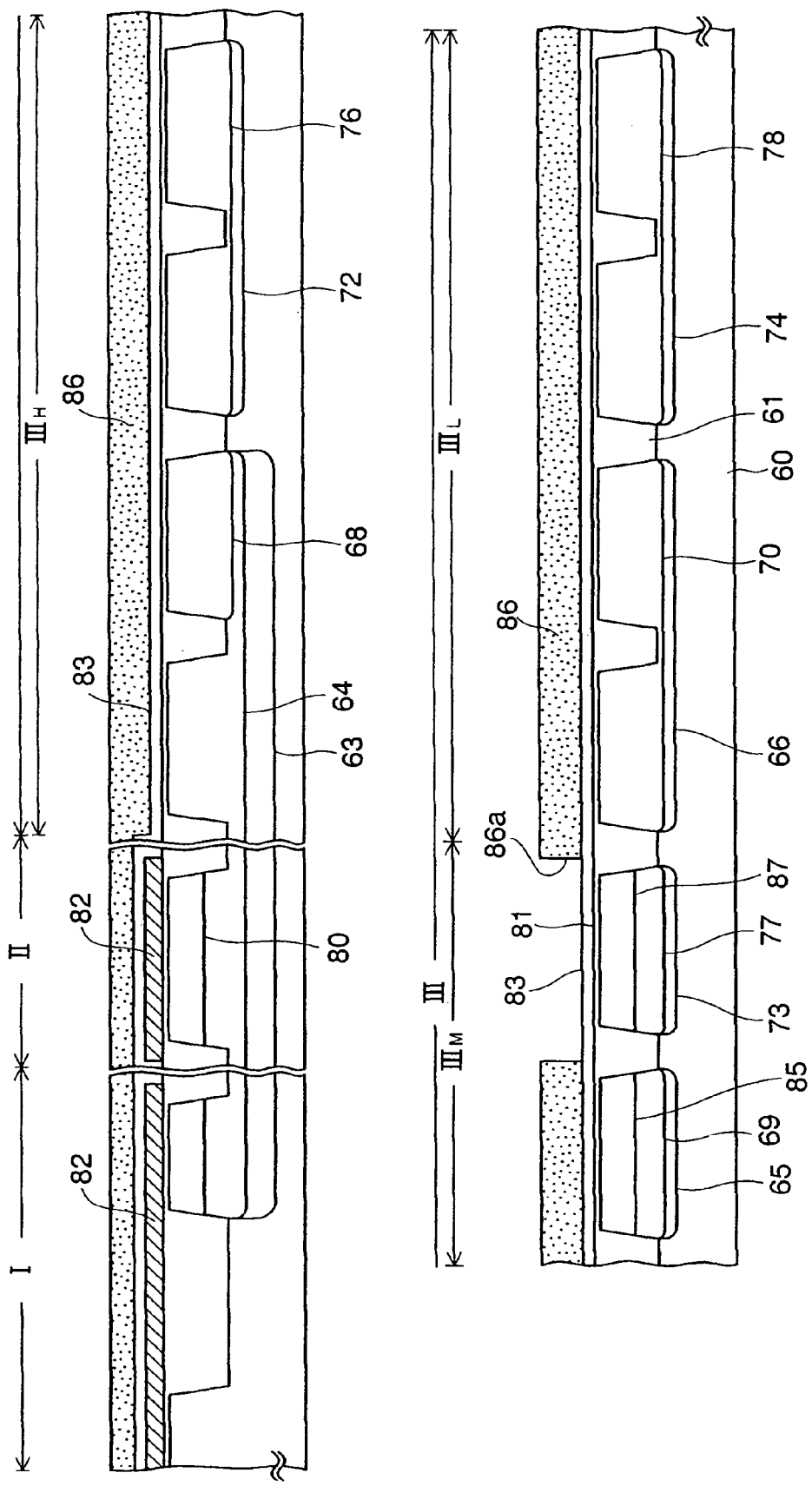

Next, as shown in FIG. 14K, an eighth resist pattern 86 including a sixteenth window 86a on a region, where p-type transistors are formed in the middle voltage transistor forming region $III_M$, is formed on each region (I to III). Then, $As^-$ ion of the n-type impurity is ion-implanted into the silicon substrate 60 under the conditions of the accelerating energy of 150 KeV and the dose of $3\times10^{12}$ cm$^{-3}$, while the eighth resist pattern 86 is used as a mask and the first and second insulating films (81, 83) are used as a through-film. Consequently, a first n-type impurity diffusion region 87 for adjusting the threshold voltage of the p-type transistor is formed in the middle voltage transistor forming region $III_M$.

After this, the eighth resist pattern 86 is removed.

Figure 14L:
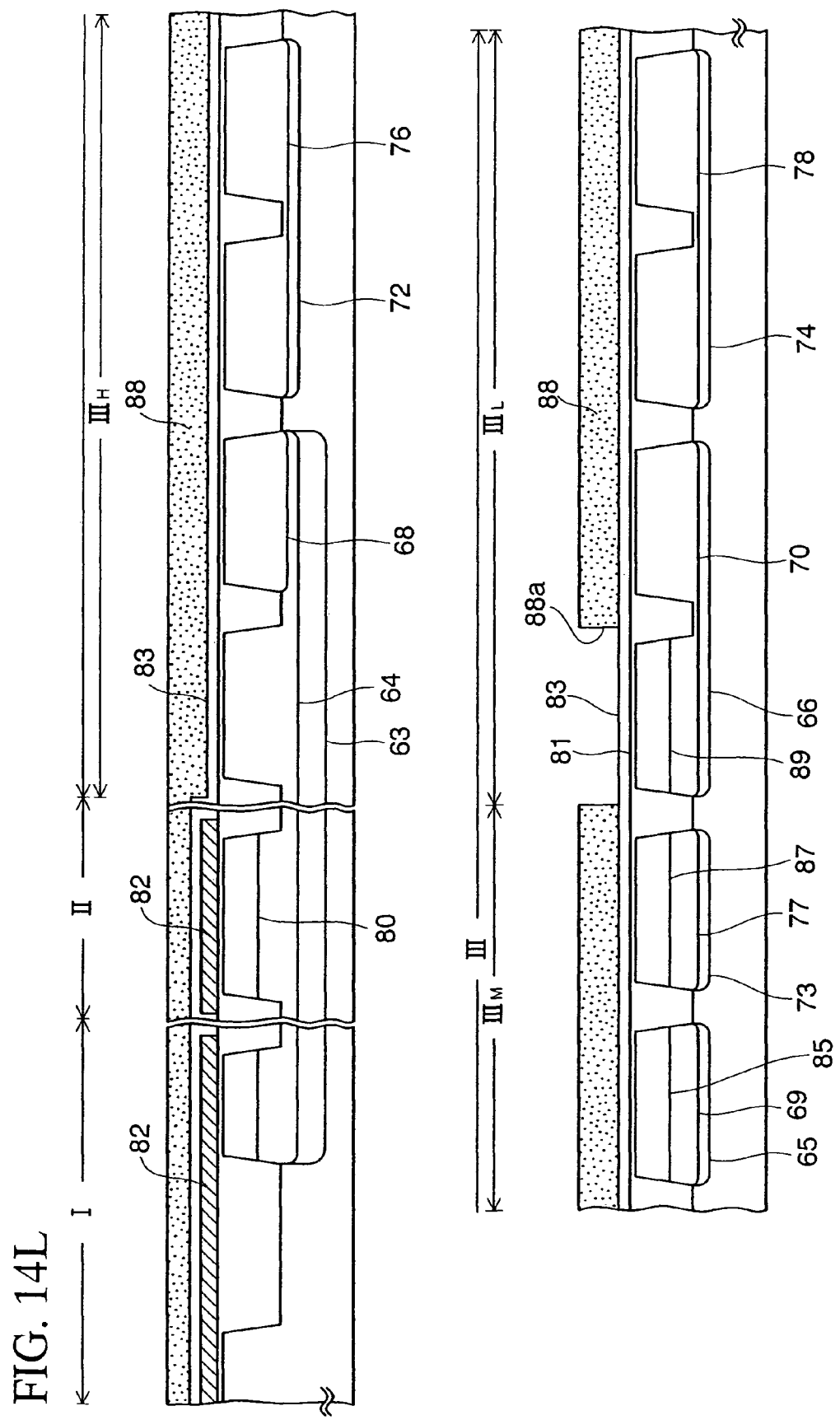

Next, as shown in FIG. 14L, photoresist is coated on the second insulating film 83, and it is exposed and developed to form a ninth resist pattern 88 including a seventeenth window 88a on the low voltage transistor forming region $III_L$.

Two n-type MOS transistors having high threshold voltage and low threshold voltage and two p-type MOS transistors having high threshold voltage and low threshold voltage will be formed later in the low voltage transistor forming region $III_L$, and the above-described seventeenth window 88a is formed on a region where the n-type MOS transistor having high threshold voltage will be formed.

Then, $B^+$ of the p-type impurity is ion-implanted into the silicon substrate 60 through the seventeenth window 88a under the conditions of the accelerating energy of 10 KeV and the dose of $5\times10^{12}$ cm$^{-3}$, while the first and second insulating films (81, 83) are used as a through-film. Consequently, a third p-type impurity diffusion region 89 for adjusting the threshold voltage of the n-type transistor having high threshold voltage is formed in the low voltage transistor forming region $III_L$.

After this, the ninth resist pattern 88 is removed.

Figure 14M:
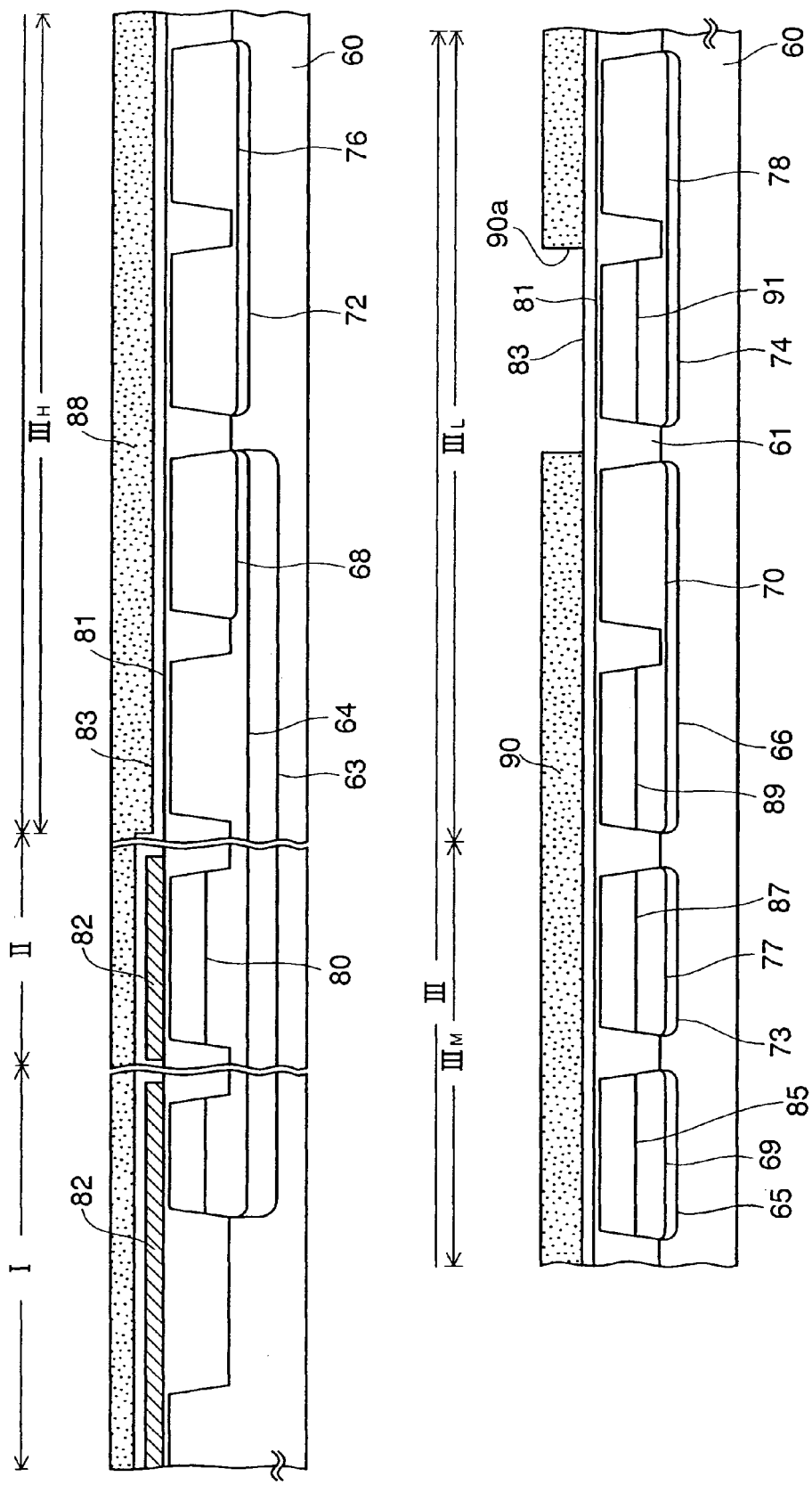

Subsequently, as shown in FIG. 14M, a tenth resist pattern 90 including a tenth window 90a on a region, where an p-type transistor having high threshold voltage is formed in the low voltage transistor forming region $III_L$, is formed on each region (I to III). Then, $As^+$ ion of the n-type impurity is ion-implanted into the silicon substrate 60 under the conditions of the accelerating energy of 100 KeV and the dose of $5\times10^{12}$ cm$^{-3}$, while the first and second insulating films (81, 83) are used as a through-film, and a second n-type impurity diffusion region 91 for adjusting the threshold voltage of the p-type transistor having high threshold voltage is formed.

The tenth resist pattern 90 is removed after the ion implantation is finished.

With the foregoing processes, the formation of the diffusion regions (85, 87, 89, 91) for controlling the threshold voltage of the transistors in the second peripheral circuit region III has been completed, so that the first and second insulating films (81, 83) in the second peripheral circuit region III, which were used as the through-film in forming the diffusion regions by ion implantation, are not necessary in the following processes.

Figure 14N:
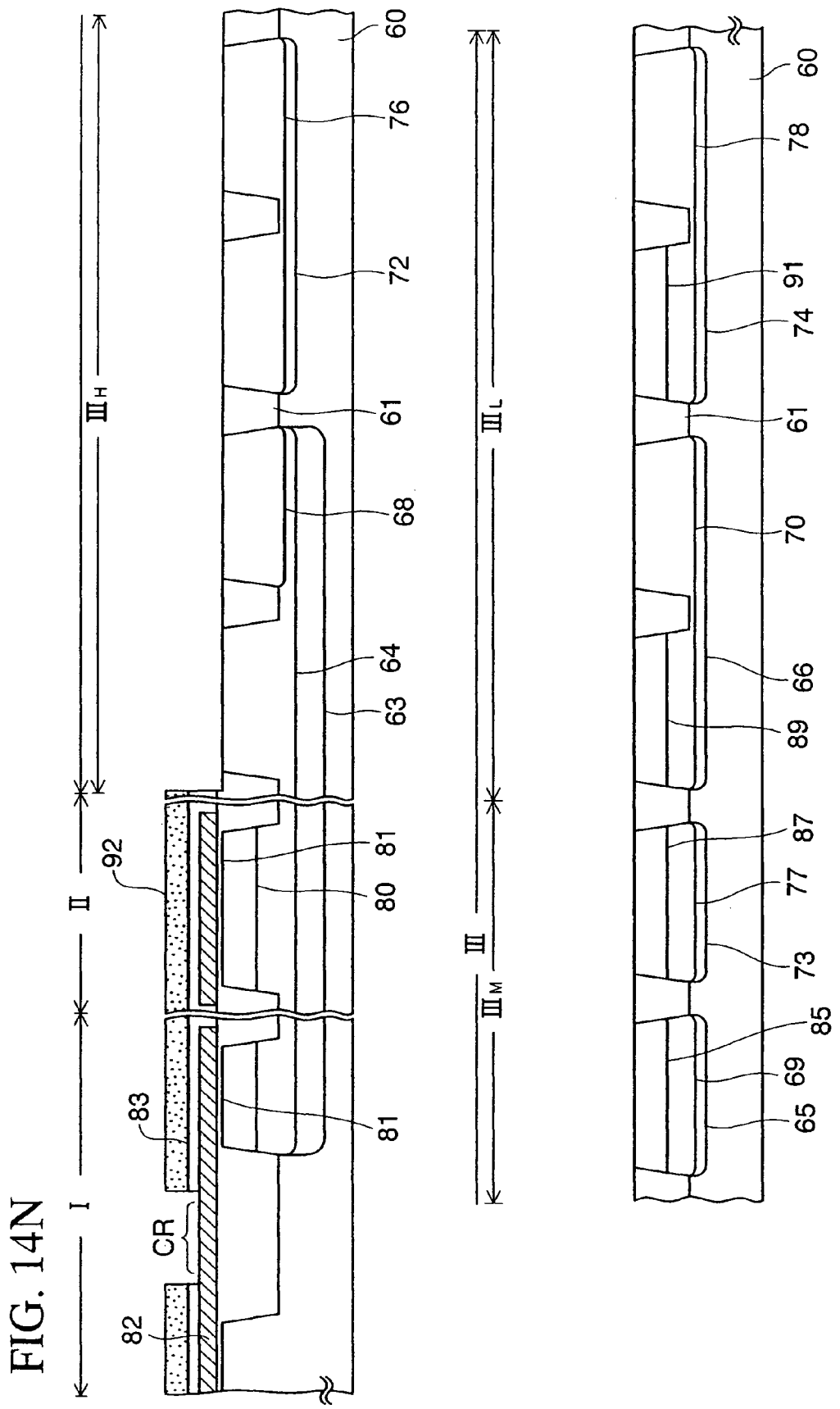

Therefore, in the next process shown in FIG. 14N, the first and second insulating films (81, 83) in the second peripheral circuit region III are removed. To do this, an eleventh resist pattern 92 covering the cell region II is formed on the second insulating film 83 as shown in FIG. 14N. The contact region CR of the first conductive film 82 in the first peripheral circuit region I and the second peripheral circuit region III are not covered by the eleventh resist pattern 92 but exposed.

Next, the second insulating film 83 on the contact region CR and the first and second insulating films (81, 83) in the second peripheral circuit region III are etched and removed by plasma etching using the mixed gas of $CH_3$ and $O_2$ and by subsequent wet etching by HF solution while the eleventh resist pattern 92 is used as a mask. Consequently, the second insulating film 83 is left only in a region other than the contact region CR and the silicon substrate 60 in the second peripheral circuit region III is exposed.

Then, after removing the eleventh resist pattern 92 by oxygen ashing, the surface of the silicon substrate 60 is cleaned by wet treatment.

Figure 14O:
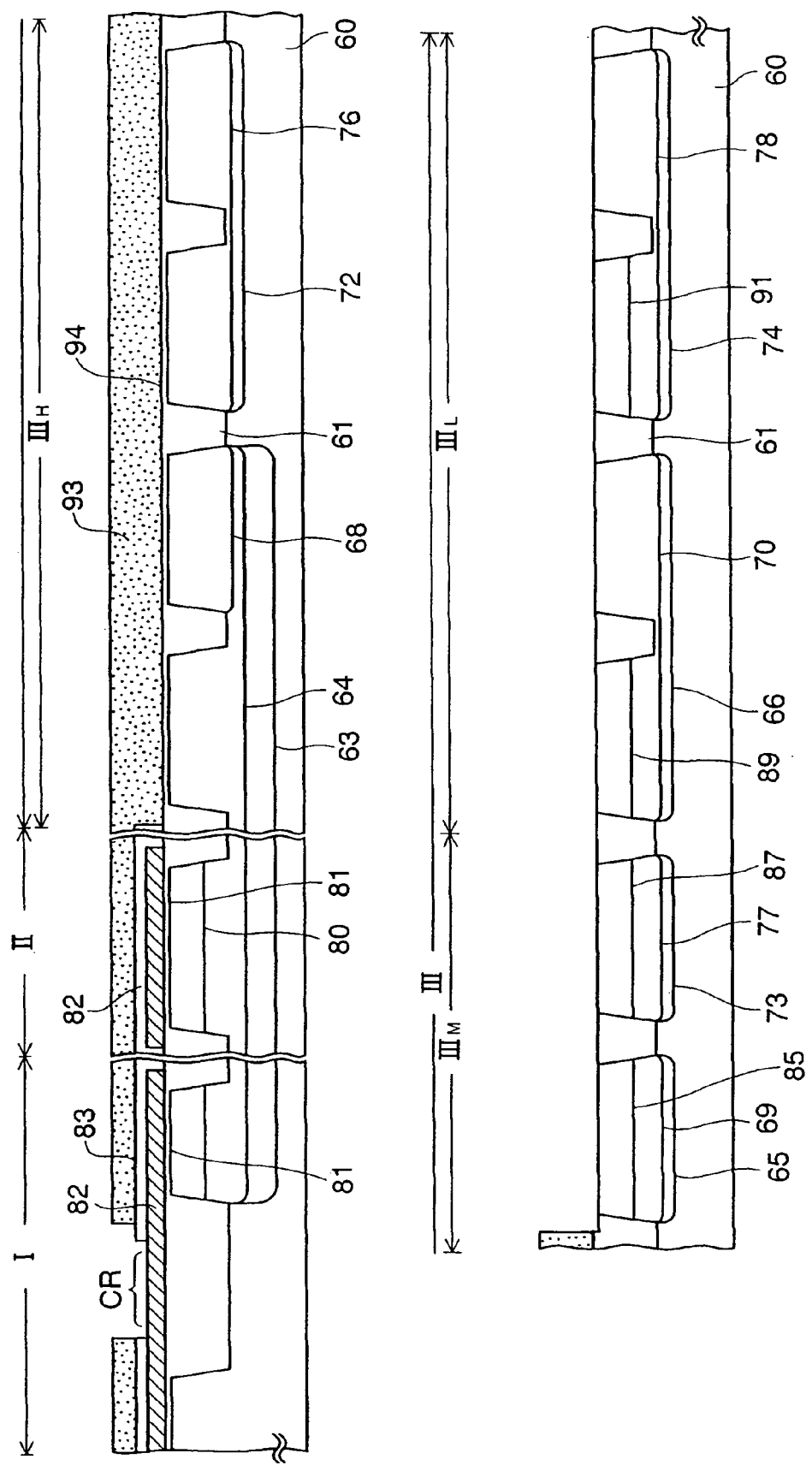

Next, description will be made for the process until the sectional structure shown in FIG. 14O will be obtained.

Firstly, the oxidizing condition where substrate temperature is set to 850° C. is employed, and the surface of the silicon substrate 60 exposed in the second peripheral circuit region III is thermally oxidized only by the thickness of 13 nm, and a thermal oxide film formed by the thermal oxidation is used as a third insulating film 94. In this thermal oxidation, the third insulating film 94 made of thermal oxide film is also formed on the contact region CR of the first conductive film 82 that is not covered by the second insulating film 83 but exposed.

Next, a twelfth resist pattern 93 is formed on the cell region II and the high voltage transistor forming region $III_H$. Then, the third insulating film 94 on the middle voltage transistor forming region $III_M$ and the low voltage transistor forming region $III_L$ is etched and removed by wet etching using HF solution while the twelfth resist pattern 93 is used as a mask. Further, in this etching, the third insulating film 94 made of thermal oxide film on the contact region CR of the first conductive film 82 is also etched, by which the contact region CR is exposed.

After this, the twelfth resist pattern 93 is removed.

Figure 14P:
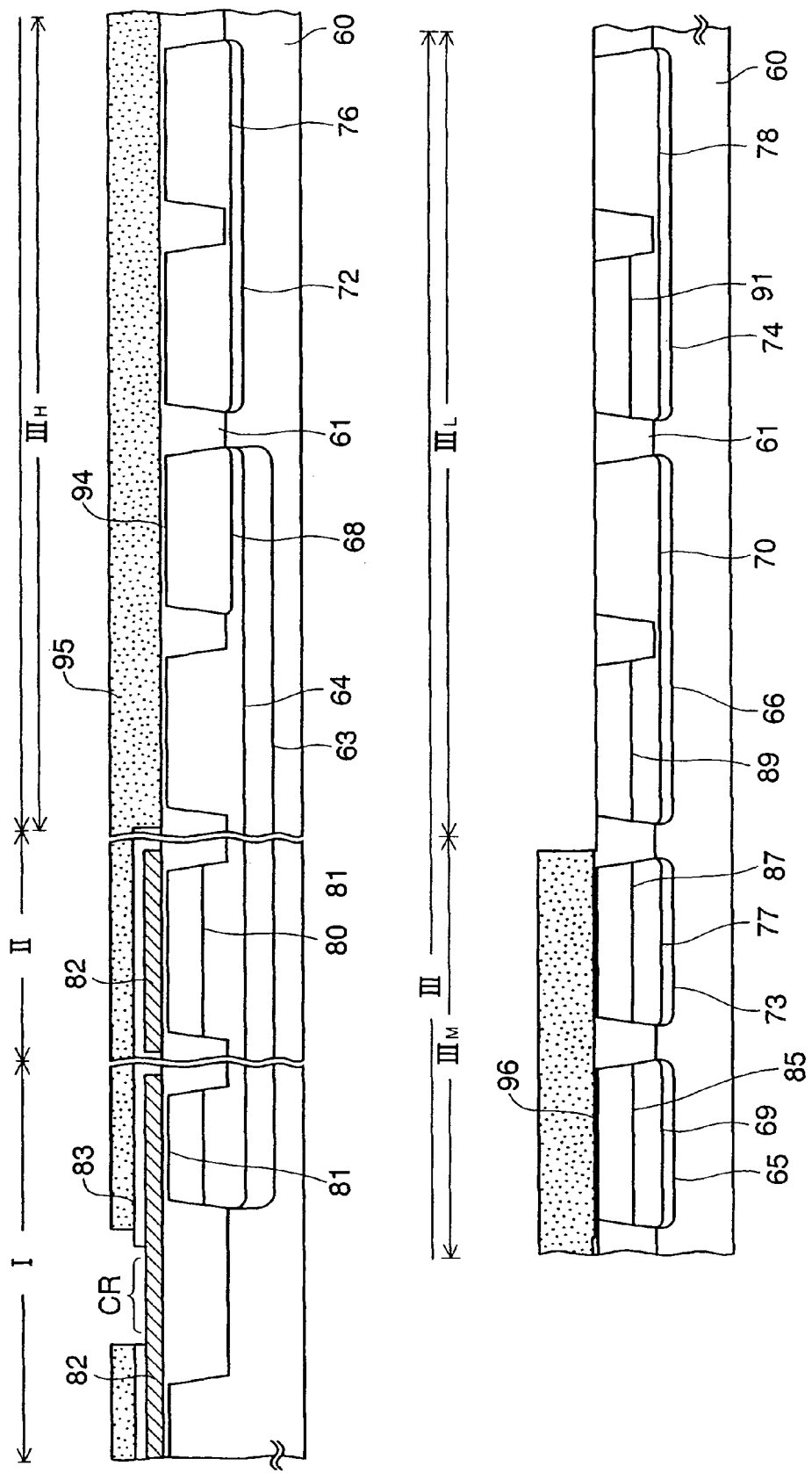

Next, description will be made for the process until the sectional structure shown in FIG. 14P will be obtained.

Firstly, the oxidizing condition where substrate temperature is set to 850° C. in oxygen atmosphere is employed, and the surface of the silicon substrate 60 exposed in the middle voltage transistor forming region $III_M$ and the low voltage transistor forming region $III_L$ is thermally oxidized only by the thickness of about 6 nm, and a thermal oxide film formed by the thermal oxidation is used as a fourth insulating film 96. The fourth insulating film 96 is also formed on the contact region CR of the first conductive film 82 similar to the previous third insulating film 94.

Subsequently, a third resist pattern 95 is formed on the cell region II, the high voltage transistor forming region $III_H$, and the middle voltage transistor forming region $III_M$. Then, the fourth insulating film 96 on the contact region CR and the low voltage transistor forming region $III_L$ is etched and removed by wet etching using HF solution while the thirteenth resist pattern 95 is used as a mask.

After this, the thirteenth resist pattern 95 is removed.

Figure 14Q:
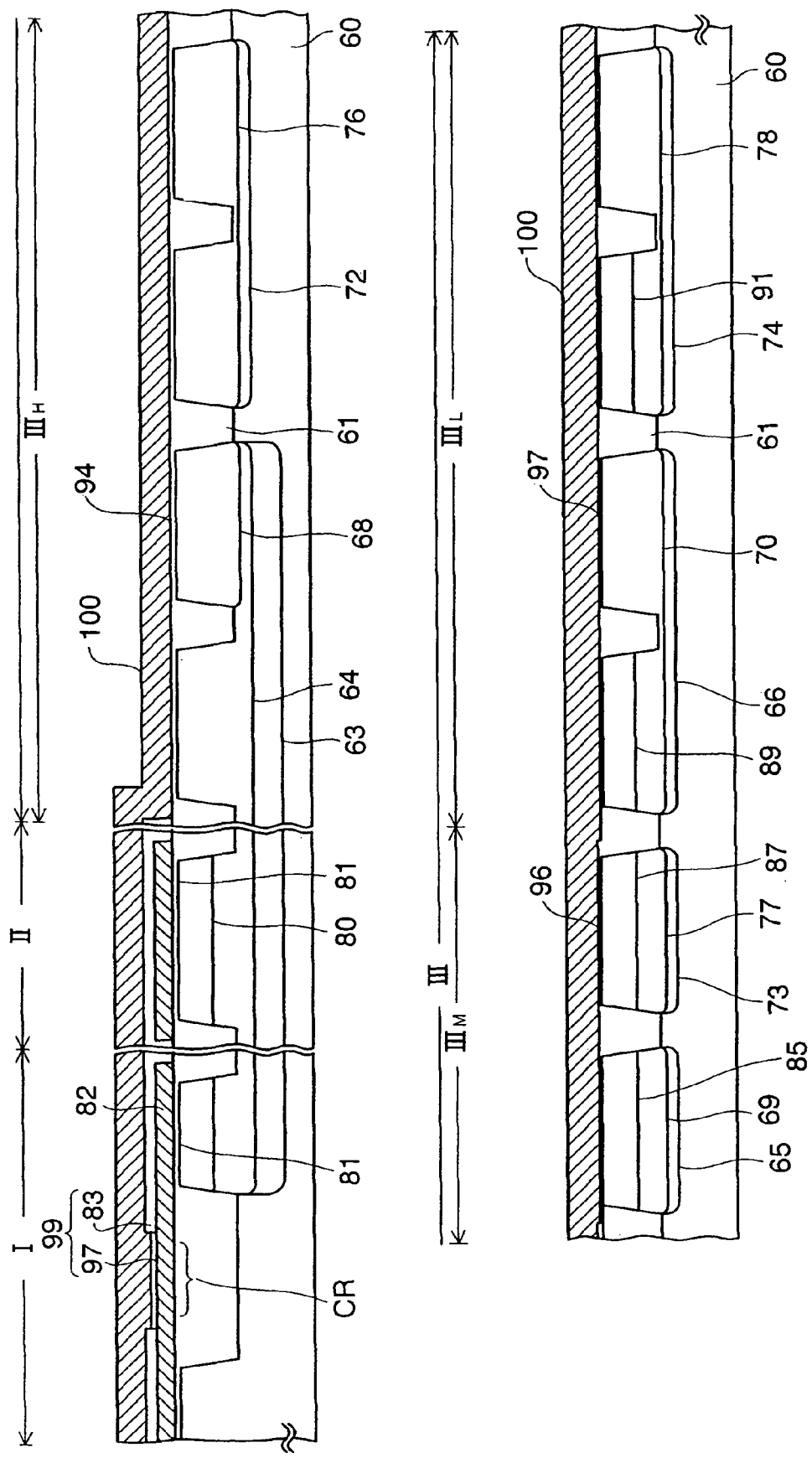

Next, description will be made for the process until the sectional structure shown in FIG. 14Q will be obtained.

Firstly, the oxidizing condition where substrate temperature is set to 850° C. in oxygen atmosphere is employed, and silicon of an area that is not covered by the second to fourth insulating films (83, 94, 96) is thermally oxidized only by the thickness of about 2.2 nm. Thus, a thermal oxide film having the thickness of about 2.2 nm is formed as a fifth insulating film 97 on the surfaces of the contact region CR of the first conductive film 82 made of polysilicon and the silicon substrate 60 in the low voltage transistor forming region $III_L$. The fifth insulating film 97 is formed adjacent to the second insulating film 83, and the second and fifth insulating films (83, 97) constitute an insulator 99. Note that the thickness of the fifth insulating film 97 formed in the contact region CR in this manner is significantly thinner than the second insulating film 83.

Further, as a result of forming the fifth insulating film 97 by thermal oxidation, the final thickness of the third insulating film 94 and the fourth insulating film 96 becomes 16 nm and 7 nm, respectively.

Thereafter, a non-doped polysilicon film having the thickness of about 180 nm is formed as a second conductive film 100 on the entire surface by the low pressure CVD method using $SiH_4$ as reactive gas.

Next, description will be made for the process until the sectional structure shown in FIG. 14R will be obtained.

Firstly, photoresist is coated on the second conductive film 100, and it is exposed and developed to form a fourteenth resist pattern 101. Next, the first and second conductive films (82, 100) and the insulator 99 are patterned by using the fourteenth resist pattern 101 as an etching mask. The patterning is conducted in a plasma etching chamber, the mixed gas of $Cl_2$ and $O_2$ is used as etching gas for the first and second conductive films (82, 100) made of polysilicon, and the mixed gas of $CH_3$ and $O_2$ is used as etching gas for the second insulating film 83 made of the ONO film constituting the insulator 99.

As a result of the patterning, the first and second conductive films (82, 100) in the first peripheral circuit region I are made into first and second conductor (85a, 100a) respectively while the second conductive film 100 is left in the second peripheral circuit region III. In the cell region, the first and second conductive films (82, 100) and the insulator 99 are made into a floating gate 82d, a control gate 100d, and an intermediate insulating film 99d, respectively.

After this, the fourteenth resist pattern 101 is removed.

Figure 14R:
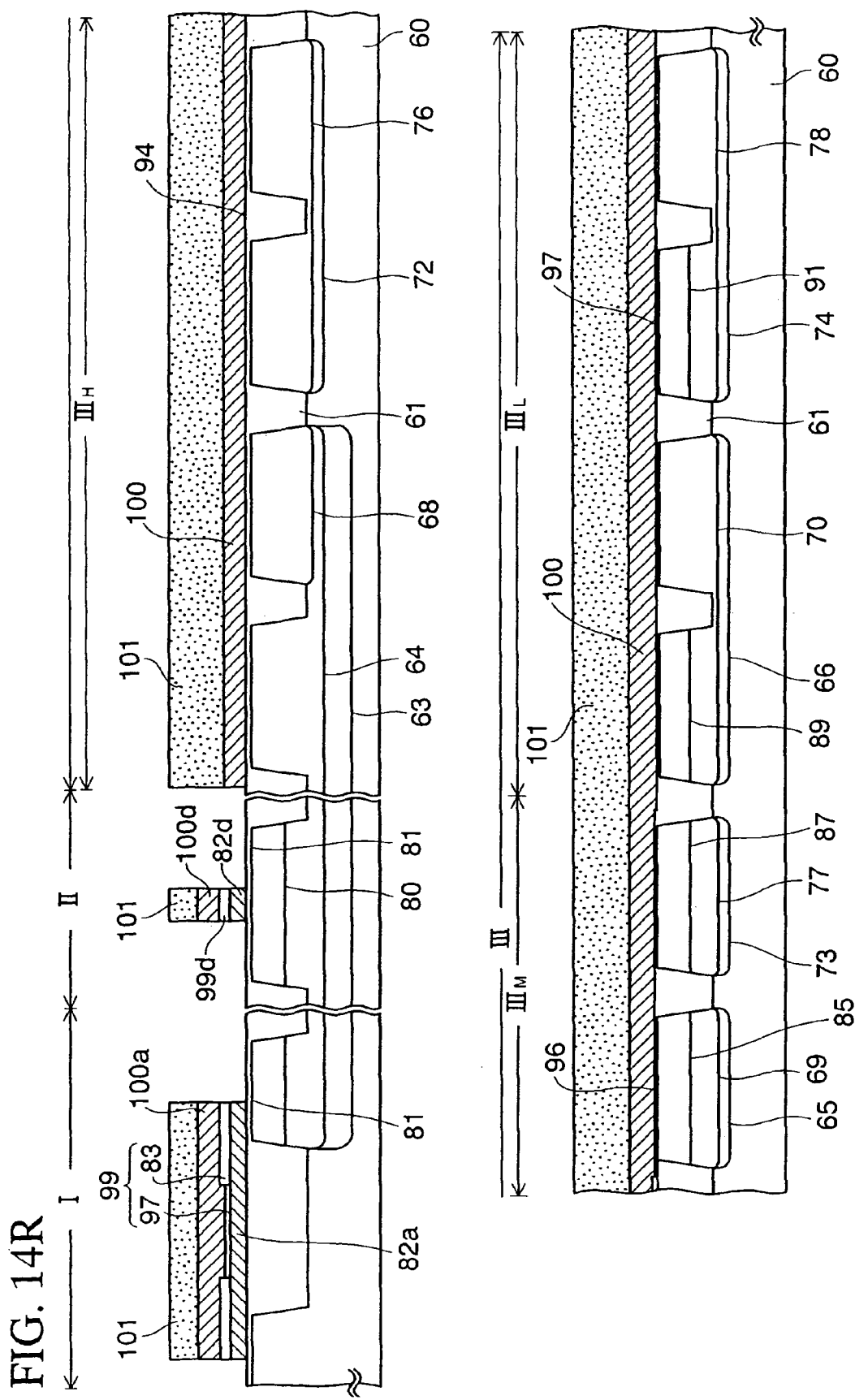

FIG. 15A is the plan view after completing the process, and the above FIG. 14R corresponds to the sectional view taken along G-G line of FIG. 15A. It is to be noted that the second conductor 100a is omitted in the first peripheral circuit region I and the second peripheral circuit region III is omitted to make the layout of be easily read in FIG. 15A.

As shown in FIG. 15A, the second conductor 82a is made up of a pad portion 82b and a gate portion 82c on the first insulating film 24.

Figure 14S:
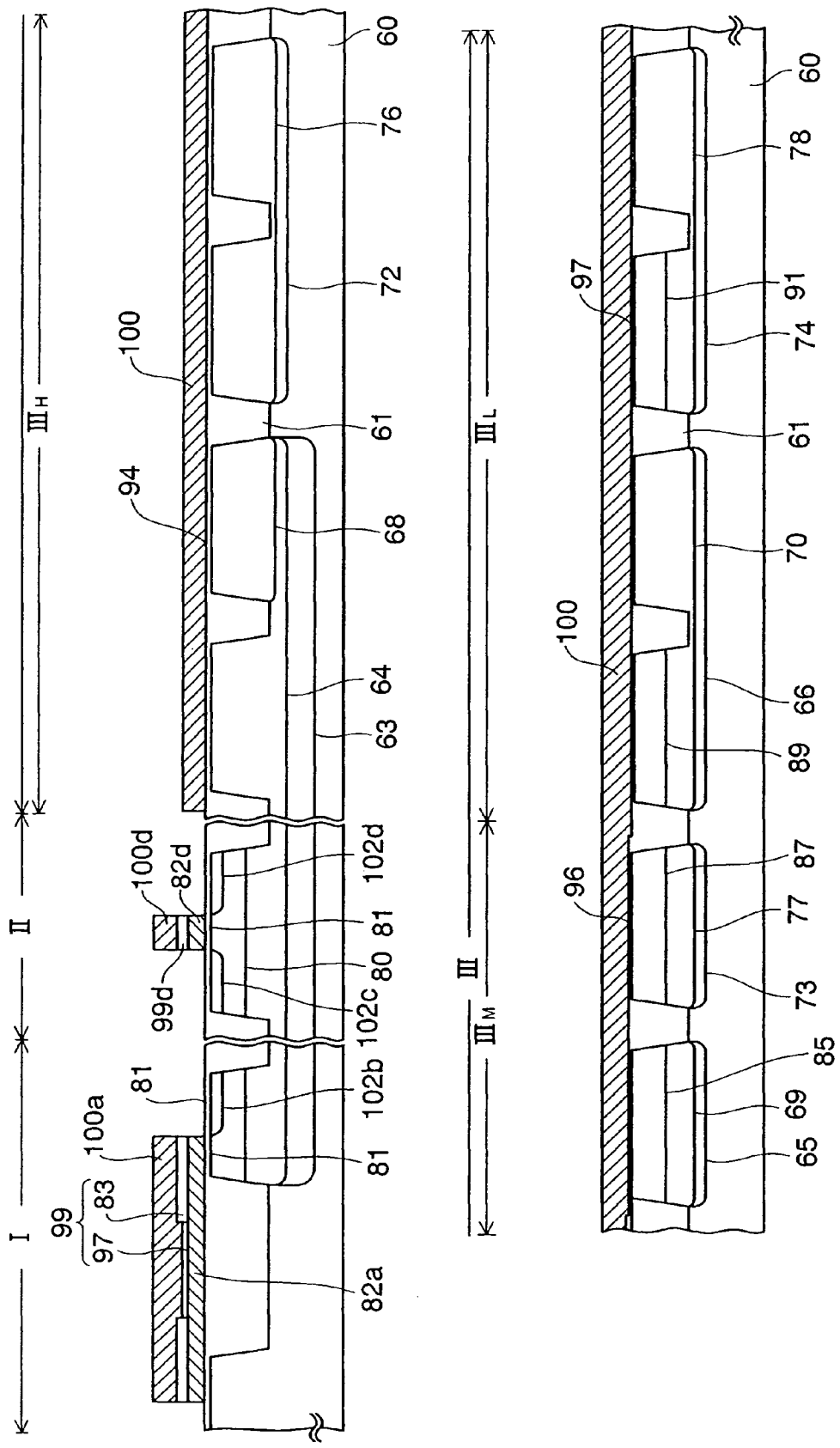

Next, description will be made for the process until the sectional structure shown in FIG. 14S will be obtained.

Firstly, by thermally oxidizing the side surfaces of the floating gate 82d and the control gate 100d, an extremely thin thermal oxide film (not shown) is formed on the side surfaces. The thermal oxide film serves to improve the retention characteristic of the flash memory cell.

Subsequently, a resist pattern (not shown) covering the second conductor 100a, the control gate 100d, and the second conductive film 100 is formed, and $As^+$ is ion-implanted as n-type impurity into the silicon substrate 60 by using the resist pattern as a mask. Although the conditions of the ion implantation is not particularly limited, the accelerating energy of 50 KeV and dose of $6\times10^{14}$ cm$^{-3}$, for example, are employed in this embodiment. As a result of such ion implantation, second to fourth n-type source/drain extensions (102b to 102d) are formed in areas beside the first conductor 82a and the floating gate 82d.

The above-described resist pattern is removed after this, and the side surfaces of the floating gate 82d and the control gate 100d are thermally oxidized again to form a thermal oxide film (not shown).

Figure 14T:
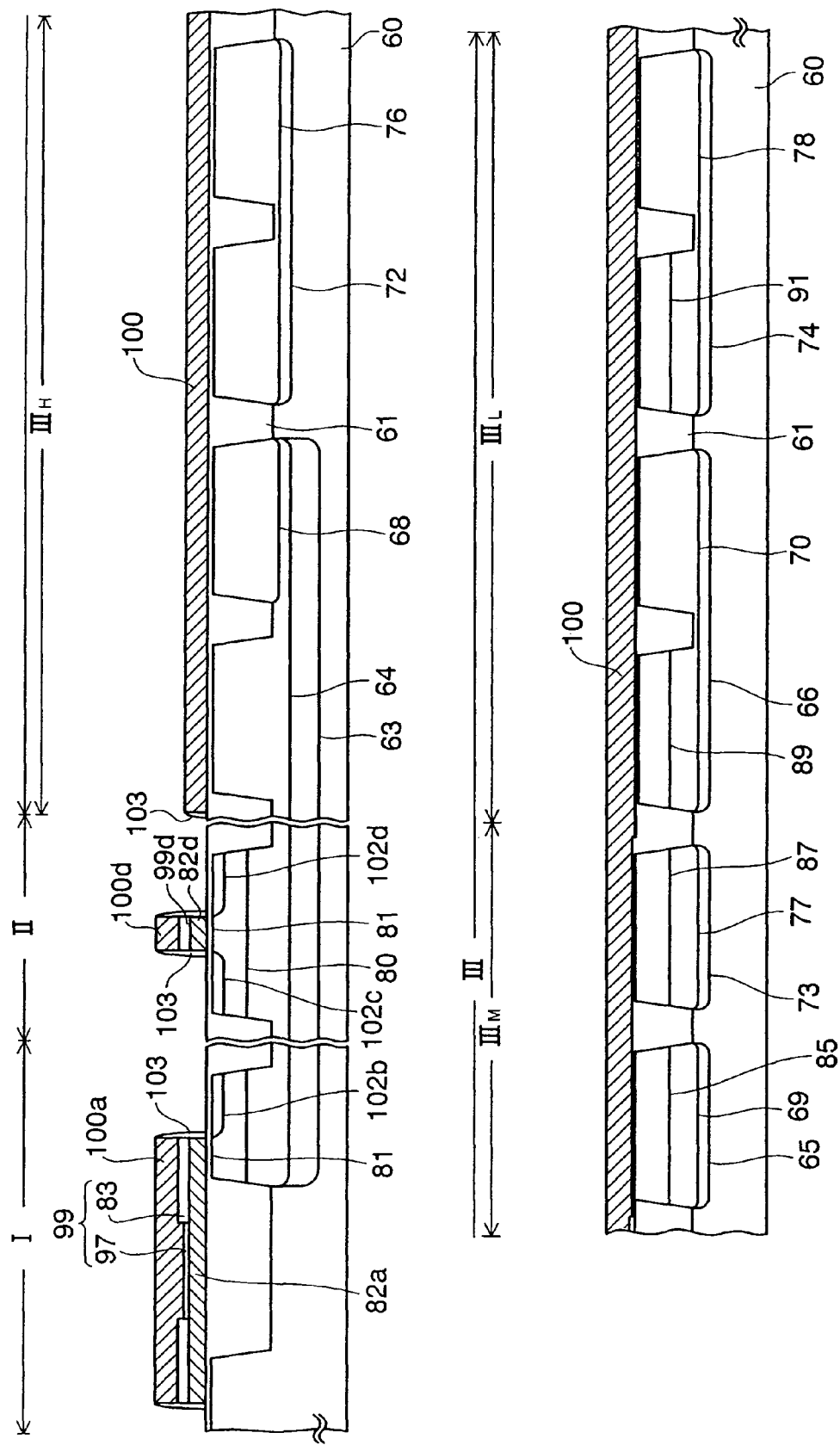

Next, as shown in FIG. 14T, after forming a silicon nitride film on the entire surface, it is etched back to leave it as first sidewalls 103 on the side surfaces of the second conductor 100a and the floating gate 82d.

Figure 14U:
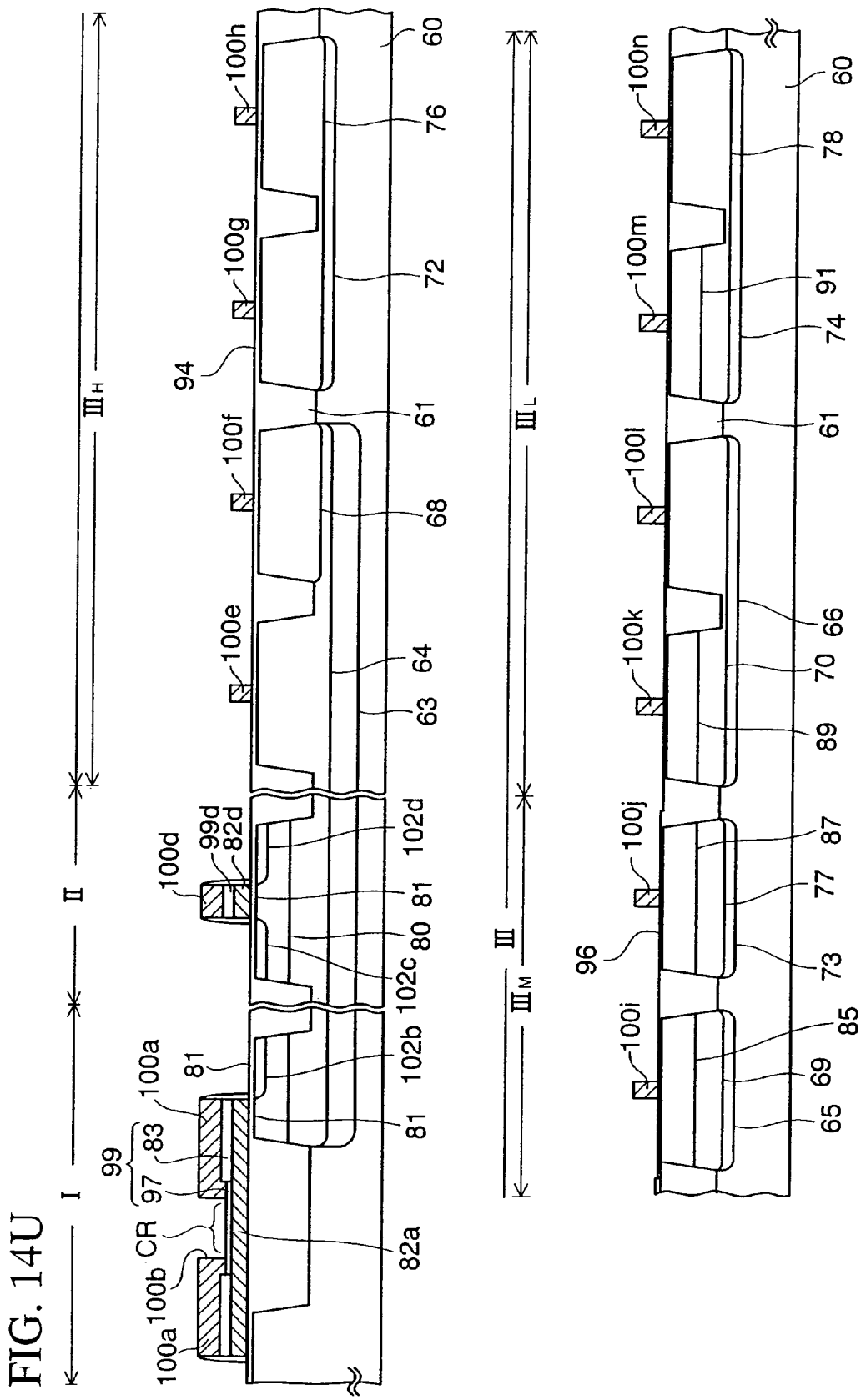

Next, as shown in FIG. 14U, the second conductor 100a on the first peripheral circuit region I and the second conductive film 100 on the second peripheral circuit region III are patterned by photolithography. Consequently, the second conductor 100a on the contact region CR is removed and a first opening 100b is formed, and first to tenth gate electrodes (100e to 100n) made of the patterned second conductive film 100 are formed in the second peripheral circuit region III.

Figure 14V:
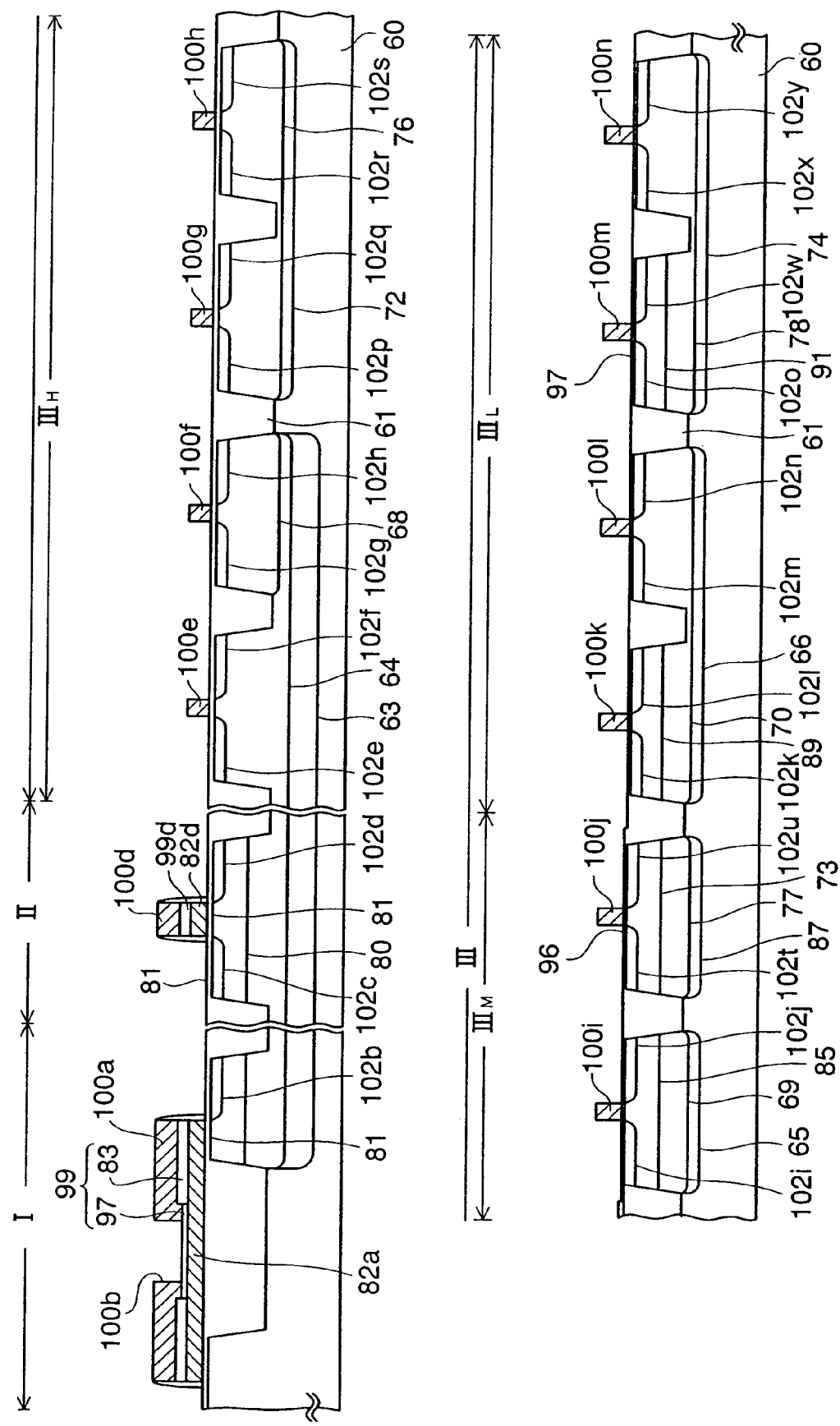

Subsequently, as shown in FIG. 14V, the n-type impurity such as As is ion-implanted into the silicon substrate 60 by using the first to tenth gate electrodes (100e to 100n) and a resist pattern (not shown) as a mask, and thus fifth to fourteenth n-type source/drain extensions (102e to 102n) as described in the drawing are formed. Similarly, by performing ion implantation of the p-type impurity such as B into the silicon substrate 60, first to tenth p-type source/drain extensions (102p to 102y) as shown in the drawing are formed. Note that the implantation of the above-described n-type impurity and p-type impurity are severally performed using resist patterns (not shown) and the resist patterns are removed after the ion implantation is completed.

Next, description will be made for the process until the sectional structure shown in FIG. 14W will be obtained.

Firstly, after forming a silicon oxide film on the entire surface, the silicon oxide film is etched back to form second insulative sidewalls 104 on the side surfaces of the second conductor 100a, the control gate 100d, and the first to tenth gate electrodes (100e to 100n). Then, by performing overetching after the etchback, the fifth insulating film 97 constituting the insulator 99 on the pad portion 25b is etched while the second insulative sidewalls 104 are used as a mask. Thus, a second opening 99a having a smaller diameter than the first opening 100b is formed on the insulator 99, and the contact region CR is exposed and the silicon substrate 60 of the second peripheral circuit region II is exposed from the second opening 99a.

Further, the first insulating film 81 is patterned by the etchback while the second insulative sidewalls 104 work as a mask, and the first insulating film 81 is left as the gate insulating film 81a and the tunnel insulating film 81b under the first conductor 82a and the floating gate 82d, respectively.

Furthermore, the third to fifth insulating films (94, 96, 97) are patterned in the second peripheral circuit region III while the first to tenth gate electrodes (100e to 100n) work as a mask, and the insulating films are left as gate insulating films (94a to 94d, 96a, 96b, 97a to 97d).

Subsequently, by ion implantation using the second insulative sidewalls 104, control gate 100d, and the first to tenth gate electrodes (100e to 100n) as a mask, first to fourteenth n-type source/drain regions (105a to 105n) and first to fourteenth p-type source/drain regions (105p to 105y) as shown in the drawing are formed. The implantation of the above-described n-type impurity and p-type impurity are severally performed using resist patterns (not shown) and the resist patterns are removed after the ion implantation is completed.

With the above processes, the n-type MOS transistors (TR$_n$ (Low Vth), TR$_n$(High Vth) and the p-type MOS transistors (TR$_p$(Low Vth), TR$_p$(High Vth), which constitute the logic circuit such as a sense amplifier, are formed in the high voltage transistor forming region III$_H$ and the low voltage transistor forming region III$_L$. Low Vth and High Vth attached to each transistor denotes high/low of the threshold voltage of the transistor.

When transistors having high threshold voltage and low threshold voltage are mixed, it is possible to operate the circuit in high-speed by using transistors having low threshold voltage. At a stand-by state, the transistors having low threshold voltage are turned off and transistors having high threshold voltage are used instead and they can suppress leakage current that occurs during stand-by.

Further, of the above-described transistors, transistors formed in the high voltage transistor forming region III$_H$ become high voltage transistors having the voltage of 5V applied to the gate electrodes and transistors formed in the low voltage transistor forming region III$_L$ become low voltage transistors having 1.2V.

Then, the n-type MOS transistor TR$_n$ and the p-type MOS transistor TR$_p$, whose applied voltage is 2.5V, are formed in the middle voltage transistor forming region III$_M$ as shown in the drawing.

On the other hand, a flash memory cell FL, which is made up of the control gate 100d, the intermediate insulating film 99d, the floating gate 82d, the tunnel insulating film 81b, and third and fourth n-type source/drain regions (105c, 105d), is formed in the cell region II.

Figure 14W:
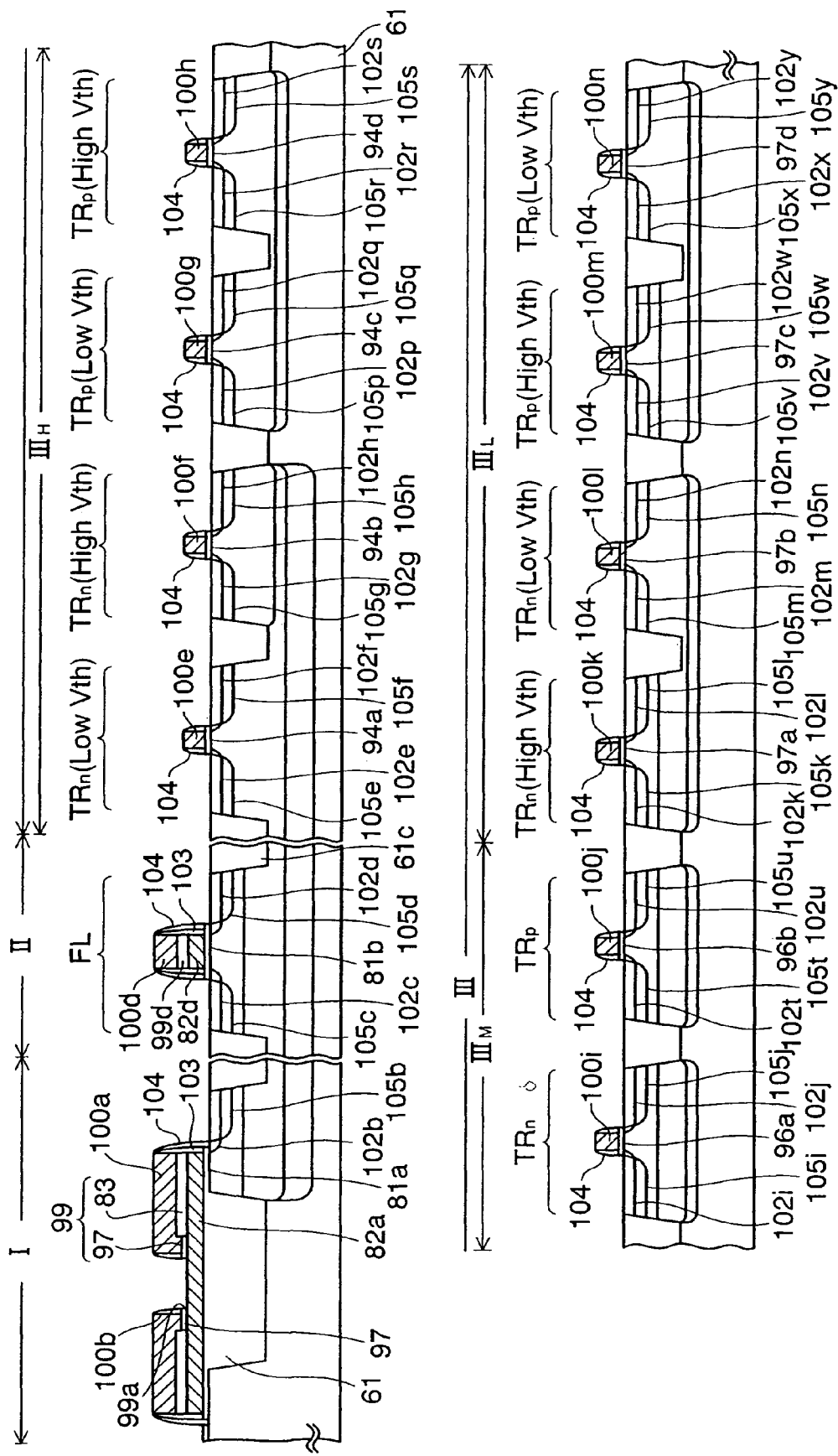

FIG. 15B is the plan view after completing the process, and the previous FIG. 14W corresponds to the sectional view taken along H-H line of FIG. 15B. It is to be noted that the second peripheral circuit region III is omitted to make the layout be easily read in FIG. 15B.

As shown in FIG. 15B, a first n-type source/drain region 105a is formed in the silicon substrate 60 beside the gate portion 82c of the first conductor 82a. Then, the first and second n-type source/drain regions (105a, 105b), the gate insulating film 81a (refer to FIG. 14W), and the gate portion 82c constitute the reference transistor TR$_{ref}$.

Figure 14X:
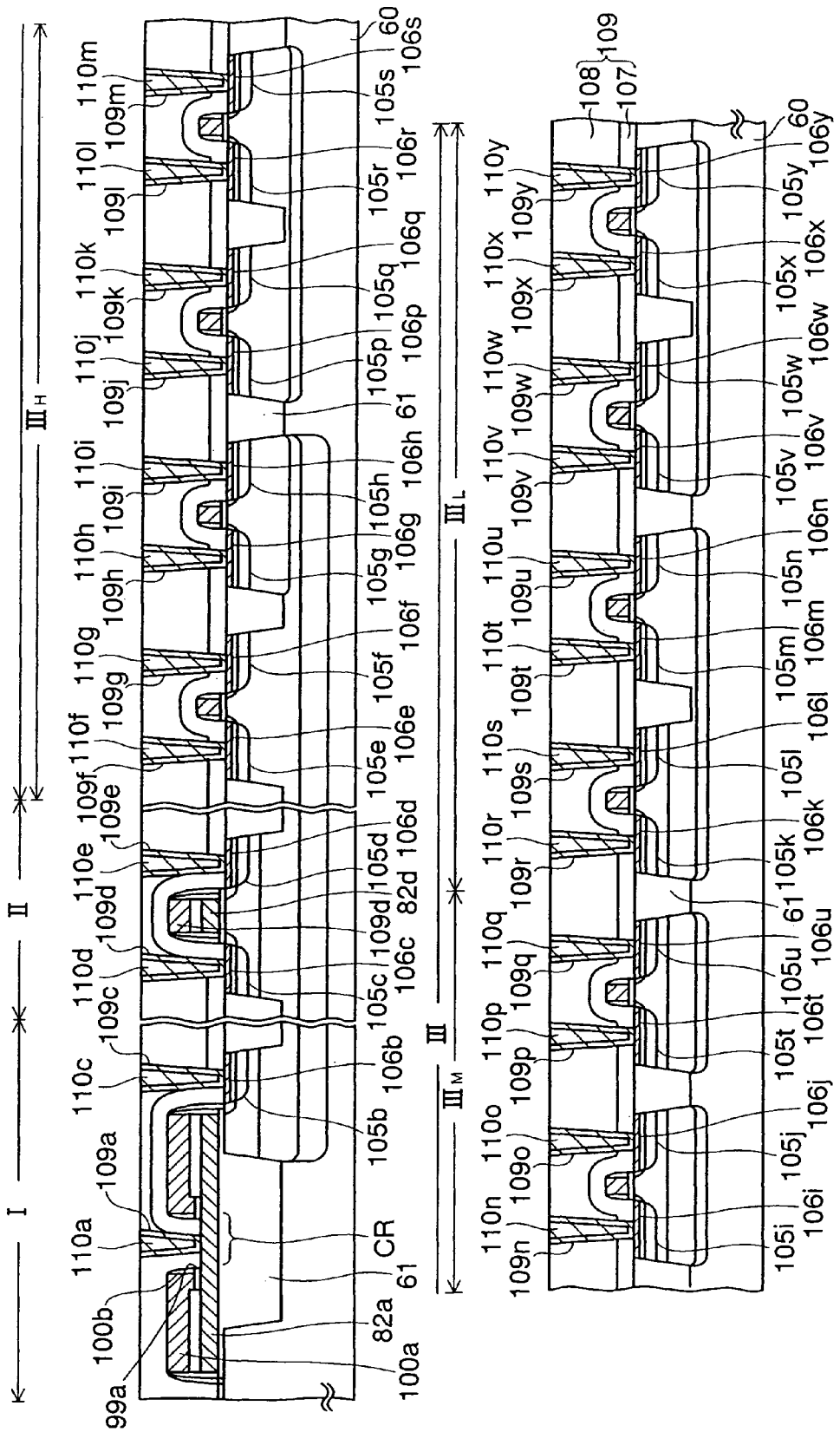

Next, description will be made for the process until the sectional structure shown in FIG. 14X will be obtained.

Firstly, after a cobalt film is formed on the entire surface at the thickness of about 8 nm by the sputtering method, the cobalt film is annealed to allow it to react with silicon. Then, the cobalt film on a device isolation insulating film 61 or the like, which has not been reacted, is removed by wet etching to form cobalt-silicide layers (106b to 106y) on the surface layer of the silicon substrate 60 and gate electrodes.

Subsequently, a silicon nitride film is formed in the thickness of about 50 nm by the CVD method, and is used as an etching stopper film 107. Next, a silicon oxide film as a sixth insulating film 108 is formed on the etching stopper film 107 by the CVD method, and the etching stopper film 107 and the sixth insulating film 108 are made to be a first interlayer insulating film 109. Note that the thickness of the sixth insulating film 108 is about 1 μm on the flat surface of the silicon substrate 60.

Subsequently, the top surface of the first interlayer insulating film 109 is polished to make it flat by the CMP method. Then, the first interlayer insulating film 109 is patterned by photolithography to form first, third to twenty-fifth holes (109a, 109c to 109y). Of these holes, the first hole 109a is positioned on the contact region CR of the first conductor 82*a* and formed inside the first and second openings (100*b*, 99*a*). Further, the remaining third to twenty-fifth holes (109*c* to 109*y*) are respectively formed on the cobalt-silicide layers (106*b* to 106*y*).

Furthermore, a Ti film and a TiN film are formed in this order the first, third to twenty-fifth holes (109*a*, 109*c* to 109*y*) and on the first interlayer insulating film 109 by the sputtering method, and they are used as a glue-film. Then, a W film is formed on the glue-film by the CVD method using tungsten hexafluoride as reactive gas to completely fill the inside of the first, third to twenty-fifth holes (109*a*, 109*c* to 109*y*). Then, excessive W film and glue-film formed on the top surface of the first interlayer insulating film 109 are removed by the CMP method, and they are left as first, third to twenty-fifth conductive plugs (110*a*, 110*c* to 110*y*) inside the first, third to twenty-fifth holes (109*a*, 109*c* to 109*y*).

Next, description will be made for the process until the sectional structure shown in FIG. 14Y will be obtained.

Firstly, after a low dielectric constant insulating film 111 of a coating type is formed on the entire surface, a silicon oxide film is formed on it as a cover insulating film 112, and the low dielectric constant insulating film 111 and the cover insulating film 112 are made to be a second interlayer insulating film 113.

Subsequently, the second interlayer insulating film 113 is patterned by photolithography to form wiring grooves 113*a*.

Then, a Cu film is formed as a seed layer on the entire surface by the sputtering method after deposition of TaN, an electrolytic copper plated film is formed on the seed layer by supplying electric power to the seed layer, and each wiring groove 113*a* is completely filled by the copper plated film. After that, excessive seed layer and copper plated film formed on the second interlayer insulating film 113 are removed by the CMP method, and they are left in each wiring groove 113*a* as copper wirings 114.

FIG. 15C is the plan view after the process has been finished, and the previous FIG. 14Y corresponds to the sectional view taken along J-J line of FIG. 15C. It is to be noted that the second peripheral circuit region III is omitted and copper wirings 114 and the second interlayer insulating film 113 in FIG. 15C are omitted to make the planar layout of each layer be easily read.

As shown in the drawing, the second n-type source/drain region is formed in the silicon substrate 60 beside the gate portion 82*c* of the first conductor 82*a*, and a second conductive plug is electrically connected thereon. The second conductive plug is formed inside the second hole formed in the second interlayer insulating film, and is formed in the same process as the remaining first, third to twenty-fifth conductive plugs (110*a*, 110*c* to 110*y*).

With the foregoing processes, the basic structure of the semiconductor device according to this embodiment is completed.

According to the manufacturing method of the semiconductor device, as shown in FIGS. 14J to 14M, the wells (85, 87, 89, 91) for adjusting threshold voltage are formed in the middle voltage transistor forming region III$_M$ and the low voltage transistor forming region III$_L$ while the second insulating film 83 is used as a through-film. Then, as shown in FIG. 14N, the second insulating films 83, whose function as a through-film has ended after the completion of ion implantation, is removed on the second peripheral circuit region III, and the second insulating film 83 on the contact region CR of the first conductor 82*a* is also removed simultaneously. As described, since the removing process of the through-film combines the removing process of the second insulating film 83 on the contact region CR, it becomes possible to remove the second insulating film 83 on the contact region CR without adding an additional mask process.

According to the present invention, the step of removing the second insulating film, which is not needed after it has been used as the through-film for impurity implantation, in the third region combines the step of removing the second insulating film on the contact region, so that the second insulating film above the contact region can be selectively removed without adding an additional mask step.

Further, etching amount in the third region is larger than that in the second region in the step of removing the second insulating film. Therefore, by setting the etching amount on this step to that in the third region, it is possible to prevent excessive etching of the first and second insulating films in the third region while the second insulating film in the second region is completely removed and to prevent an etching from occurring on the device isolation insulating film or the like under the films.

What is claimed is:

1. A semiconductor device comprising:
   a laminated structure body, which integrally has on a first region of a semiconductor substrate: a first portion where a first insulating film, a first conductor, a second insulating film, and a second conductor sequentially remain; a second portion where said first conductor and said second conductor are laminated on said semiconductor substrate; and a third portion where neither said second insulating film nor said second conductor remains on said semiconductor substrate; and
   a third insulating film, which covers said laminated structure body and includes one or more holes where one or more contact regions of said first conductor of said laminated structure body are exposed at one or more parts of said third portion, wherein said second conductor has a first opening corresponding to said third portion, and
   said second insulating film has a second opening that is larger than said first opening.

2. The semiconductor device according to claim 1, wherein said first insulating film is a silicon oxide film.

3. The semiconductor device according to claim 1, wherein said second insulating film is an ONO film.

4. The semiconductor device according to claim 1, comprising:
   a flash memory cell made up of a tunnel insulating film, a floating gate constructed from the same material as said first conductor, an intermediate insulating film constructed from the same material as said second insulating film, and a control gate constructed from the same material as said second conductor, which sequentially remain on a second region of said semiconductor substrate, and first and second source/drain regions remaining in said semiconductor substrate beside said floating gate.

5. The semiconductor device according to claim 1, wherein said first conductor is made up of a pad portion remaining in said contact region and a gate
   portion connected to the pad portion,
   third and fourth source/drain regions remain in said semiconductor substrate beside said gate portion, and
   said first insulating film, said gate portion, and said third and fourth source/drain regions
   constitute a transistor.

6. The semiconductor device according to claim 5, wherein said first opening remains in said second conductor on said contact region of said pad portion, a silicon oxide film including said second opening on said pad portion inside said first opening remains, and said hole remains inside said first and second openings.

7. The semiconductor device according to claim 1, wherein said second conductor is in an electrically floating state.

8. The semiconductor device according to claim 1, wherein further
a fourth insulating film remains between said first conductor and said second conductor in the second portion.

9. A semiconductor device comprising:
a laminated structure body, which integrally has on a first region of a semiconductor substrate: a first portion where a first insulating film, a first conductor, a second insulating film, and a second conductor sequentially remain; a second portion where said first conductor and said second insulating film are laminated on said semiconductor substrate; and a third portion where neither said second insulating film nor said second conductor remains on said semiconductor substrate; and
a third insulating film, which covers said laminated structure body and includes one or more holes where one or more contact regions of said first conductor of said laminated structure body are exposed at one or more parts of said third portion, wherein
said second insulating film has a first opening corresponding to said third portion, and
said second conductor has a second opening that is larger than said first opening.

10. The semiconductor device according to claim 9, wherein said first conductor, said second insulating film, and said second conductor constitute a capacitor.

11. The semiconductor device according to claim 9, wherein
two of said holes are formed at an interval, conductive plugs that are electrically connected with said contact regions remain in the each holes, and the two conductive plugs and said first conductor constitute a resistive element.

* * * * *

UNITED STATES PATENT AND TRADEMARK OFFICE
CERTIFICATE OF CORRECTION

PATENT NO. : 8,169,017 B2
APPLICATION NO. : 12/285275
DATED : May 1, 2012
INVENTOR(S) : Taiji Ema et al.

It is certified that error appears in the above-identified patent and that said Letters Patent is hereby corrected as shown below:

ON THE TITLE PAGE, ITEM 75;
Change

"(75) Inventors: Taija Ema, Kawasaki (JP); Toru Anezaki, Kawasaki (JP)"

To be

--(75) Inventors: Taiji Ema, Kawasaki (JP); Toru Anezaki, Kawasaki (JP)--

Signed and Sealed this
Second Day of October, 2012

David J. Kappos
*Director of the United States Patent and Trademark Office*